(12) United States Patent
Toda

(10) Patent No.: US 8,537,595 B2
(45) Date of Patent: *Sep. 17, 2013

(54) RESISTANCE CHANGE MEMORY DEVICE

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 113 days.

This patent is subject to a terminal disclaimer.

(21) Appl. No.: 13/231,687

(22) Filed: Sep. 13, 2011

(65) Prior Publication Data

US 2012/0002458 A1    Jan. 5, 2012

Related U.S. Application Data

(63) Continuation of application No. 12/549,948, filed on Aug. 28, 2009, now Pat. No. 8,023,313.

(30) Foreign Application Priority Data

Aug. 29, 2008 (JP) ................. 2008-221620

(51) Int. Cl.
*G11C 13/02* (2006.01)
(52) U.S. Cl.
USPC ............. 365/148; 365/163; 365/189.05
(58) Field of Classification Search
USPC ........................................... 365/130
See application file for complete search history.

(56) References Cited

U.S. PATENT DOCUMENTS

| | | | |
|---|---|---|---|
| 5,349,561 A | 9/1994 | Iwase | |
| 6,256,247 B1 * | 7/2001 | Perner | 365/189.15 |
| 6,903,965 B2 * | 6/2005 | Ishikawa | 365/158 |
| 7,075,817 B2 | 7/2006 | Rinerson et al. | |
| 7,215,568 B2 | 5/2007 | Liaw et al. | |
| 7,283,387 B2 | 10/2007 | Cho et al. | |
| 7,339,811 B2 | 3/2008 | Nejad et al. | |
| 7,400,522 B2 | 7/2008 | Toda et al. | |
| 7,495,984 B2 * | 2/2009 | Kim et al. | 365/210.1 |

(Continued)

FOREIGN PATENT DOCUMENTS

| | | |
|---|---|---|
| JP | 4-61094 | 2/1992 |
| JP | 2005-522045 | 7/2005 |

(Continued)

OTHER PUBLICATIONS

Office Action issued Jun. 29, 2012 in Japanese Application No. 2008-221620 (With English Translation).

(Continued)

*Primary Examiner* — Tan T. Nguyen
(74) *Attorney, Agent, or Firm* — Oblon, Spivak, McClelland, Maier & Neustadt, L.L.P.

(57) ABSTRACT

A resistance change memory device includes: a cell array having multiple layers of mats laminated thereon, each of the mats having word lines and bit lines intersecting each other as well as resistance change type memory cells arranged at intersections thereof, each of the mats further having therein a reference cell and a reference bit line connected to the reference cell, the reference cell set to a state of a certain resistance value; a selection circuit configured to select a word line in each mat of the cell array, and select a bit line intersecting a selected word line and the reference bit line at the same time; and a sense amplifier configured to sense data by comparing respective cell currents of a selected memory cell on the selected bit line and the reference cell on the reference bit line.

18 Claims, 51 Drawing Sheets

(56) References Cited

U.S. PATENT DOCUMENTS

| | | | |
|---|---|---|---|
| 7,570,524 B2 | 8/2009 | Bedeschi et al. | |
| 7,606,059 B2 | 10/2009 | Toda | |
| 7,630,263 B2 * | 12/2009 | Pio | 365/210.1 |
| 7,633,789 B2 | 12/2009 | Norman | |
| 7,843,716 B2 | 11/2010 | Kang et al. | |
| 8,031,508 B2 * | 10/2011 | Toda et al. | 365/148 |
| 2008/0002456 A1 | 1/2008 | Toda et al. | |
| 2009/0198881 A1 | 8/2009 | Toda | |

FOREIGN PATENT DOCUMENTS

| | | |
|---|---|---|
| JP | 2005-285161 | 10/2005 |
| JP | 2006-514393 | 4/2006 |
| JP | 2006-514440 | 4/2006 |
| JP | 2007-73176 | 3/2007 |
| JP | 2008-65953 | 3/2008 |
| JP | 2008-181978 | 8/2008 |
| JP | 2009-9657 | 1/2009 |
| WO | WO 03/085675 | 10/2003 |
| WO | WO 2004/084229 | 9/2004 |
| WO | WO 2004/090984 | 10/2004 |
| WO | WO 2007/077625 | 7/2007 |

OTHER PUBLICATIONS

Office Action issued Nov. 9, 2010 in Japanese Patent Application No. 2008-221620 filed Aug. 29, 2008 (w/English translation).

Office Action issued Apr. 12, 2011 in Japanese Patent Application No. 2008-221620 filed Aug. 29, 2008 (w/English translation).

* cited by examiner

Upper or Lower Four Blocks
Selected at Same Time

WL Selection Method lump

WL Selection Method sparse
Select One of Four Word Lines

Mat Selection Method

One Layer

Mat Selection Method lump

Mat Selection Method sparse
Select One of
Four Layers

WL scan first

WL serial
BL serial

WL scan first

WL serial
BL patterned

WL scan first

WL patterned
BL serial

WL scan first

WL patterned
BL patterned

BL scan first

BL serial
WL serial

BL scan first

BL serial
WL patterned

BL scan first

BL patterned
WL serial

BL scan first

BL patterned
WL patterned mat scan serial mat scan patterned

In-Mat Scan

Mat Scan
serial

FIG. 22

| mode \ gate | Vm | Vg | read |
|---|---|---|---|
| Read | Vdd | Vg_read | Vdd |
| Reset("0"write) | Vss | Vg_reset | Vss |
| Set("1"write) | Vm_set | >Vdd+Vt | Vss |

Vss<Vm_set~Vg_read<Vg_reset<Vdd
Vdd Having Adequate Potential for Generating Vset of Cell

| mode \ gate | Vm | Vg |
|---|---|---|
| Reset("0"write) | Vss | Vg_reset |
| Set("1"write) | Vm_set | Vpp>Vdd+Vt |

| WGc | m(mod 2i) |
|---|---|
| i−k(k=1~i) | −2k+1, −2k, −2k−1, −2k−2 |

WGc=i−k → 2WGc ≡ −2k ≡ m−1, m, m+1, m+2(mod 2i)

FIG. 42

| A14 | A13 | A12 | A11 | A10 | m |
|-----|-----|-----|-----|-----|---|
| 0 | 0 | 0 | 0 | 0 | 0 |
| 0 | 0 | 0 | 0 | 1 | 1 |
| 0 | 0 | 0 | 1 | 0 | 2 |
| 0 | 0 | 0 | 1 | 1 | 3 |
| ...... | | | | | ... |
| 1 | 1 | 1 | 1 | 1 | 31 |

FIG. 43

| WGc(ternary) | m | mod 6 |
|---|---|---|
| 2 | 2,3,4,5,8,9,10,11,14,15,··· | 2,3,4,5 |
| 1 | 0,1,2,3,6,7,8,9,12,13,14,15,··· | 0,1,2,3 |
| 0 | 0,1,4,5,6,7,10,11,12,13,··· | 0,1,4,5,0 |

5bit adder 441a~441c

5bit residue(6) 442a~442d half adder

| mode \ gate | Vm | Vg |
|---|---|---|
| Reset("0"write) | Vdd | Vg_reset |
| Set("1"write) | Vt+ε | Vpp>Vdd+Vt |

No Mix of Reading and Writing in Burst Sequence (1)

Mix of Reading and Writing in Burst Sequence (2)

RESISTANCE CHANGE MEMORY DEVICE

CROSS REFERENCE TO RELATED APPLICATIONS

This application is a continuation of and claims the benefit of priority under 35 U.S.C. §120 from U.S. Ser. No. 12/549,948 filed Aug. 28, 2009 now U.S. Pat. No. 8,023,313, and claims the benefit of priority under 35 U.S.C. §119 from Japanese Patent Application No. 2008-221620 filed Aug. 29, 2008, the entire contents of each of which are incorporated herein by reference.

BACKGROUND OF THE INVENTION

1. Field of the Invention

The present invention relates to a resistance change memory device, and in particular, to a memory device having cell array blocks, each including memory cells arranged in a three-dimensional manner.

2. Description of the Related Art

Resistive memory (Resistance RAM; ReRAM), which changes the resistance state of material with voltage, current, heat, etc., and utilizes the resistance state as data, has gained increasing attention as a likely candidate for replacing NAND-type flash memory (see, for example, Y. Hosoi et al, "High Speed Unipolar Switching Resistance RAM (RRAM) Technology" IEEE International Electron Devices Meeting 2006 Technical Digest p. 793-796). The resistance change memory seems to offer a high availability as a large capacity file memory from the viewpoint of its suitability for refinement and lamination, while enabling configuration of cross-point cells.

However, variable resistance elements (resistance change material) that are used as the storage layers of memory cells may have such characteristics that they would not exhibit stable resistance change unless a high voltage is applied thereto. In addition, given that the large capacity file memory is achieved through configuration of cell arrays in a three-dimensional manner, there will be a non-negligible enhancement in leakage current when diodes used as access elements of memory cells are reverse-biased, in addition to a significant increase in the number of waiting cells. Therefore, there is a need for improvements in the accessing scheme taking account the effects of leakage current, and also in the data transfer scheme in order to achieve a faster and larger capacity file memory than the NAND-type flash memory.

SUMMARY OF THE INVENTION

One aspect of the present invention provides a resistance change memory device comprising: a cell array having multiple layers of mats laminated thereon, each of the mats having word lines and bit lines intersecting each other as well as resistance change type memory cells arranged at intersections thereof, each of the mats further having therein a reference cell and a reference bit line connected to the reference cell, the reference cell set to a state of a certain resistance value; a selection circuit configured to select a word line in each mat of the cell array, and select a bit line intersecting a selected word line and the reference bit line at the same time; and a sense amplifier configured to sense data by comparing respective cell currents of a selected memory cell on the bit line that is selected and the reference cell on the reference bit line.

Another aspect of the present invention provides
a cell array having multiple layers of mats laminated thereon, each of the mats having word lines and bit lines intersecting each other as well as resistance change type memory cells arranged at intersections thereof; and
three systems of buffer registers provided at a data transfer path between the cell array and outside thereof,
lump data-transfer being performed between the cell array and each of the buffer registers, and burst data-transfer with clock synchronization being performed between each of the buffer registers and the outside.

BRIEF DESCRIPTION OF THE DRAWINGS

FIG. 22 illustrates modes of operation and control signal levels;

FIG. 42 illustrates a relationship between the mat numbers and addresses;

FIG. 43 illustrates a relation between word-line-group selection signals and the mat numbers when the ternary grouping of word lines is adopted;

DETAILED DESCRIPTION OF THE EMBODIMENTS

A brief overview of embodiments of the present invention follows.

To provide a large capacity file memory, such a cell array is used where resistance change type memory cells are arranged in a three-dimensional manner. Preferably, the cell array involves a three-dimensional cell array block as a unit, and such three-dimensional cell array blocks are further arranged in a two-dimensional manner.

As an initial setting operation for stabilizing the state of resistance change type memory cells, a forming operation is performed to set the memory cells at a certain resistance state, e.g., a low resistance state (set state) by applying a certain voltage.

To perform data sensing with less effects of leakage current, when a word line and a bit line are selected in a mat of a cell array block, a reference bit line is selected at the same time that is driven by the same word line and connected to a reference cell on the same layer. The data sensing is performed through cell current comparison between the selected bit line and the reference bit line performed by a current-comparing-type sense amplifier.

To configure a memory system capable of fast data transfer, at least three systems of buffer registers are prepared to perform lump data-transfer between the cell arrays and the buffer registers, as well as burst data-transfer based on clock synchronization between the buffer registers and the outside. Fast data transfer is achieved by defining timings and sequences of lump and burst data transfer.

Definitions of the main technical terms used in the following embodiments are given below.

word line: a selection signal line that is connected to the cathode side of a diode in a cross-point cell;

bit line: a selection signal line at the sense amplifier side that is connected to the anode side of a diode in a cross-point cell;

mat: a cell array matrix in a unit layer included in a 3D cell array block;

cell array block: a collection of memory cells including a plurality of mats laminated therein and sharing a common control circuit;

a forming operation: a mode of operation for setting a cell at a low resistance state through application of voltage, as an initial setting operation of the cell; and a lump-setting operation: write for collectively setting a plurality of cells at set state.

Particular embodiments will now be described below with reference to the accompanying drawings.

Figure 1:
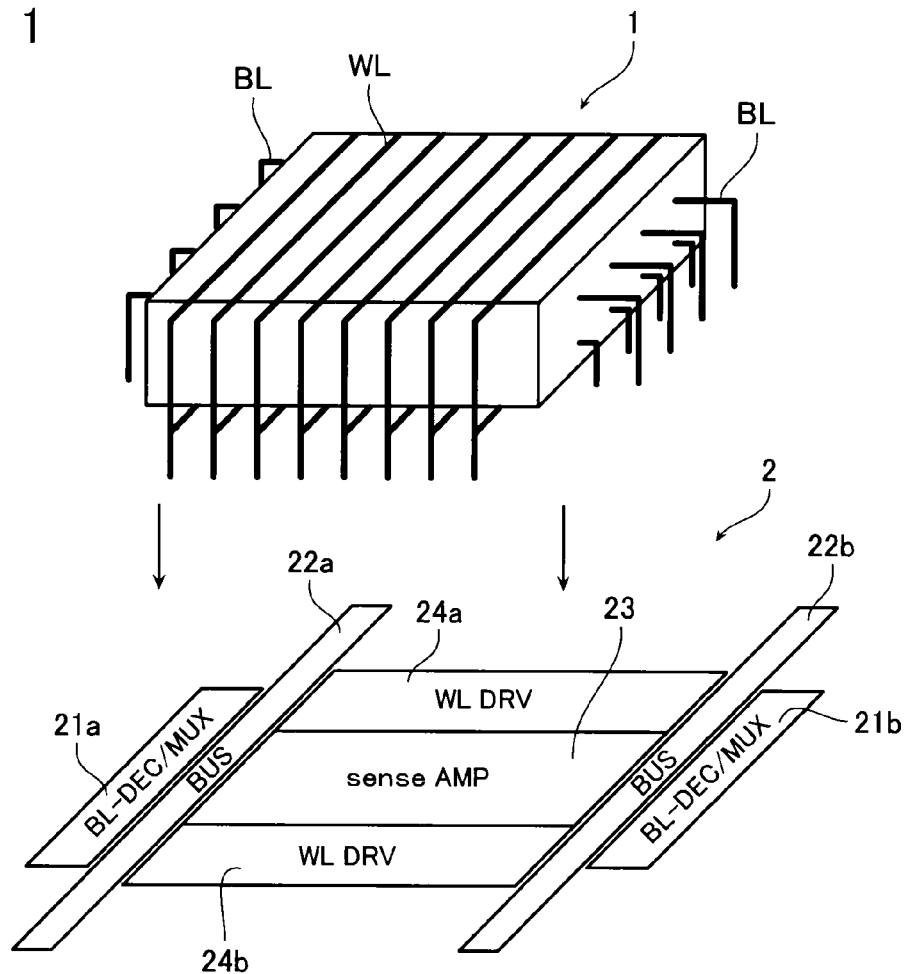
FIG. 1 illustrates a 3D cell array block and a base control circuit according to an embodiment.

FIG. 1 illustrates the configuration of a 3D cell array block 1 in which memory cells are arranged in a three-dimensional manner, and a control circuit 2 formed on the base semiconductor substrate. Word lines WL and bit lines BL as selection signal lines of the 3D cell array block 1 are connected to a base control circuit 2 at vertical wiring areas provided on the four sides of the cell array block.

Figure 2:
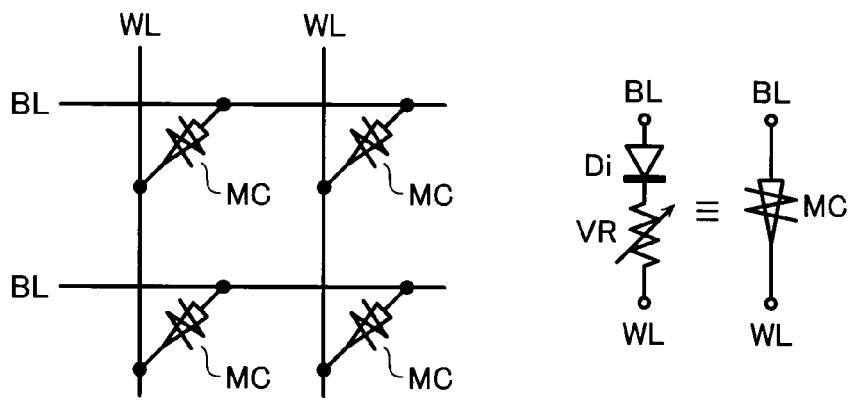
FIG. 2 is a cell array equivalent circuit diagram of the cell array block.

An equivalent circuit of a unit layer (i.e., a mat) in the cell array block 1 is as illustrated in FIG. 2. A mat includes memory cells MC arranged at respective cross-points of the word lines WL and the bit lines BL. Each memory cell MC includes a diode Di and a variable resistance element VR connected in series. In this case, an anode-side signal line of each diode Di is defined as a bit line BL and a cathode-side signal line as a word line WL.

The control circuit 2 has bit-line decoder/multiplexer circuits 21a, 21b corresponding to both ends of the bit lines. That is, the bit lines that are drawn to the substrate on both ends of the cell array block 1 are selected and subject to potential setting at the bit-line decoders/multiplexers 21a, 21b according to the address signals and commands from the outside. These bit lines are then input to a sense amplifier circuit 23 through buses 22a, 22b.

In reading, as described below, the sense amplifier circuit 23 of current-sensing type senses data by comparing a cell current with a reference current. In writing, the sense amplifier circuit 23 and the decoder/multiplexer circuits 21a, 21b supply an appropriate write voltage and current to the selected cell.

Word-line decoders/drivers 24a, 24b are located at both ends in the word line direction of the control circuit 2. That is, the word lines that are drawn to the substrate at both ends of the cell array block 1 enter the word-line decoders/drivers 24a, 24b, and the word line level is selectively set according to the external addresses and commands.

In this case, the bus areas 22a, 22b that communicate data to and from the outside are set in the gaps provided between the bit-line decoder/multiplexer circuits 21a, 21b and the cell array block 1. Accordingly, the bit lines pass above the bus areas 22a, 22b as they run from the bit-line decoder/multiplexer circuits 21a, 21b to the cell array block 1.

The bit line signals are sent through the bus areas 22a, 22b to the sense amplifier circuit 23 provided on the substrate immediately below the cell array, where they are sensed and amplified, or, in writing, converted to a write voltage or current according to the data. The sense amplifier circuit 23 communicates data to and from the outside of the cell array block through the bus areas 22a, 22b.

Figure 3:
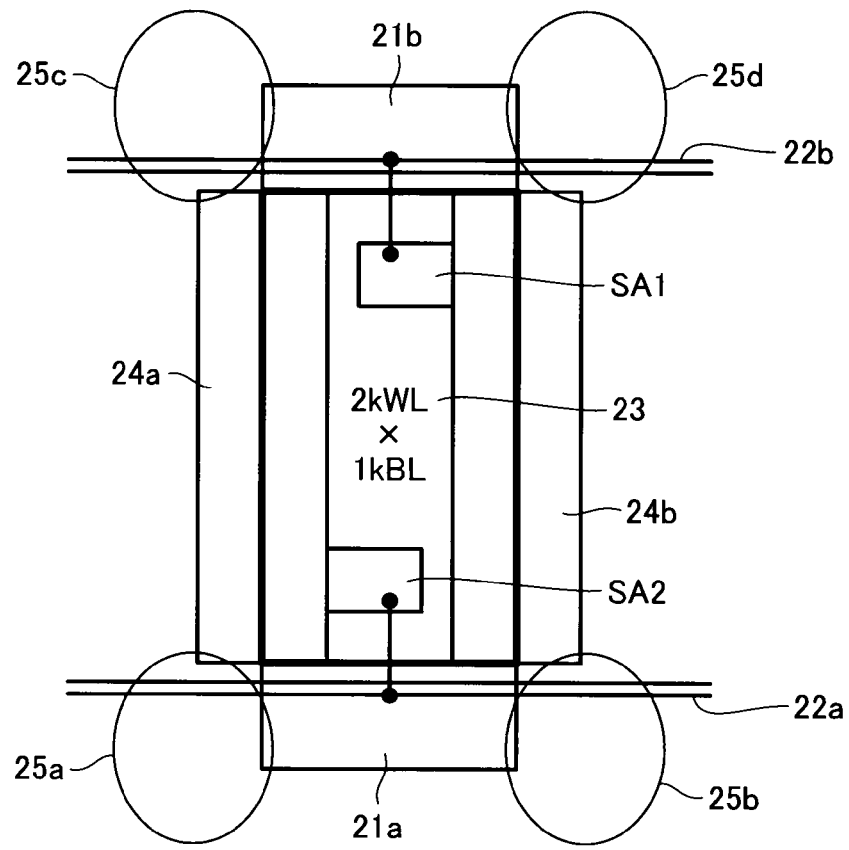
FIG. 3 illustrates a configuration of the control circuit.

FIG. 3 illustrates a relation between a sense amplifier and data buses of the control circuit 2. The size of a unit layer, i.e., a mat included in the cell array block 1 is a 2 Mb cell matrix including 2 k word lines WL and 1 k bit lines BL, which represents the minimum unit of a collection of cells. In addition, the sense amplifier circuit 23 has an area provided with two sense amplifiers SA1, SA2. The bit lines BL are drawn out of the mat from both ends thereof, and are connected to the sense amplifiers SA1 and Sa2, respectively, through bit-line decoder/multiplexer circuits 21a and 21b.

That is, upon selection of one word line WL by the word-line driver 24a or 24b, two bit lines BL are selected. One of the two bit lines BL is selected from one side of the mat, while the other one of the two bit lines BL is selected from the opposite side of the mat. This allows two memory cells to be accessed.

Address signal lines for selecting the word lines WL or the bit lines BL and data lines selectively connectable to the bit lines BL run in the buses 22a, 22b. Pre-decoders 25a to 25d for selectively driving word-line drivers are arranged at intersection areas of the bit-line decoder/multiplexer circuits 21a, 21b and the word-line drivers 24a, 24b.

Figure 4:
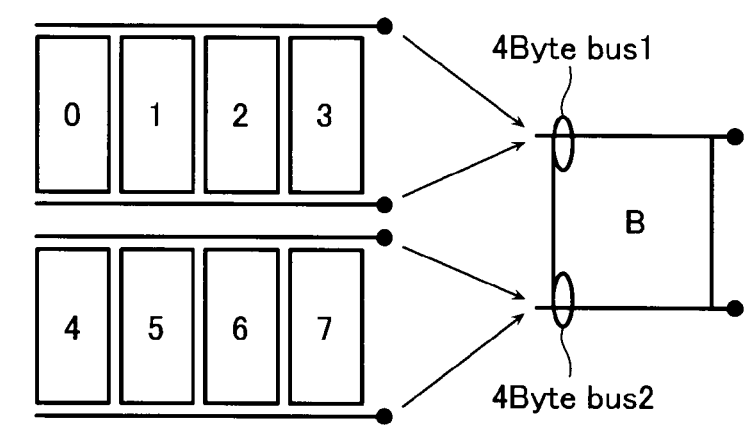
FIG. 4 is a representation of a block (B) in which two 4-Byte data buses are arranged, including eight cell array blocks.

The entire memory cell array further includes a plurality of cell array blocks 1 in a two-dimensional manner, one of which is illustrated in FIG. 1. For ease of illustration of the entire memory, eight cell array blocks will be collectively described below, and a relation between the cell array blocks and the data buses is illustrated in FIG. 4.

Each of the cell array blocks 0 to 7 has a capacity of 2 Mb. Among the eight cell array blocks 0 to 7, the upper four blocks 0 to 3, or the lower four blocks 4 to 7 are selected at the same time for the same bus area. Each of the blocks selected at the same time outputs data of 1 Byte. Each of the buses running through the bit-line decoder/multiplexer circuits in the cell array block has a capacity of 2 Bytes. As shown in the right side of FIG. 4, when the eight cell array blocks are collectively illustrated as a 16 Mb block B, these buses are entirely illustrated as 4-Byte buses bus1 and bus2 formed above and below the block B.

Figure 5:
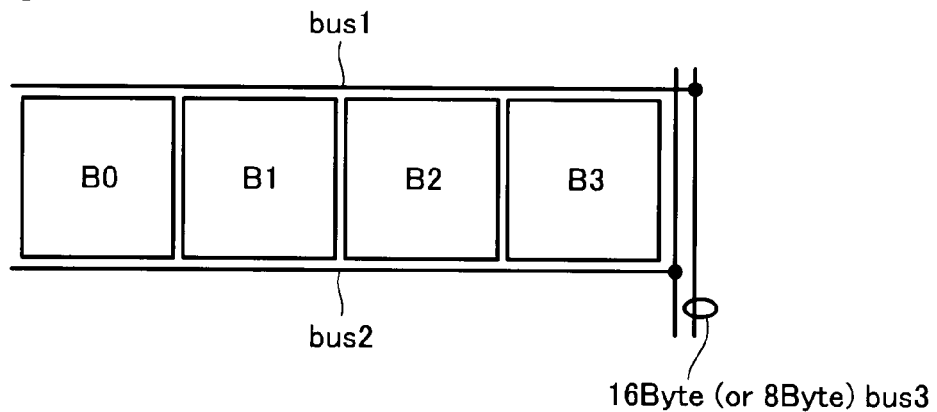
FIG. 5 is a representation of the block arrangement in which a 16-Byte (or 8-Byte) data bus is arranged for every four blocks.

Furthermore, as illustrated in FIG. 5, four sets of such the 16-Mb blocks B (B0-B3) are aligned along the 4-Byte buses bus1 and bus2. Specifically, 32 cell array blocks form a unit, and are connected to the 4-Byte buses bus1 and bus 2. The buses bus1 and bus2 are connected to a 16-Byte bus 3 (or an 8-Byte bus) that runs along a longitudinal direction.

Figure 6:
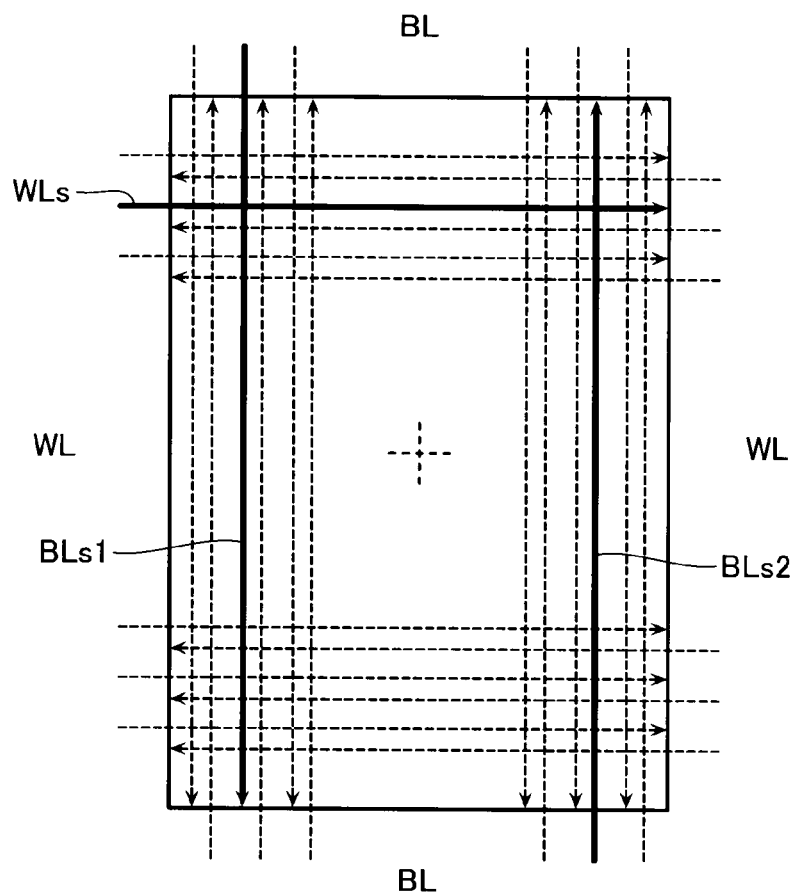
FIG. 6 illustrates an arrangement of word lines and bit lines in a mat.

FIG. 6 illustrates a relation between the word lines WL and the bit lines BL in one mat. The word lines WL are alternately wired from the right and left sides of the figure, and the bit lines BL are alternately wired from the upper and lower sides thereof. The memory cells are arranged at intersections of the word lines WL and the bit lines BL as cross-point cells. Since the cell selection is performed on bit lines BL connectable to different sense amplifiers, the bit lines BLs1 and BLs2 indicated by two thick lines in the figure are selected at the same time as being connected to different sense amplifiers, respectively, with respect to the selected word line WLs indicated by one thick line.

In a consecutive access mode, the sense amplifier repeats a procedure for data sensing each time a cell is selected. Accordingly, it is preferable that a certain word line WL is kept in a selected state while the bit lines are selected and accessed in turn, rather than changing word lines WL frequently, in view of achieving an operation with low power consumption. This may reduce the signal variations and the power consumption caused by the operation of the circuit associated with change in the level of the word line WL. It is also preferable to perform a bit-line scan such that the load state (CR time constants) of the word-line driver will not greatly change because a selection of the bit line is switched while the word line being kept in a selected state. For example, two bit lines are selected so that they are symmetric with respect to the center of the mat (the center of the mat with respect to the word line direction).

Figure 7:
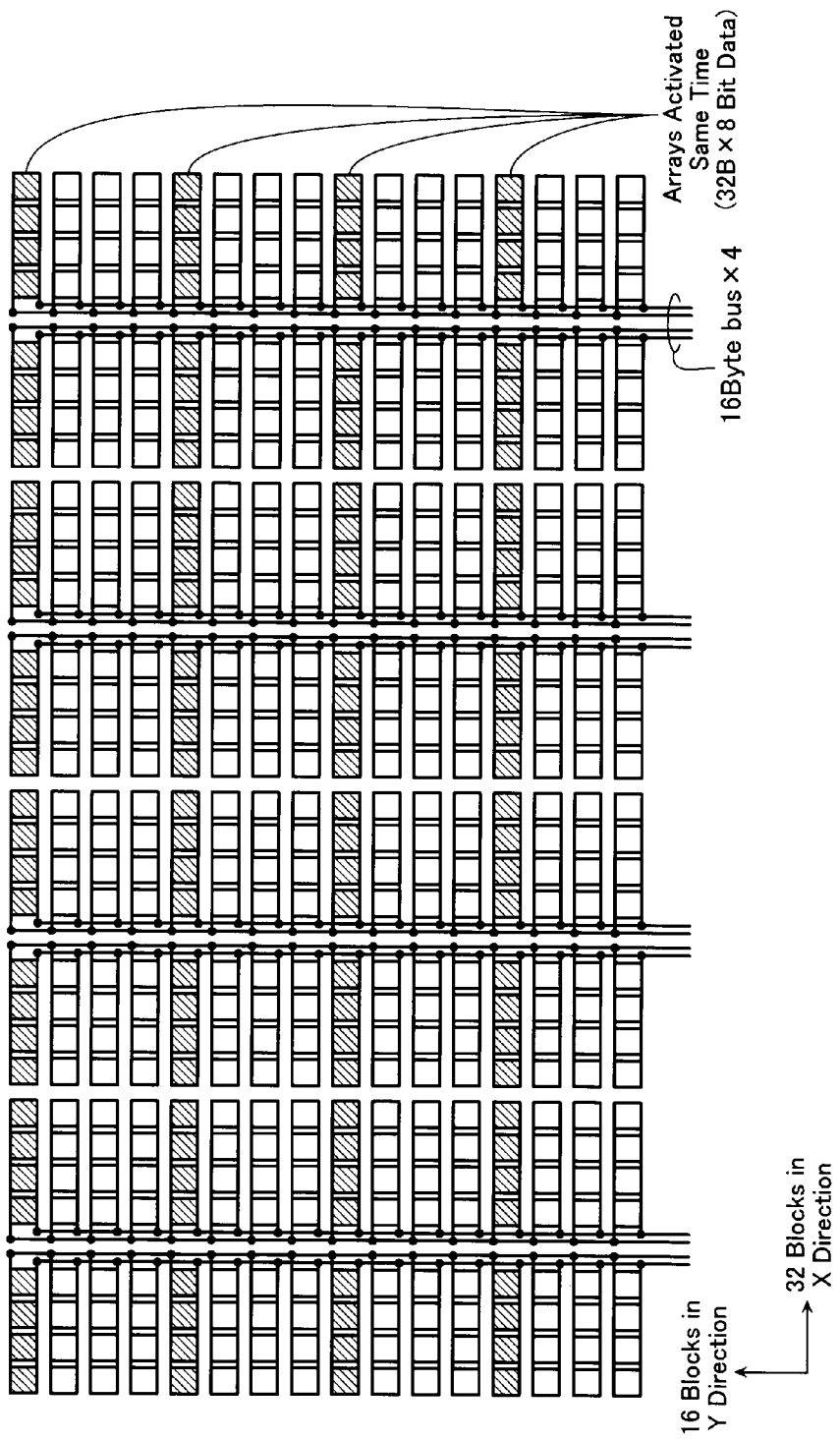
FIG. 7 illustrates a first exemplary configuration of a 8 Gb×m memory.

FIG. 7 illustrates a relationship between cell array blocks and data buses associated with an exemplary configuration of an actual memory chip. FIG. 7 illustrates as an example 8 Gb×m memory chip in such a way that eight cell array blocks (2 Mb) are collectively illustrated as one square block (16 Mb), as mentioned earlier in FIGS. 4 and 5.

Specifically, a matrix is formed in which 32 sets of 16 Mb blocks are arranged in the x direction and sixteen 16 Mb blocks in the y direction. That is, there exist 8 Gb cells for each layer, and, given that the number of mats (the number of laminated layers) is m, this results in 8 Gb×m capacity memory.

In this case, one mat is selected from among the entire memory mats. In the selected mat, one fourth of the blocks are selectively activated. The shaded portions in the figure represent the array portions that are activated at the same time in a certain access. That is, FIG. 7 shows an example in which activated portions are distributed in the chip as uniformly as possible.

The bus areas extending in the y direction and provided for every four blocks in the x direction include four bases. Each of the four buses has a capacity of 16 Bytes. The total 32 Bytes×8 bit data is transferred simultaneously from activated portions in the mat that are activated at the same time.

The data I/O interface connected to the outside has a configuration of 8 bits. Each I/O bit transfers data to the outside via three buffer registers as transfer means, each of which has a capacity of 32 Bytes, although not illustrated in the figure. This may achieve data transfer efficiency of 133 Mbps for each I/O at clock cycle of 7.5 ns, and 133 MB/s data transfer as a chip. This data transfer method will be described in detail below.

Figure 8:
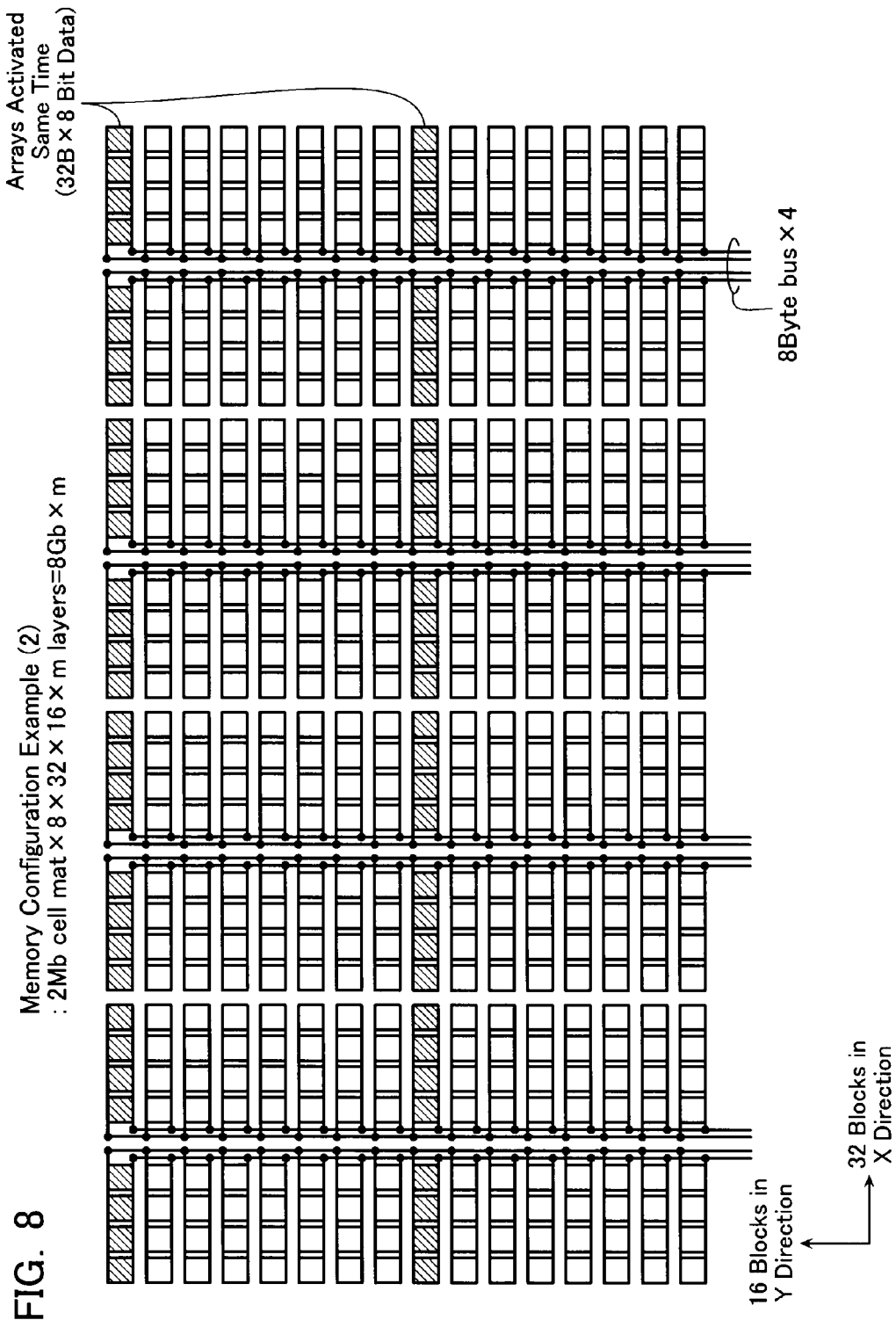
FIG. 8 illustrates a second configuration example of a 8 Gb×m memory.

FIG. 8 is a second example of a memory chip with a capacity of 8 Gb×m, where the number of laminated mats is m. In this case, one layer of mat is selected from the entire memory. In the selected mat, half of the blocks are selectively activated. That is, the shaded portions in the figure represent the array portions that are activated at the same time in a certain access. Activated portions are distributed in the chip as uniformly as possible.

The bus areas extending in the y direction provided for every four blocks in the x direction include four bases. Each of the four buses has a capacity of 8 Bytes. The total 16 Bytes×8 bit data is transferred simultaneously from activated portions in the mat that are activated at the same time.

The data I/O interface connected to the outside has a configuration of 8 bits. Each I/O bit transfers data to the outside via three buffer registers as transfer means, each of which has a capacity of 16 Bytes, although not illustrated in the figure. This may achieve data transfer efficiency of 66 Mbps for each I/O at clock cycle of 15 ns, and 66 MB/s data transfer as a chip. This data transfer method will also be described in detail below.

Figure 9:
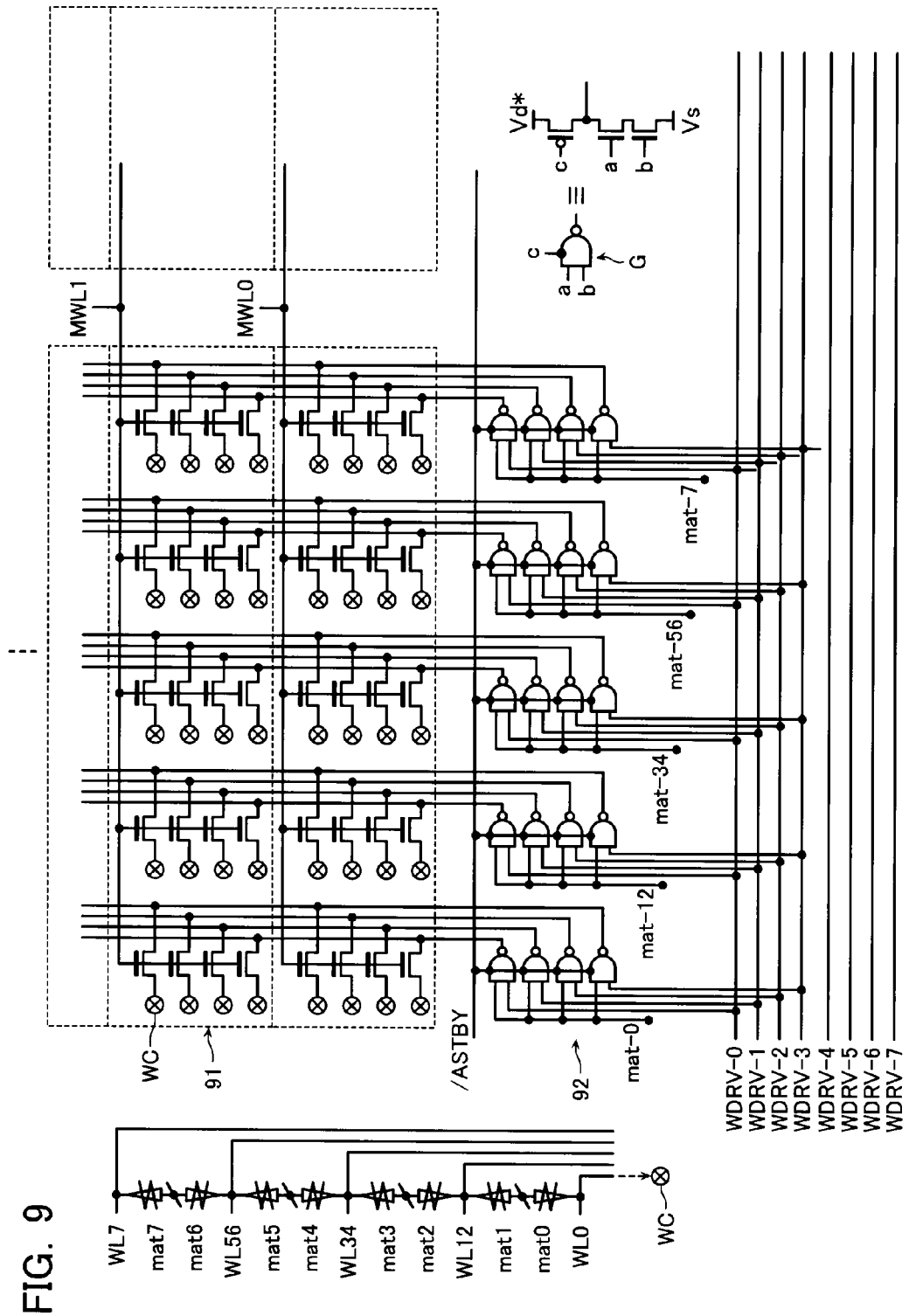
FIG. 9 illustrates an exemplary configuration of a word line decoding unit.

FIG. 9 illustrates an exemplary configuration of a partial row decoder unit positioned between respective cell array blocks to select a word line. Since the partial row decoder unit is a circuit between cell array blocks, it is important to configure it as simple as possible so that the minimum functionality required can be satisfied. In this case, they are configured in conformity with a configuration in which word lines are individually selected for each layer.

Main word line runs in the x direction. Signals from the main word lines MWLi are common signals used in all cell array blocks. These signals are selected by main word line decoders, not illustrated. FIG. 9 illustrates a partial row decoder that decodes these main word lines MWLi to provide specific signals to the selected cell arrays. That is, each portion surrounded by a dotted line represents a word-line driver 91, and a word-line drive signal WDRVj selected at a decode circuit 92 is supplied to a word line via the word-line driver 91.

FIG. 9 illustrates word line contacts WC where vertical wirings for respective WL layers of the 3D cell array block are drawn down and connected to the respective circuit portions of the substrate. The driver transistors of the word-line driver 91 are connected to the word line contacts WC.

In this case, it is assumed that there exists a memory cell array with eight layers of mats, mat0 to mat7. There are five types of signals, mat_0, mat_12, mat_34, mat_56, and mat_7 for each cell array block. The signals mat_0, mat_12, mat_34, mat_56, and mat_7 is used for selecting WL layers WL0, WL12, WL34, WL56, and WL7, respectively. Each decoder circuit 92 selectively drives word lines in a particular layer according to the logic of the mat selection signals and the word-line drive signals WDRV_0 to 7. While the decoder circuits 92 of the same type are provided on both sides of the cell array block, only those located at one side are illustrated in FIG. 9.

The decoder circuits 92 have NAND-type gates, which are illustrated in a symbol in FIG. 9. That is, their output terminals are caused to be connected to a power supply Vd* according to a signal c, and to a power supply Vs according to NAND of signals a and b. The word-line drivers 91 are selected by these gate outputs and selection signals from the main word lines MWLi that are common to a plurality of cell array blocks in the x direction. The word-line drivers 91 receives the gate outputs as their input, and control the floating states, connection to the power supply Vd*, and connection to the power supply Vs of the respective word lines for each word line.

Note that the power supply Vd* represents a value lower than the original power supply voltage Vdd, by approximately the forward bias Vf of the diode included in a cell. Let Vs* be a value higher than the power supply voltage Vss, by approximately Vf of the diode. These power supplies are to prevent voltage from being applied to the diode more than necessary.

The word-line drivers 91 surrounded by a dotted line are repeatedly provided as much as the number of main word line signals. Note that since the word lines WL are alternately drawn from both sides of one cell array block, the cell array blocks on the right and left sides of the decoder circuit in the figure are generally mirror reversed in view of the layout.

The word-line drive signals WDRV_0 to WDRV_3 are input to the decoder circuits 92 of FIG. 9, and the word-line drive signals WDRV_4 to WDRV_7 are input to the adjacent decode circuits (not illustrated). As a result, eight word lines WL are selected and driven at one cell array block for each main word line.

Figure 10:
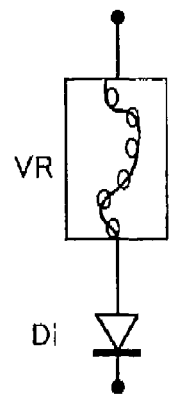
FIG. 10 is a diagram illustrating a current path formation due to cell forming.

Next, a forming operation that is an initial setting operation of a memory cell will be described below. As typically illustrated in FIG. 10, a variable resistance element VR in the memory cell will not exhibit any variable resistance state caused by a voltage and current applied thereto, if there is no current path for providing the variable resistance characteristics provided between the electrodes. Therefore, for memory initialization immediately after manufacture, or recovery of cell states after being used for a certain period of time, a forming operation is required to form a low resistance filament including microcrystals of resistive material or a series of amorphous material. Accordingly, a certain voltage is applied to a cell in a high resistance state to forcibly generate a low resistance filament in the cell. The voltage applied to the cell will be referred to as a forming voltage.

The forming operation is performed on all cells. In a large capacity memory, a lump forming operation should be collectively performed on a plurality of cells in order to reduce the total forming time. On the other hand, since those cells for which the forming operation is completed enter a low resistance state and allow a large current to flow therethrough. Therefore, in a lump-forming operation, the current should be individually controlled for each cell.

Methods for a lump-forming operation includes a method for collectively controlling the current paths of the word-line drivers for each bit line in a self-control manner. As described below, such control should be performed for each bit line that does not share any word line. As such, the description is first made of how to select which layer to perform a lump-forming operation at the same time in the lamination direction of the mats.

Figure 11:
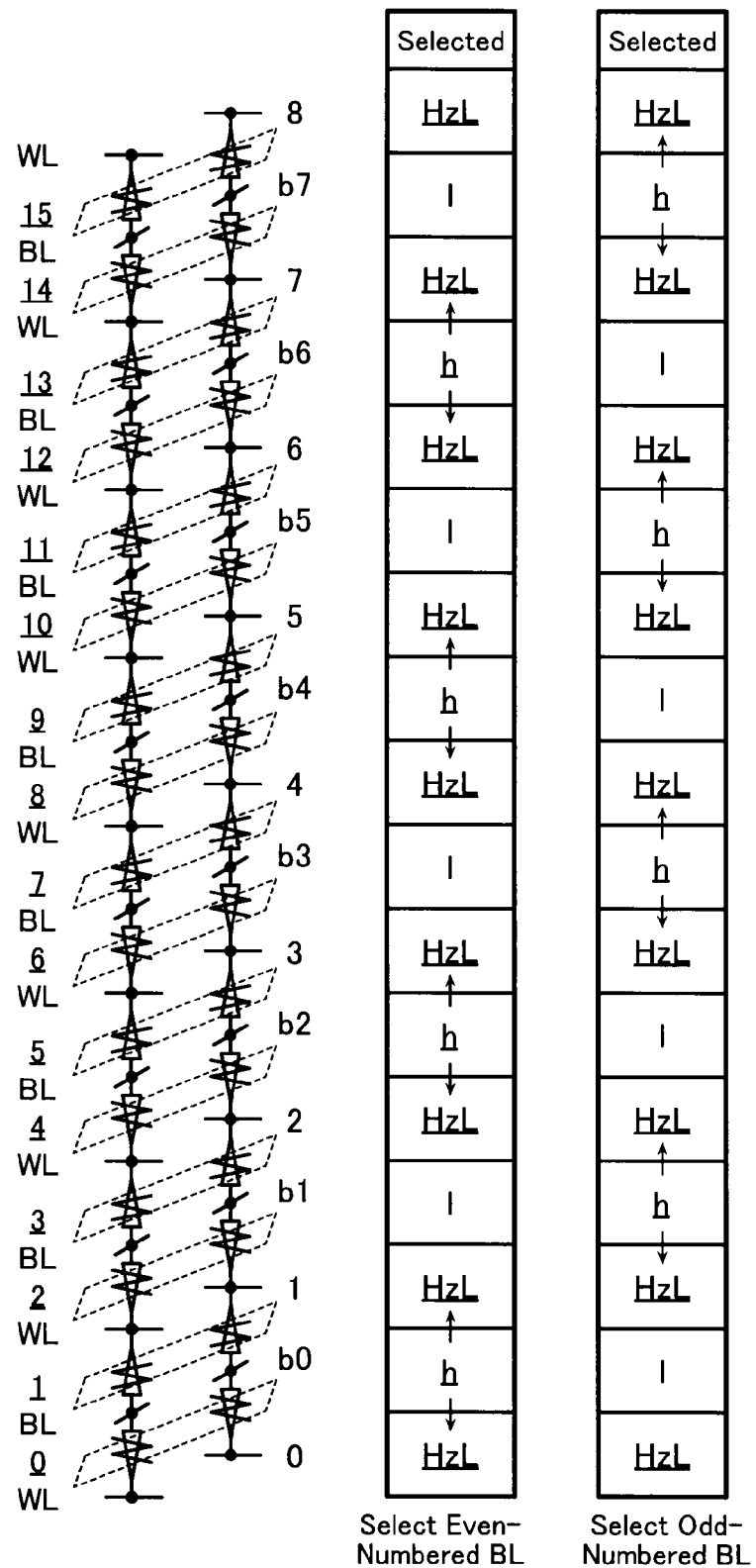
FIG. 11 is a diagram illustrating a lump forming scheme.
Figure 14A:
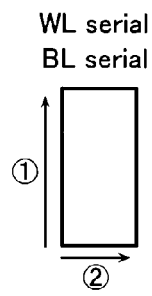
FIGS. 14A-14D are diagrams illustrating the word-line scan first method in lump forming.
Figure 14B:
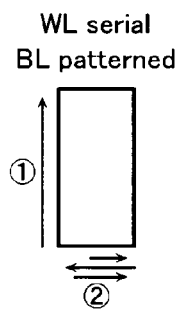
Figure 14C:
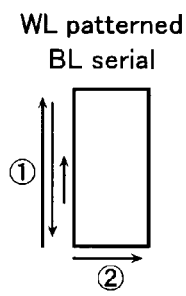
Figure 14D:
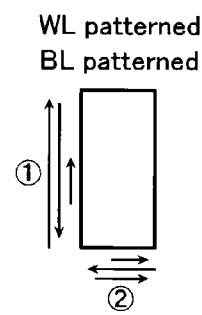
Figure 15A:
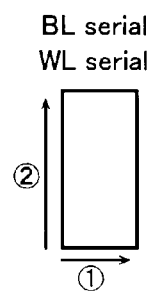
FIGS. 15A-15D are diagrams illustrating the bit-line scan first method in lump forming.
Figure 15B:
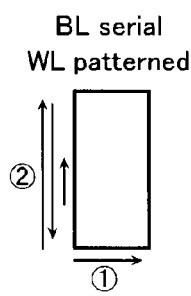
Figure 15C:
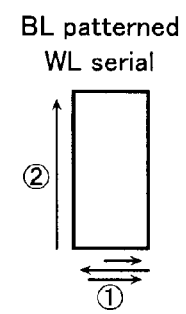
Figure 15D:
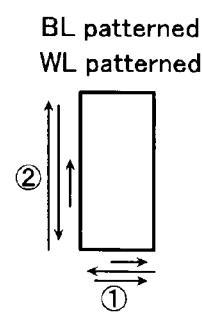

FIG. 11 illustrates a case where the number of laminated mats is 16. The numbers 0 to 15 represent the mat numbers. As can be seen from the figure, since the word lines WL are shared between the mats above and below, bit lines BL are selected so that the word lines will not commonly used by the two mats in forming operation.

For this purpose, when the bit lines BL are numbered as b0, b1, . . . , b7, from lower layer, as illustrated in FIG. 11, a different types of forming operations are separately performed for the different states depending upon whether the even-numbered bit lines are selected or the odd-numbered bit lines are selected. That is, where the even-numbered bit lines are selected, bit lines b0, b2, b4, b6 are set to high level "h", bit lines b1, b3, b5, b7 to low level "1", and word lines to high-impedance low level HzL. Conversely, where the odd-numbered bit lines are selected, bit lines b0, b2, b4, b6 are set to low level "1", and bit lines b1, b3, b5, b7 to high level "h".

Since a lump-forming operation is to be performed per bit line, bit-line scan is required in order to complete the forming operation for all cells. In addition, since it is not necessary to complete a forming operation on all cells that are formed along a bit line at one time, it is also necessary to consider how the cells should be selected in the bit line BL. As such, the cell selection and scanning methods during the forming operation will be described below.

Firstly, the cells on which the forming operation is performed at the same time when one bit line BL is selected are determined by the word lines WL selected at the same time. That is, in order to select some of the cells formed along one bit line BL at the same time, some of multiple word lines WL in a mat are collectively selected. This method is divided broadly into two methods.

Figure 12A:
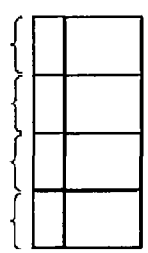
FIGS. 12A-12B are diagrams illustrating a word line selection scheme in lump forming.
Figure 12B:

That is, as illustrated in FIG. 12, one of the two methods is the "lump" method (FIG. 12A) where word lines in one mat are divided into multiple groups (e.g., four groups), and multiple word lines in respective groups are collectively selected at the same time. The other method is the "sparse" method (FIG. 12B) where word lines in one mat are simultaneously selected in a distributed manner (e.g., one word line is selected from four neighboring word lines).

Figure 13A:
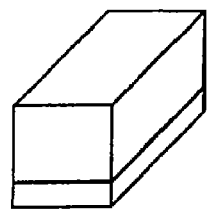
FIGS. 13A-13C are diagrams illustrating a mat selection scheme in lump forming.

The same is true for selection of the laminated mats. As mentioned earlier in FIG. 11, although the even- and odd-numbered ones will not be selected at the same time, in addition to a method (FIG. 13A) for selecting only one mat as illustrated in FIG. 13, the lump method (FIG. 13B) and the sparse method (FIG. 13C) are also illustrated as methods for selecting some of multiple mats in the lamination direction at the same time.

Figure 13B:
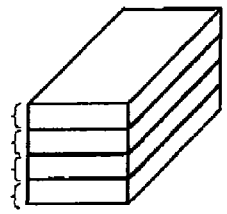
Figure 13C:
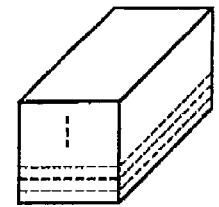

In the lump method of FIG. 13B, the laminated mats are physically divided into multiple groups, and selected at the same time on a group-by-group basis. In the sparse method of FIG. 13C, a plurality of mats are simultaneously selected in a distributed manner (e.g., one mat is selected from four neighboring mats).

Since the forming operation is performed on all cells in a cell array block, a partial lump-forming operation should be "scanned" within the cell array block. This scanning method also includes several options.

When a lump-forming operation is to be performed on a plurality of cells that belong to one bit line BL, both the selection of word lines WL and selection of bit lines BL are to be changed. In order for performing this, there are two scanning methods. One is a word-line scan-first method (FIG. 14) where the word lines WL are first scanned. The other method is a bit-line scan-first method (FIG. 15) where the bit lines are first scanned.

The scanning itself includes: serial scan for sequential selection from one end to the other; and patterned scan for setting certain patterns for a scanning order. These two scanning schemes may be applied to the bit-line scan as well as the word-line scan. Depending on whether one of these scan schemes is used for the word lines WL or the bit lines BL, the word-line scan-first method includes four types of methods as illustrated in FIGS. 14A to 14D. Likewise, the bit-line scan-first method includes four types of methods as illustrated in FIGS. 15A to 15D.

Figure 16A:
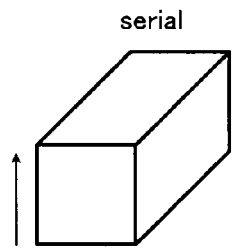
FIGS. 16A-16B are diagrams illustrating a mat scan scheme in lump forming.
Figure 16B:
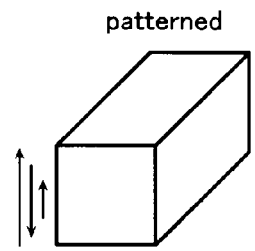

For the scanning of mats in the lamination direction, there also exist serial scan and patterned scan, as illustrated in FIGS. 16A and 16B. Note that the scanning of mats is influenced by different manufacturing process steps for different mats and cell property variations between the mats. Therefore, it is preferable that the forming operation of mats that can be conducted under the same condition is performed first, and the scanning of the mats is performed after a series of forming scan operations are finished.

Now an example of a forming operation in the above-mentioned 8 Gb×m memory, i.e., in a 64 Gb memory (m=8) is explained with reference to FIGS. 17 and 18.

Figure 17:
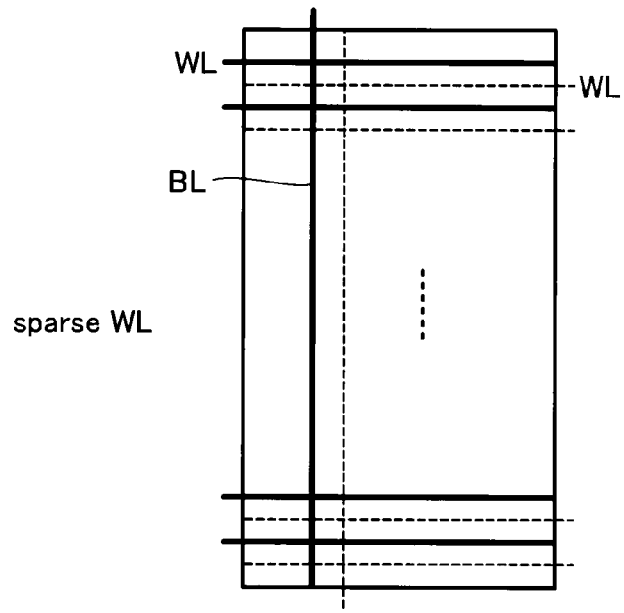
FIG. 17 is a diagram illustrating the in-mat scan at 64 Gb memory.

As illustrated in FIG. 17, ½ division scheme is utilized in the mat, where half of word lines WL (as indicated by full line or dotted line) in the mat are selected at the same time for one bit line BL. The word line selection in this case is such that the word lines are selected at the same time according to the sparse method, since the word lines are alternately driven by the word-line drivers from the right and left sides of the mat. In addition, as described below, since the word lines WL are provided with a quite low selection signal in level in a forming operation, while the bit lines BL are provided with selection signals with large difference in amplitude. Accordingly, word-line scan-first scheme is used in view of the signal amplitude frequency and power.

The word-line scan is performed by the serial scan, because there are two word line groups in this example. The bit-line scan may be performed by any of the serial or patterned scan. However, since the bit lines are alternately connected to two sense amplifier systems, it is more preferable to perform scanning in such pattern that the same sense amplifier system is continuously selected, rather than alternately selecting the two sense amplifier systems and consuming activation power. That is, preferably, the bit-line scan is conducted by the patterned scan.

Figure 18:
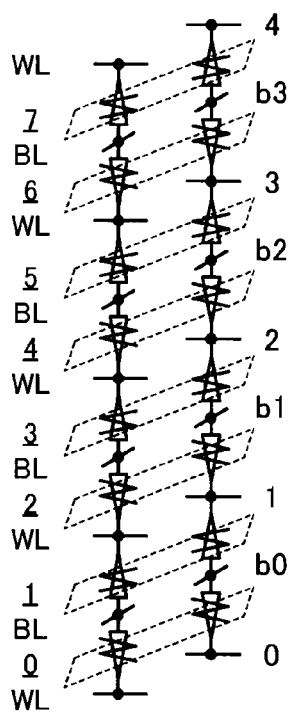
FIG. 18 is a diagram illustrating the mat scan at 64 Gb memory.

In addition, the scanning of the laminated mats is performed by the serial scan where mats are sequentially selected as illustrated in FIG. 18, starting from the mat in the bottom layer, then moving to another mat in the upper layer. This is preferable because the forming conditions can be sequentially changed when the process conditions vary in an inclined manner from lower to upper layer.

In parenthesis, the time and current consumption taken for the forming operation of all cells are estimated as follows: As described with respect to FIGS. 4 and 7, those blocks indicated by squares, each including eight cell array blocks together, are arranged in a matrix of $32 \times 16 = 2^9$. As one bit line is selected from respective mats in only one of the layers, $2^{12}$ bit lines are selected at the same time.

Since a high resistance cell before completion of the forming operation flows a current of 10 nA at most when it is applied with a forming voltage, and thus half of the 2 k cells hung from the bit line are subject to a lump-forming operation at the same time, the buffer current capacity of 1 k×10 [nA]=10 [μA] is required in the block. Accordingly, the current for one cycle of forming will be $2^{12} \times 10$ [μA] to 40 [mA].

The total amount of time for a forming operation is as follows: Given that the time taken for one cycle of forming is 80 [ns], then two cycles involve 2×80 [ns], which is multiplied by the result of the total number of bit lines, $2^{15}$ (mat)×1 k, divided by the number of bit lines subject to forming at the same time, i.e., $2\times80[ns]\times2^{15} k/2^{12}=10\times2^{17}$[ns] to 1.25[ms]. When a forming operation is completed, setting of a reference cell that generates a reference current used in a current-comparison type sense amplifier in cell data reading is also automatically completed. This is because cells are all in a "set" state with a low resistance after the forming operation, and all of the cell is subject to a forming operation.

Figure 19:
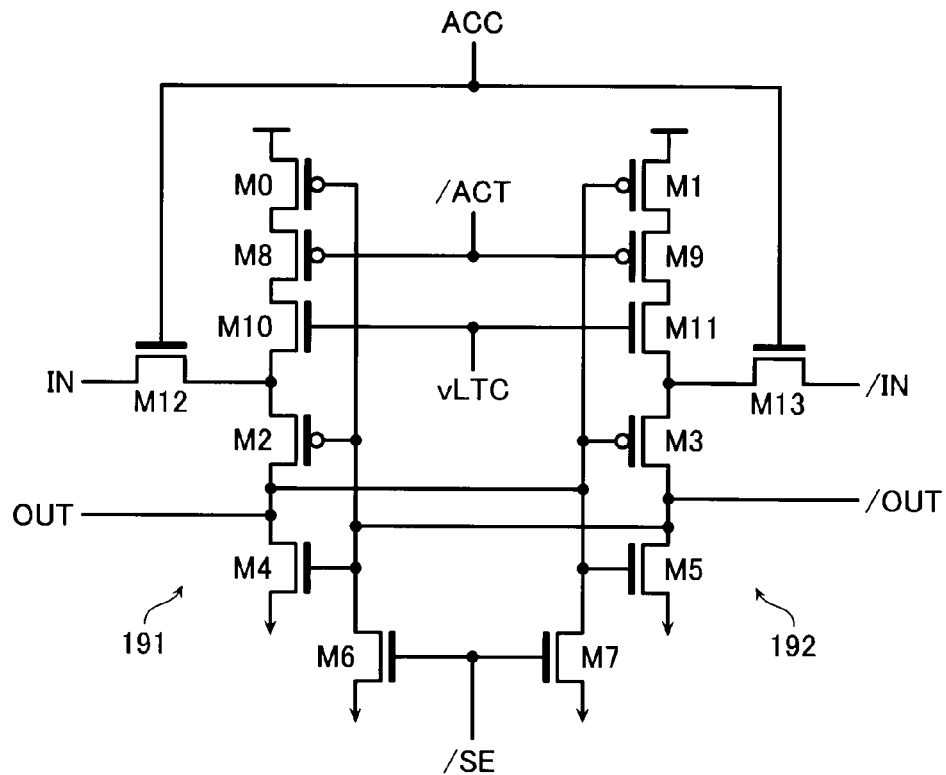
FIG. 19 illustrates a configuration of a sense amplifier.

Referring first to FIG. 19, a current-source-type sense amplifier SA will be described below that provides fast comparison between minute currents. The sense amplifier SA is a current sensing amplifier that is connected to a bit line BL which is set at a higher level than a word line WL when selected, and that compares the current flowing into the bit line with the reference current. The sense amplifier SA is configured to be able to ensure a fast sensing even for comparison of currents not more than 100 nA.

Specifically, the sense amplifier SA has a first current path 191, and a second current path 192 formed symmetrically to the first current path 191 between Vdd and Vss. The first current path 191 has PMOS transistors M0, M8, a NMOS transistor M10, a PMOS transistor M2, and a NMOS transistor M4 connected in series. The second current path 192 has PMOS transistors M1, M9, a NMOS transistor M11, a PMOS transistor M3, and a NMOS transistor M5 connected in series.

The source of the PMOS transistor M2 in the first current path 191 is connected to an input node IN via a NMOS transistor N12. The source of the PMOS transistor M3 in the second current path 192 is connected to an input node /IN via a NMOS transistor N13.

A connection node between the PMOS transistor M2 and the NMOS transistor M4 in the first current path 191 represents one output node OUT, and another connection node between the PMOS transistor M3 and the NMOS transistor M5 in the second current path 192 represents the other output node /OUT.

The respective gates the PMOS transistors M0, M2 and the NMOS transistor M4 in the first current path 191 are commonly connected to one output node /OUT, and the respective gates of the PMOS transistors M1, M3 and the NMOS transistor M5 in the second current path 192 are commonly connected to the other output node OUT, thereby configuring a CMOS latch. That is, the CMOS inverters included in the first current path 191 and other CMOS inverters included in the second current path 192 have their inputs/outputs cross-connected, by which a latch is provided.

The PMOS transistors M8, M9 are activation transistors, the gates of which are controlled by activation signals /ACT. The NMOS transistors M10, M11 are current control devices in the current paths 191, 192, the gates of which are controlled by signals vLTC to determine the sense amplifier current.

The gates of the NMOS transistors M4 and M5 included in the CMOS latch are connected to the drains of the respective NMOS transistors M6 and M7 that are driven by sense signals /SE. The NMOS transistors M6, M7 turn on during /SE="H" to keep the NMOS transistors M4, M5 off in the CMOS latch.

That is, the current flowing through the current paths 191 and 192 with activation signal /ACT="L" continues to flow to Vss via the respective NMOS transistors M7, M6 until /SE becomes "L". Then, after a cell current is introduced, and when /SE="L" is sensed, the NMOS transistors M6, M7 turn off to shut off the path current, and a drain voltage difference between them is amplified by positive feedback at the CMOS latch.

Figure 20:
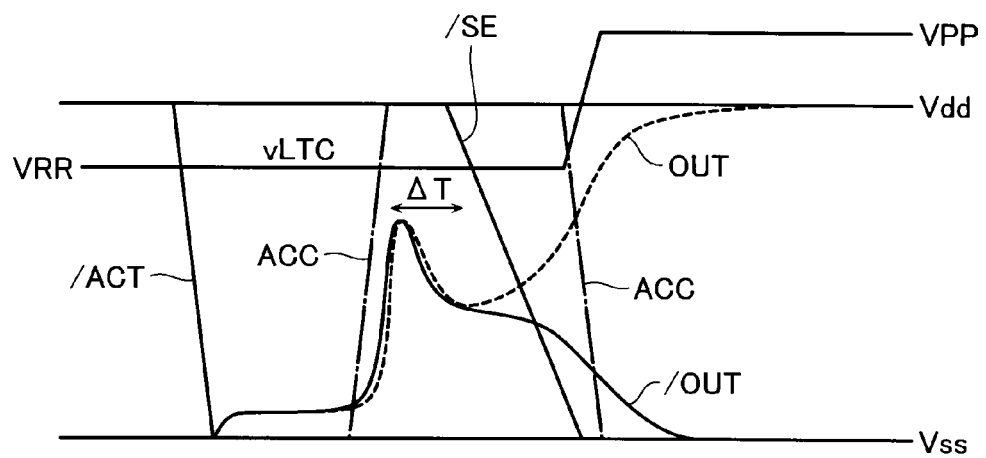
FIG. 20 illustrates operational waveforms of the sense amplifier.

Referring now to FIG. 20, an operation of the sense amplifier SA according to this embodiment will be described below. When the sense signals /SE are at "H", the NMOS transistors M6, M7 are on, therefore the output nodes OUT, /OUT are kept at "L" level. When the activation signal /ACT becomes "L", current flows through the current paths 191, 192. Then, once a cell current capture signal ACC becomes "H" and current is injected into the bit line and the reference bit line connected to the input nodes IN, /IN, a minute voltage difference occurs between the drains of the NMOS transistors M6, M7, depending on the current difference between the cell currents.

When the sense signal /SE becomes "L" after an appropriate time ΔT expires to reflect the cell current difference, the NMOS transistors M6, M7 turn off, and one of the NMOS transistors M4, M5 turns on and the other off, due to the positive feedback operation of the latch circuit for amplifying the drain voltage difference. That is, as the NMOS transistors M6, M7 transition from on to off, the timing deviation based on the cell current difference is converted to their drain voltage, which in turn is amplified by the positive feedback.

The transistor pair M10, M11 sets the gate signals vLTC to the low level VRR for mitigating the conductance at an earlier stage of sensing to suppress the sense amplifier current from the power supply Vdd, so that the cell current difference supplied through the pair M12, M13 can be more adequately reflected to the state of the sense amplifier. When the sense amplifier gets off balance due to the cell data current difference at the initial sensing of the sense amplifier, the gate signals vLTC are changed from VRR to VPP which is higher than Vdd and the power supply voltage is supplied to the sense amplifier, the output of which in turn is fully swung to Vdd. In this case, the signal ACC is caused to fall to shut off the cell current supplied to the sense amplifier.

Since the variations in refined pair transistors are caused by fluctuation in the manufacturing process, it is more preferable that the current paths 191, 192 include as many devices as possible connected in series, as illustrated in FIG. 19, because the variations are compensated. Consequently, M0 and M1 pair, M8 and M9 pair, and M10 and M11 pair are included between the input nodes and the power supply Vdd.

In particular, the N-channel transistor pair M10 and M11 mitigates the effects of variation in the P-channel transistor pairs M0, M1 and M8, M9, that forms a feedback loop of the sense amplifier SA's operation. That is, the conductance of the N-channel transistors is reduced, while the potential of the drains or sources of the P-channel transistors closer to the power supply Vdd is increased, thereby providing higher conductance at the P-channel transistors. That is, the conductance of the P- and N-channels acts to mitigate the effects of variation, respectively.

The time difference ΔT between a rise in the signal ACC and a fall in the sense operation start signal /SE is adjusted so that the sensing can be initiated after injection of the cell current is completed subsequent to a rise in ACC, and an input current is obtained such that the cell current is adequately reflected thereto.

Figure 21:
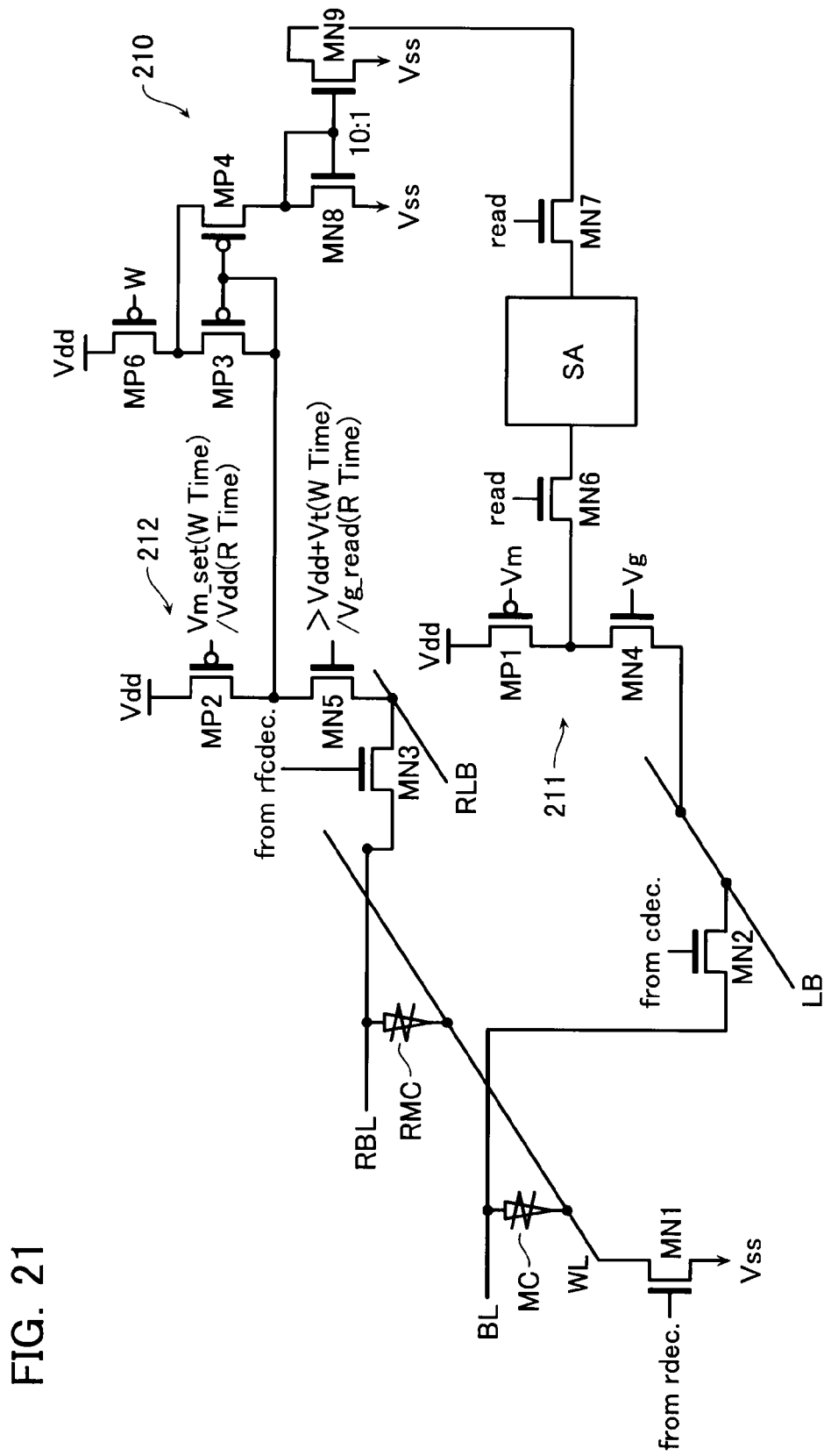
FIG. 21 illustrates a circuit configuration around the sense amplifier.

FIG. 21 illustrates a case where one word line WL is selected in a mat and an information (selected) cell MC and a reference cell RMC are accessed, together with a path along which the current of the cells is introduced into the sense amplifier SA.

A certain bit line in a mat is fixedly selected as a reference bit line RBL, and cells connected to the reference bit line RBL are utilized as reference cells RMC.

Although one bit line BL of the information cell MC is illustrated in the figure, in fact, one reference bit lines RBL is selected for a plurality of bit lines BL. Both bit lines BL of the information cell MC and the reference bit line RBL are located in the same mat, and the sense system thereof is located in the same mat. The way of selecting the reference bit line RBL in the mat will be described below.

Those cells connected to the reference bit line RBL, i.e., the reference cells RMC are all set to a "set" state with a low resistance after a forming operation is completed. The reference cells RMC will not be set to any other state other than the "set" state after selected as the reference bit line RBL. That is, upon occurrence of write to the information cell MC, such a word line WL is selected that is common to the information bit line BL and the reference bit line RBL, and so the write operation for obtaining a "set" state is performed on the reference bit line RBL at the same time. This write also means refresh of the reference cell RMC of the reference bit line RBL.

The cell current of the information cell MC flowing through the bit line BL becomes one input of the sense amplifier SA, while the reference cell current of the reference bit line RBL flows once through a current mirror circuit 210, where the amount of current is reduced to a reference current value which is about ten times smaller than the original, and becomes the other input of the sense amplifier SA.

The resistive material of the memory cell has a resistance value with small variations when it is set at a "set" state with a low resistance value, which is suitable for the reference current. The cell current (e.g., Ic(0)) of the reference cell RMC at the "set" state is set to be smaller by a factor of N (e.g., N=10), and the resulting current is converted at the current mirror circuit 210 and utilized in a proper manner such that Ic(1)<Ic(0)/N<Ic(0) is satisfied relative to the cell current (e.g., Ic(1)) at reset state.

The circuit of FIG. 21 will be specifically described below. When the word line WL is selected, the word line switch transistor MN1 that is driven by a decode signal from a row decoder turns on, and the word line WL is connected to Vss. When the bit line BL and the reference bit line RBL are selected, the bit line switch transistors MN2 and MN3 that are controlled by outputs of the column decoder and the reference column decoder turn on, and they are connected to local data buses LB and RLB, respectively.

The local bus LB is connected to a write buffer 211 that is a serial circuit of the PMOS transistor MP1 and the NMOS transistor MN4. Similarly, the reference local data bus RLB is connected to a write buffer 212 that is a serial circuit of the PMOS transistor MP2 and the NMOS transistor MN5.

In reading, the NMOS transistor MN4 of the write buffer 211 is driven to turn on, and the local bus LB is connected to one input of the sense amplifier SA via the read switch NMOS transistor MN6. Then, at the same time, the NMOS transistor MN5 of the write buffer 212 is driven to turn on, and the reference cell current of the reference local bus RLB enters the current mirror circuit 210, where its magnitude is reduced to one-Nth, and then supplied to the other input of the sense amplifier SA via the read switch NMOS transistor MN7.

The current mirror circuit 210 includes: a PMOS current mirror with the PMOS transistors MP3, MP4, that is connected to the power supply Vdd and activated by the PMOS transistor MP6 in non-writing; and an NMOS current mirror with the NMOS transistors MN8, MN9, that reduces the output current to one-Nth. That is, the dimensional ratio of the NMOS transistors MN8 to MN9 is set to N:1, and the reference cell current reduced by one-Nth (e.g., N=10) is supplied to the sense amplifier SA.

FIG. 22 collectively illustrates the level in respective modes of operation, i.e., in read (Read), reset write Reset ("0" write), and set write Set ("1" write), regarding the gate signals Vm and Vg of the PMOS transistor MP1 and the NMOS transistor MN4, and the gate signal read of the read switch NMOS transistor MN6 in the write buffer 211.

That is, in reading, the PMOS transistor MP1 turns off, and the NMOS transistors MN4 and MN6 turn on. In a setting operation, the PMOS transistor MP1 and the NMOS transistor MN4 are each biased to the extent that is required for generating an appropriate set voltage, and, similarly, in a resetting operation, biased to the extent that allows for generation of an appropriate reset voltage.

Specifically, Vdd is set to an adequate potential for generating a set voltage Vset for the cell, such that Vss<Vm_set to Vg_read<Vg_reset<Vdd.

In writing (W time) or reading (R time), the write buffer 212 on the reference bit line RBL side is always set to a set write state. That is, the gate of the PMOS transistor MP2 is applied with Vm_set level in writing and Vdd in reading, while the gate of the NMOS transistor MN5 is set to a level higher than Vdd+Vt in writing and to a Vd_read level in reading. Where Vt represents a threshold of the NMOS transistor.

In this way, since the information cell MC and the reference cell RMC are selected on one of the word lines WL in the mat, the effects of IR drop from the sense amplifier SA through the cells MC and RMC to the word-line driver at the end of the word line WL are compensated at the sense amplifier SA. As a result, a simple comparison between the cell current characteristics of the information cell and the reference cell can be made by the sense amplifier SA. In addition, when the distance between the bit line BL and the reference bit line RBL forming a pair is set within a range that can accommodate IR drop in the word lines, any bias leakage current flowing through the word lines WL does not affect the comparison of the cell currents, and the bias leakage current would be negligible.

Note that the function of a NMOS transistor with a gate applied with a voltage of Vg may be provided at the individual bit line switches themselves.

Figure 23:
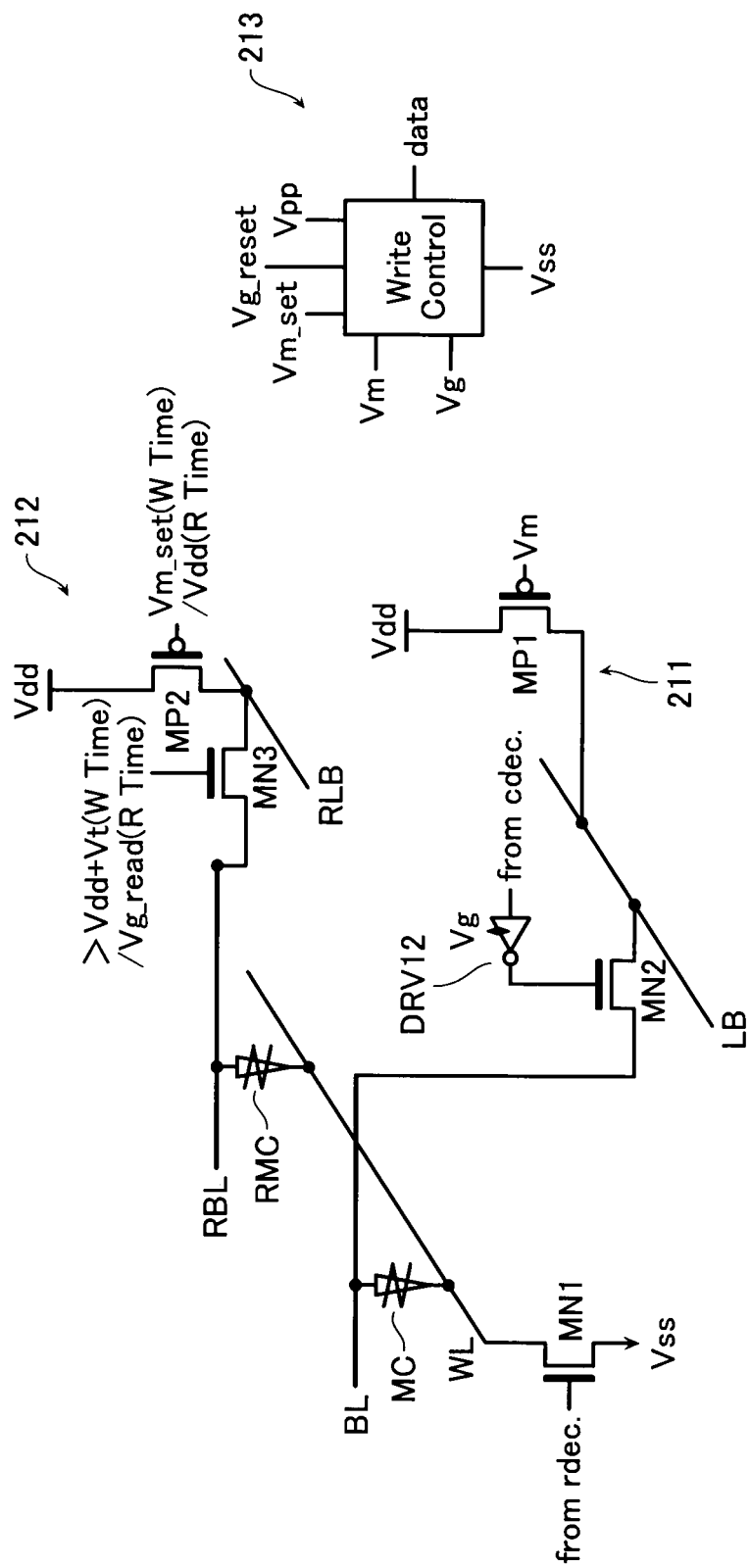
FIG. 23 illustrates another circuit configuration around the sense amplifier.

FIG. 23 illustrates a variation of the write buffers 211, 212 described in FIG. 21. That is, in this variation, the NMOS transistors MN4, MN5 of the write buffers 211, 212 illustrated in FIG. 21 are omitted, and the gate voltages of the bit line switch NMOS transistors MN2, MN3 themselves are controlled to achieve voltage clamp in reset-state write.

Figures 24, 25:
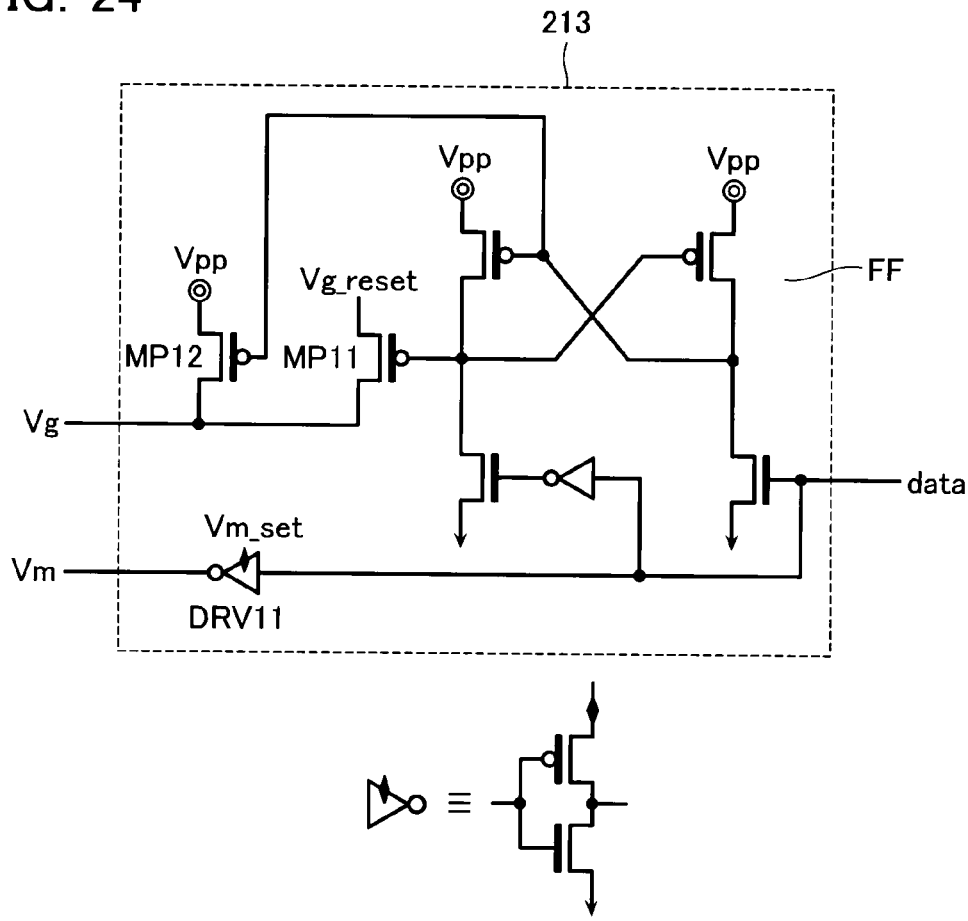
FIG. 24 illustrates an exemplary configuration of the write control circuit of FIG. 23.
FIG. 25 illustrates modes of operation and control signal levels.

A write control circuit 213 is provided to control the level of control signals Vm, Vg of the transistors MP1, MN2 according to write data "data". As illustrated in FIG. 24, the write control circuit 213 has a PMOS flip flop FF that performs a state transition depending on data, and PMOS transistors MP11 and MP12 that are controlled by the PMOS flip flop FF to output Vg_reset and Vpp as a control signal Vg.

A driver DRV11 is provided on the control signal Vm side that outputs Vm_set depending on data. The symbolized driver DRV11 is a CMOS driver as illustrated in FIG. 24. A driver DRV 12 is also a CMOS driver that drives the bit line switch NMOS transistor MN2 in FIG. 23. An output "from cdec." from a column decoder is input to the driver DRV 12. An output "from rdec." from a row decoder is input to the gate of the word line switch NMOS transistor MN1.

FIG. 25 collectively illustrates in a table the control signals Vm, Vg in a resetting operation (writing "0") and in a setting operation (writing "1"). It is assumed that Vdd is at an adequate potential for generating a set voltage Vset of a cell, i.e., Vss<Vm_set to Vg_read<Vg_reset<Vdd.

The write control scheme of FIG. 23 has an advantage that can reduce the impact on cell writing posed by the electric charges accumulated on the local bus LB with large capacity. For example, given that the electric charges accumulated on the local bus LB directly flow into the cell which has transitioned to low resistance in a setting operation, the process can proceed to such a mode where the cell is returned to the reset state. On the contrary, with the scheme of FIG. 23, the switch NMOS transistor MN2 is inserted between the local bus LB and the bit line BL as a voltage clamp device, which prevents the cell from being affected by the electric charges accumulated on the local bus.

More specifically, the bit line switch NMOS transistor MN2 is first turned on to shift some of the electric charges accumulated on the local bus LB to the bit line BL, and then the word line switch transistor MN1 is turned on slowly within a time period nearly equal to a CR-time constant of the system. In this case, the cell which has shifted to a low resistance state will not be set at the mode of returning to the reset state, due to the current restriction by the NMOS transistor MN1 at an earlier stage of switching the word line, and due to the voltage clamp effect of the NMOS transistor MN2 that is controlled by the driver DRV 12 which is controlled by Vg at a later stage.

Note that a sufficient write current can flow in a reset write operation because the current clamp is not effective at a later stage, even when the word line WL is switched in such a slow manner.

Accordingly, in a set write operation, the write operation is completed at an earlier stage of the voltage rise, and thereafter the influence of the accumulated electric charges can be reduced. In a reset write operation, a current can flow for a sufficiently long period of time at a later stage of switching of the word line. Therefore, a reset state may be kept.

Regarding cell access, switch circuits and layouts of the word lines and the bit lines may be made simple, if it is possible to conduct an access even when switches of non-selected word lines and non-selected bit lines are turned off to set the non-selected word lines and the non-selected bit lines at a floating state. The possibility of non-selected word lines and non-selected bit lines being set to a floating state is investigated below.

Specifically, with reference to FIG. 26, a leakage current when a bit line including cells in a set state only is used as a reference bit line RBL in a 3D cell array block, and non-selected word lines and non-selected bit lines are set to a floating state, is to be investigated below.

Figure 26:
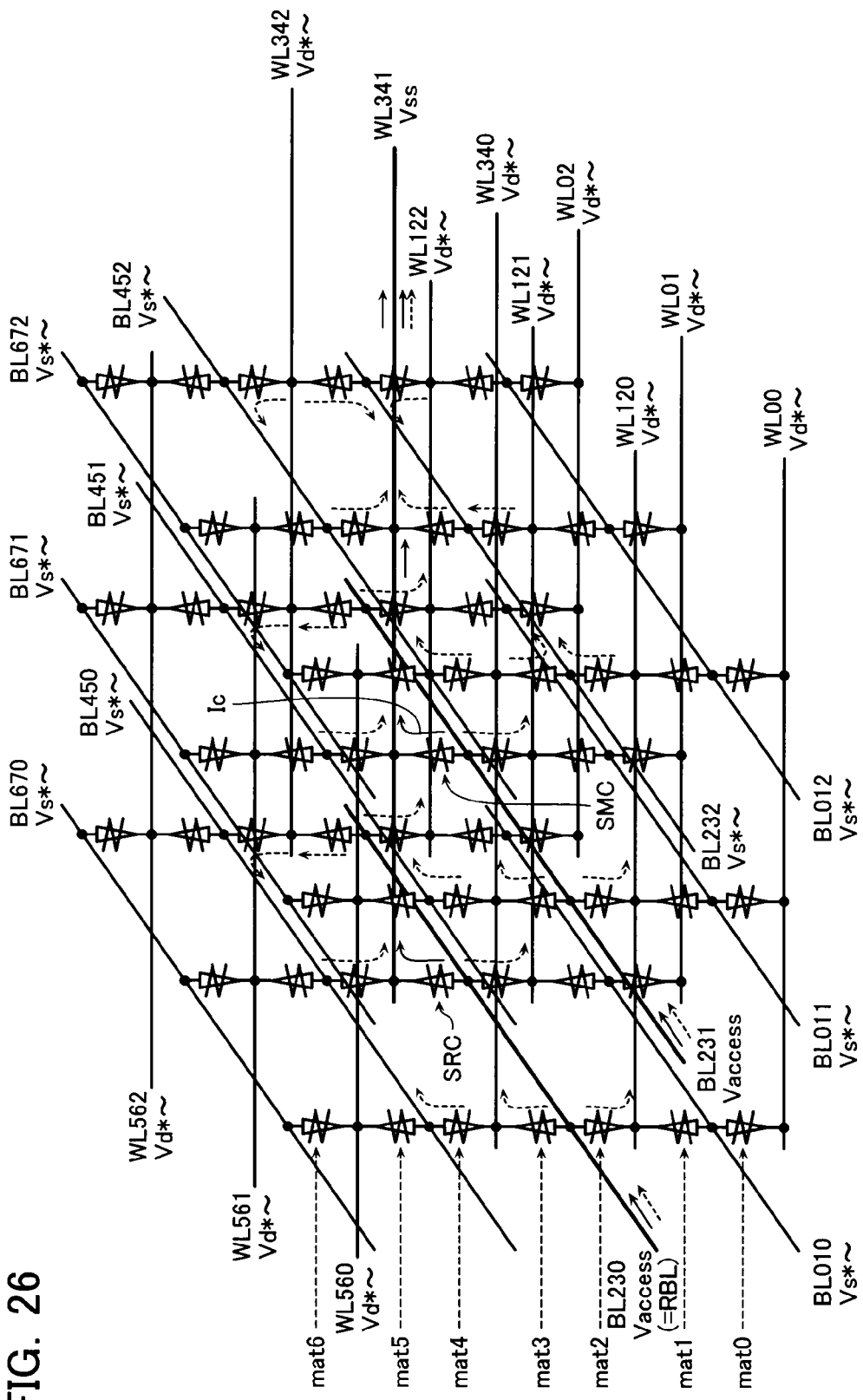
FIG. 26 illustrates a relation between a selected bit line and a reference bit line.

FIG. 26 illustrates the wrap-around leakage current between first layer word lines WL0 (WL00 to WL02), second layer word lines WL12 (WL120 to WL122), third layer word lines WL34 (WL340 to WL342), or fourth layer word lines WL56 (WL560 to WL562), and first layer bit lines BL01 (BL010 to BL012), second layer bit lines BL23 (BL230 to BL232), third layer bit lines BL45 (BL450 to BL452), or fourth layer bit lines BL67 (BL670 to BL672) within seven layers of mats mat0 to mat6.

FIG. 26 illustrates a case where the mat mat3 is selected, the bit line BL230 indicated by a thick line as one of the second layer bit lines BL23 is defined as the reference bit line RBL, another bit line BL231 also indicated by a thick line is the selected as a selected bit line, a drive voltage Vaccess is provided to the bit lines BL230 and BL231, and the word line WL 341 indicated by a thick line is selected as the selected word line, which is set to Vss.

The non-selected word lines are at a voltage Vd* in a floating state (indicated by Vd*~ in the figure), which is lower than Vdd by approximately the forward voltage of the diodes, and the non-selected bit lines are at a voltage Vs* in a floating state (indicated by Vs*~), which is higher than Vss by approximately the forward voltage of the diodes.

The drive voltage Vaccess of the selected bit line and Vss of the selected word line WL 341 serves as a current source of the leakage current. If there is no defective cell in the selected mat and the mats above and below the selected mat, no current path will be provided through a defective cell.

The cells SMC and SRC which are located at the cross-points of the selected bit line BL231 and the reference bit line RBL (=BL230) and the selected word line WL 341 are the selected cell and the selected reference cell, respectively, through which a cell current as indicated by a full line flows depending on the operation mode.

On the other hand, the reference bit line RBL and the selected bit line BL231 supply a current as indicated by the dotted line to all of the non-selected word lines. The reference bit line RBL and the selected bit line BL231 are provided with a voltage Vaccess. The non-selected word lines are set at a floating voltage Vd* and form cross-points with the reference bit line RBL and the selected bit line BL231 through the forward-biased diodes. In addition, the respective word lines are connected to the non-selected bit lines provided with a floating voltage Vs* through the reverse-biased diodes, and to the selected word line WL 341 through the bit lines and the forward-biased diodes.

Focusing on the forward diodes, a current is supplied from the selected bit line BL231 to a word line WL through the forward-biased diodes, and a leakage current is supplied from the word line WL to all bit lines in the bit line layers above and below the selected word WL341 through the path of the diodes with reverse-biased leakage.

As described above, the cell current of the reference cell which is in the same set state and under the same access conditions as the selected cell, is reduced to about one-tenth at a current mirror circuit and used as a reference current. Accordingly, the reference current is smaller than the cell current of a single cell in set state, and larger than that in reset state. Since the wrap-around currents from the reverse-biased diodes in the selected cell is the same as that in the reference cell, the current magnitude relationship is maintained if these wrap-around currents are superimposed at the sense amplifier. The wrap-around current is also small because it occurs between the floating nodes sandwiched between the two forward diodes.

Figure 27:
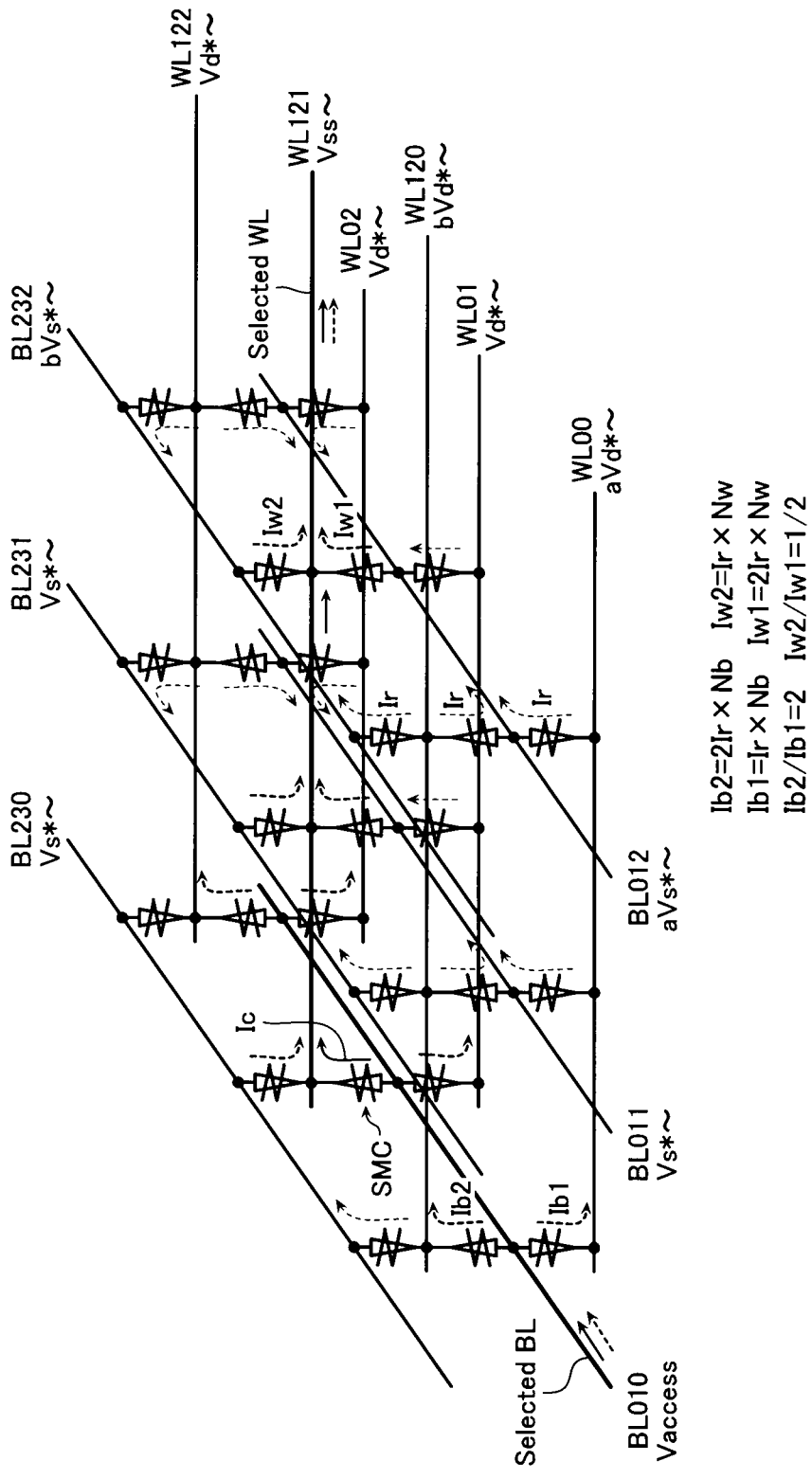
FIG. 27 is a diagram illustrating a current path when non-selected word lines and bit lines are set to a floating state.

Referring now to FIG. 27, the leakage current path between the selected bit line and the selected word line will be investigated in detail below. FIG. 27 illustrates three layers of mats each with 3×3 cells, within the word line layers above and below the selected bit line indicated by a thick line and the bit lines above and below the selected word line indicated by a thick line.

The selected cell SMC is accessed in such a way that a cell current Ic flows from the selected bit line to which Vaccess is provided to the selected word line to which Vss is provided. In addition to the access current, the leakage currents Ib1, Ib2 indicated by thick dotted lines flow into the non-selected word lines (Vd*~) from the selected bit line through the forward diodes, and the leakage current Iw1, Iw2 indicated by thick dotted lines flow into the selected word line from the non-selected bit lines (Vs*~) above and below it through the forward diodes. In addition, the leakage current Ir indicated by a thin dotted line flows into each non-selected bit line from the non-selected word lines above and below it through the reverse-biased diode.

Figure 28:
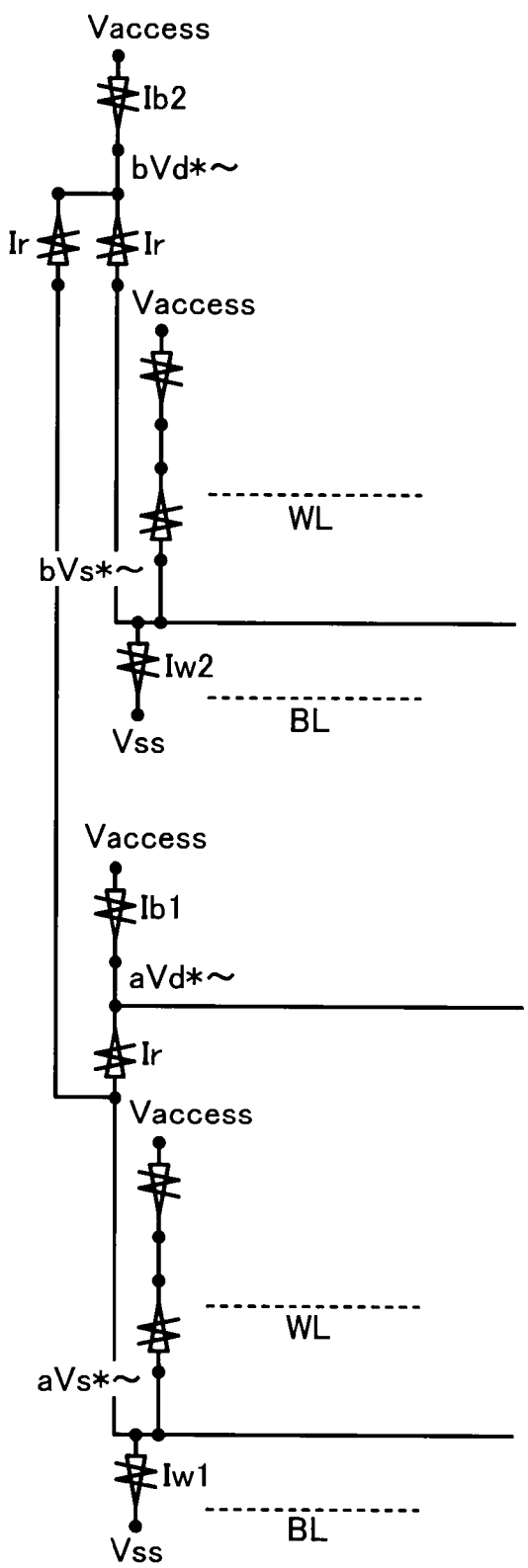
FIG. 28 illustrates the current path route.

FIG. 28 illustrates the current paths, focusing on the currents Ib1, Ib2 flowing from the selected bit line into the non-selected word lines above and below it, and the currents Iw1, Iw2 flowing into the selected word line from the non-selected bit lines above and below it.

Firstly, focusing on the current Ib2, it flows into a non-selected word line at an intermediate level bVd*~. From this word line, the leakage current Ir of the reverse-biased diode flows into the non-selected bit line at bVs*~, which provides a path contributing to the current Iw2. The leakage current Ir path contributing the current Iw1 enters a non-selected bit line at aVs*~ level through the reverse-biased diode. Note that the non-selected word line at bVd*~ level supplies leakage current to those cells of Iw2 and Iw1 corresponding to the number of bit lines.

Then, focusing on the current Ib1, it flows into a non-selected word line at an intermediate level aVd*~. A path from the word line that contributes to the current Iw1 is a leakage Ir that flows into a non-selected bit line at aVs*~ through the reverse-biased diode. Note that the word line at aVs*~ level supplies leakage current to those cells of Iw1 corresponding to the number of bit lines.

Focusing now on the side into which current flows, the current Iw2 is a current from the bit line provided with an intermediate voltage level bVs*~. A current flows into the bit line of bVs*~ from the selected bit line provided with a voltage level of Vaccess. This current flows through the reverse-biased diode, and via plural diodes, the number of which corresponds to the number of word lines equivalent to the word lines as the Ib2 path provided with a voltage of bVd*~.

The current Iw1 is a current from the bit line provided with an intermediate voltage level aVs*~. A current flows into the bit line of aVs*~ from the selected bit line provided with a voltage level of Vaccess. This current flows through the reverse-biased diode, and via plural diodes, the number of which corresponds to the number of word lines equivalent to the word lines as the Ib1 path and Ib2 path provided with a voltage of aVd*~ and bVd*~.

Since the above-mentioned leakage currents are the same on both sides, from which and into which it flows, assuming that the reverse-biased diode has a leakage current of Ir, then the following relation is obtained: $Ib2=2Ir \times Nb$, $Ib1=Ir \times Nb$, $Iw2=Ir \times Nw$, and $Iw1=2Ir \times Nw$. Where Nb is the number of bit lines and Nw is the number of word lines. Therefore, $Ib2/Ib1=2$, $Iw2/Iw1=\frac{1}{2}$.

As can be seen from the above analysis regarding the leakage current path, one diode supplying the leakage current has different current paths to be considered as a condition from a diode receiving the leakage current.

Figure 29:
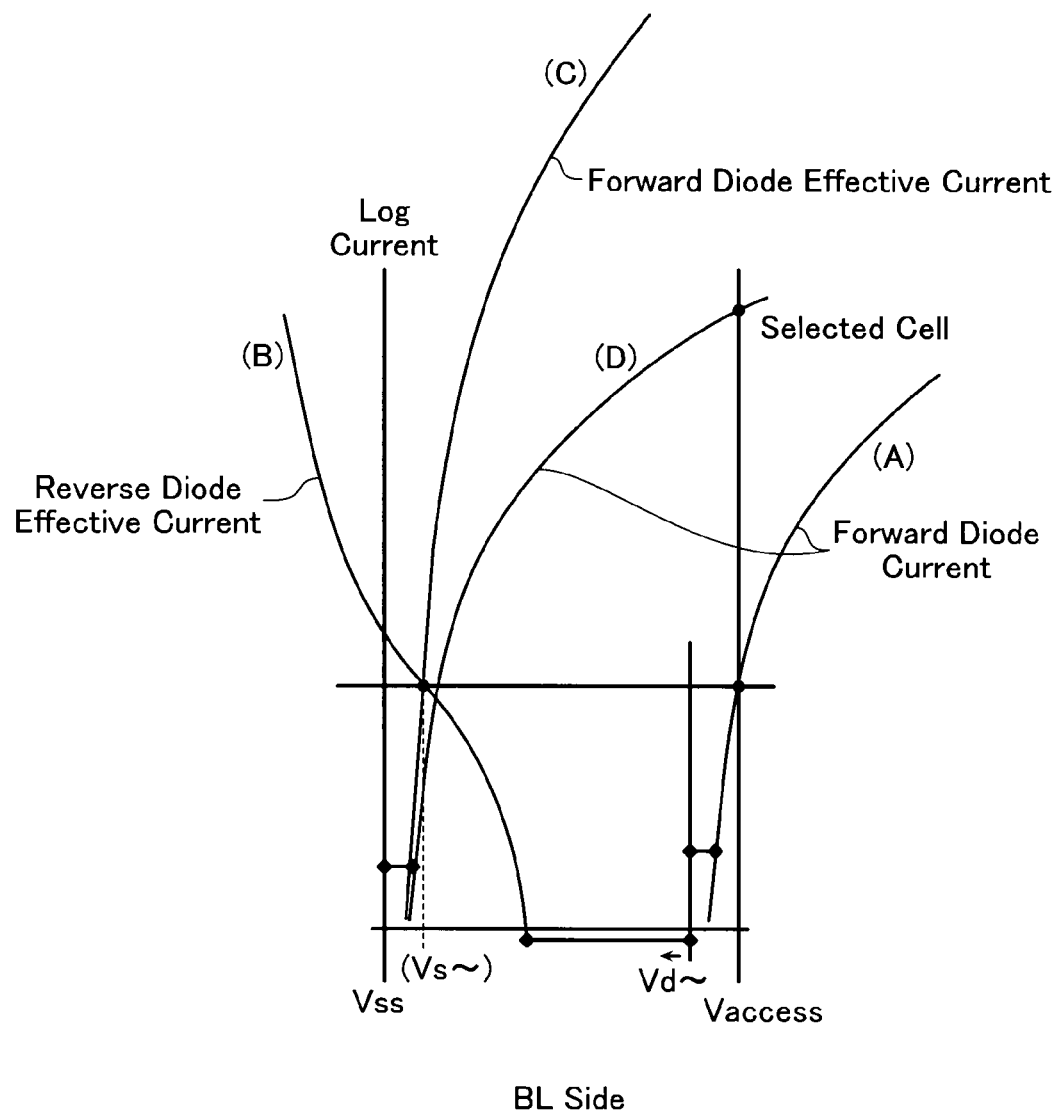
FIG. 29 is a diagram illustrating an equilibrium point of the reverse-biased diode leakage current.
Figure 30:
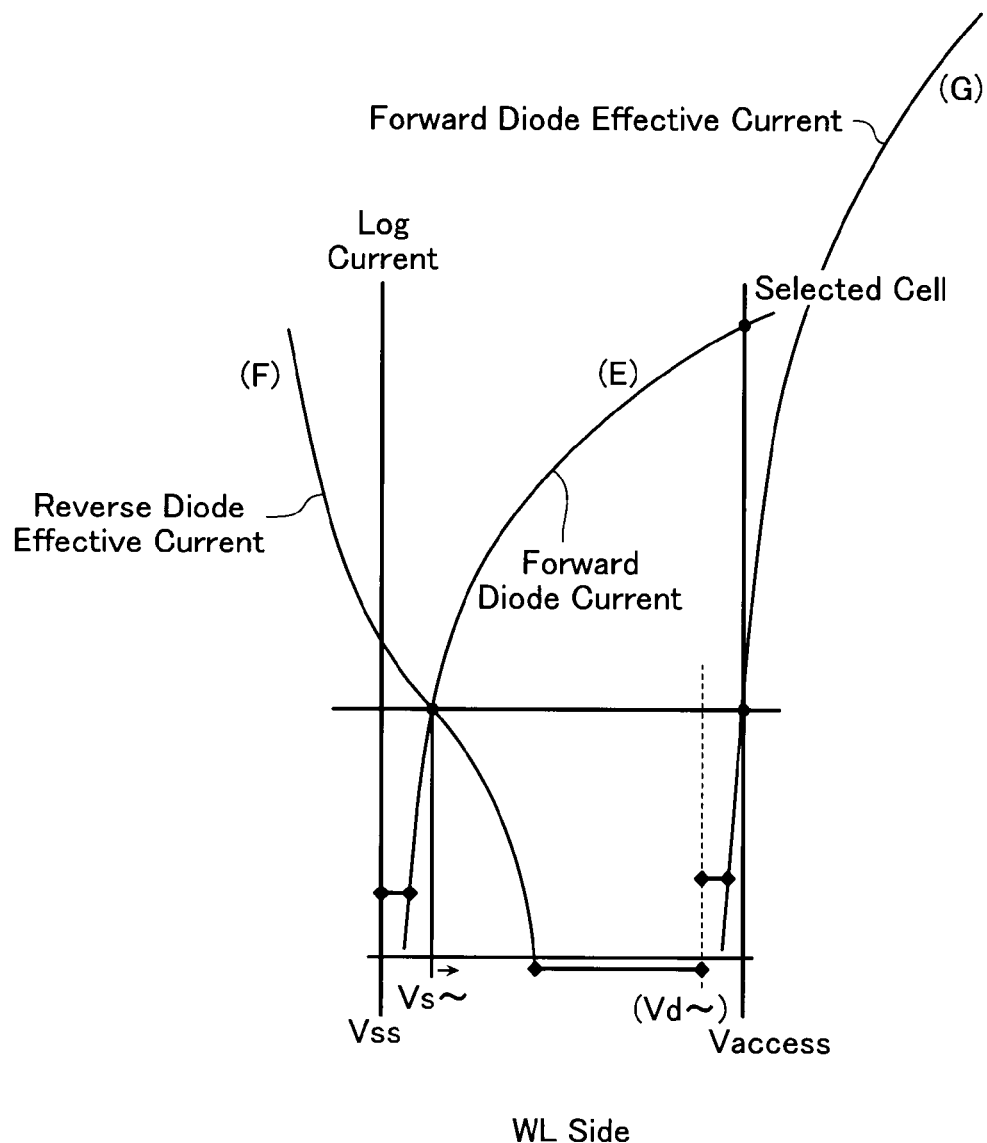
FIG. 30 is a diagram illustrating an equilibrium point of the reverse-biased diode leakage current.

As such, the state at which the current is balanced is summarized in view of the relation between the biasing voltage and the current of the diode. FIG. 29 illustrates a current balance state in the bit lines from which currents Ib1, Ib2 are supplied. FIG. 30 illustrates a current balance state in the word line that receives currents Iw1, Iw2. Here, it is assumed that the resistance value of the resistive material included in the memory cell is ignorable, and a largest diode current is provided. The vertical axis of FIGS. 29 and 30 represents log values of a current, indicating the change in orders of the current values. The horizontal axis represents the voltages Vss and Vaccess applied to both ends of the selected memory cell, potentials Vs~ or Vd~ of an intermediate floating node between the selectet bit line and the selected word line, and diode characteristics viewed from these intermediate floating nodes. In this case, the intermediate levels depicted in brackets are common to all relevant bit lines or word lines.

On the bit line BL side, as illustrated in FIG. 29, a word line (non-selected) at the voltage Vd~ first appears as viewed from the voltage Vaccess at the far right of the horizontal axis, and then the forward current characteristics (A) of one diode appear at the Vaccess side relative to the Vd~ level. In addition, there is a reverse-biased current characteristics (B) of diodes, the number of which corresponds to that of the bit lines, in the direction of Vs~ on the left of the word line.

Then, a word line (non-selected) at the voltage Vs~ appears as viewed from the voltage Vss at the far left of the horizontal axis, and then the forward-biased current characteristics (C) of diodes appears at the Vss side relative to the Vs~ level. The number of diodes with respect to the current characteristics (c) corresponds to that of the bit lines.

Note that the characteristics of one diode in the selected cell correspond to the current characteristics (D) of a single forward diode based on Vss, and the change in log current is smaller than (C) by the number of bit lines.

In a current balance state, the intermediate levels Vd~ and Vs~ are automatically controlled so that the a forward current from the Vaccess level to the Vd~ level becomes equal to the sum of a reverse-biased leakage current from the Vd~ level to Vs~ level and the forward current from the Vs~ level to the Vss level. In this case, since a larger diode current is provided as compared with when the number of bit lines is not taken into consideration, the word line level Vd~ moves toward lower potentials. In addition, the current value itself is several orders of magnitude lower than the current of the selected diode.

On the word line side, as illustrated in FIG. 30, a bit line (non-selected) at Vs~ level first appears as viewed from the Vss side at the far left of the horizontal axis. Then the forward current characteristics (E) of one diode appear at the Vs~ side relative to the Vss level. In addition, with respect to the bit line, the reverse-biased current characteristics (F) of the diodes appear in the Vd~ direction on the right side of the horizontal axis. The number of the diodes corresponds to that of the word lines.

Then, a word line (non-selected) at the voltage Vd~ appears as viewed from the voltage Vaccess at the far right of the horizontal axis, and then the forward-biased current characteristics (G) of diodes appears at the Vaccess side relative to the Vd~ level. The number of diodes with respect to the current characteristics (G) corresponds to that of the word lines.

Note that the characteristics of one diode in the selected cell correspond to the current characteristics (E) of a single forward diode based on Vss, and the change in log current is smaller than (B) by the number of bit lines.

In a current balance state, the intermediate levels Vd~ and Vs~ are automatically controlled so that the a forward current from the Vss level to the Vs~ level becomes equal to the sum of a reverse-biased leakage current from the Vd~ level to Vs~ level and the forward current from the Vaccess level to the Vd~ level. In this case, since a larger diode current is provided as compared with when the number of word lines is not taken into consideration, the bit line level Vs~ moves toward higher potentials. In addition, the current value itself is several orders of magnitude lower than the current of the selected diode.

As can be seen from the above analysis, the reverse-biasing voltages are Vs~ and Vd~ that are applied to groups of intermediate bit lines and word lines associated with the selected bit line and word line. It can be understood that these voltages does not vary significantly as compared with when the number of relevant diodes arranged in parallel is not so large. In addition, since the current is of a quite low order than the current value of the selected diode, it will not disturb the access state to the selected cell.

Next, a method of using a bit line including cells in a set state only as a reference bit line RBL in a 3D cell array block is described. In addition, the leakage current of the cross-fail and the like when such the method is performed is investigated below.

Figure 31:
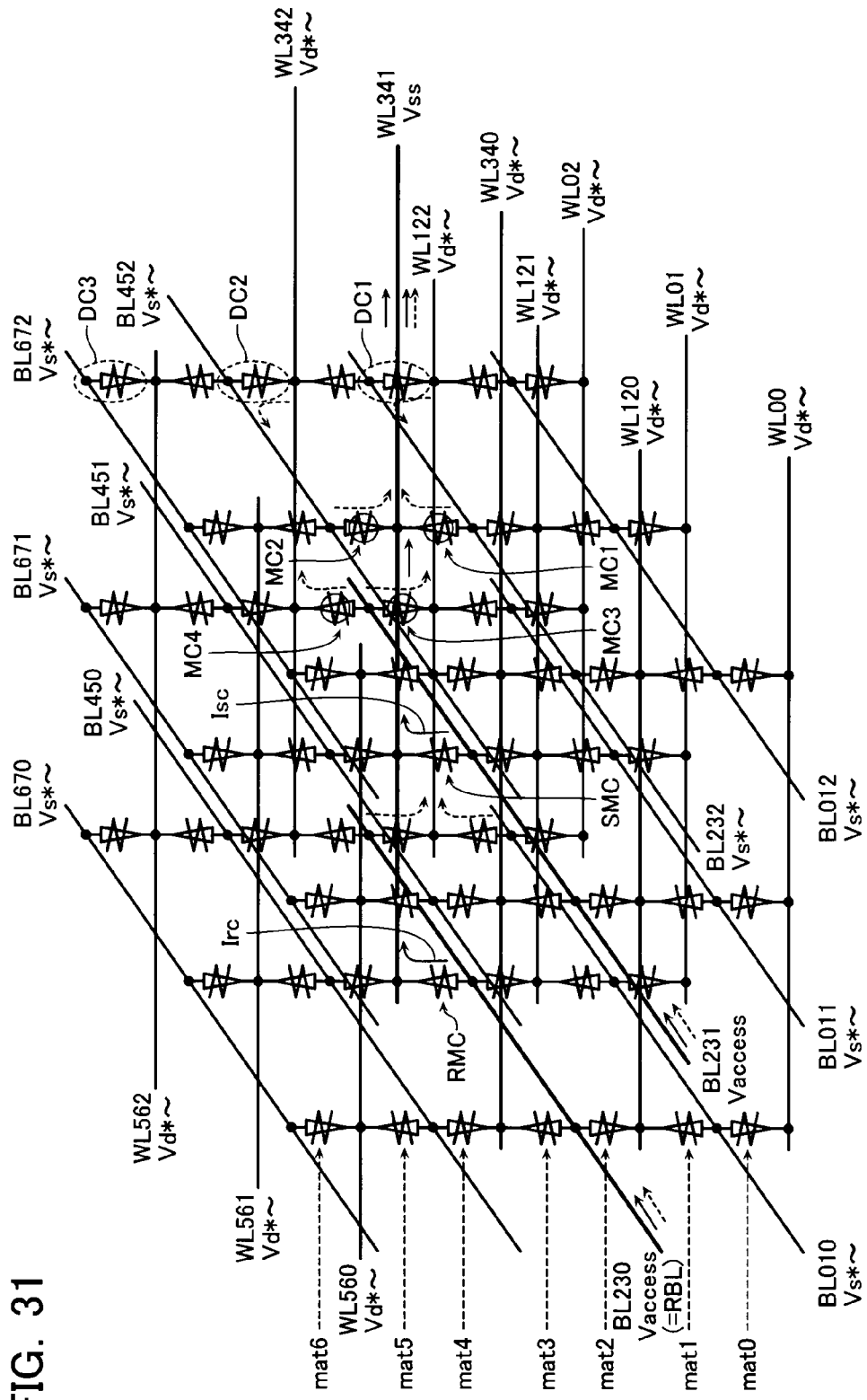
FIG. 31 is a diagram illustrating the effects of cross-fail.

FIG. 31 illustrates effects of cross-fail due to a defective cell, when one bit line BL230 among the bit lines BL230 to 232 is defined as the reference bit line RBL, the bit line BL231 is selected as the selected bit line, and the word line WL 341 is selected as the selected word line, in seven layers of mats mat0 to mat6 similar to those in FIG. 26.

The voltage Vaccess of the selected bit line and the voltage Vss of the selected word line may be a source of leak current. As can be seen in the figure, if any defective cells are present in the selected mat and in the mats above and below it that share the bit lines and word lines with the selected mat, then the current through these defective cells will flow from the selected bit line to the selected word line.

FIG. 31 illustrates the leakage current that flows due to a defective cell along with the access current to the cells, for considering the effects. It also illustrates where defective cells DC1 to DC3 are present in the a mat above the selected word line and below the selected bit line. It is assumed that the relevant diodes will not function due to abnormally-increased leakage current in a reverse-biased state in these defective cells. These defective cells may be taken as those portions where bit lines and word lines are short-circuited, so-called, cross-fails between word lines and bit lines.

Assuming the short-circuits at the locations of the defective cells, the leakage current as indicated by the dashed arrows in the figure flows through the 3D cell array. The cell current Isc represents an access current of the selected cell SMC, and the cell current Irc represents an access current of the reference cell RMC. The leakage current flows from the selected reference bit line BL230 (=RBL) and the selected bit line BL231 provided with a voltage of Vaccess, to the word lines WL 122 and WL342 connected to the defective cells DC1 and DC2. It then flows to the bit lines BL232 and BL452 via the defective cells DC1 and DC2. Then, it flows into the selected word line WL341 from these bit lines BL232 and BL452 through the cells MC1, MC2 including forward-biased diodes.

Accordingly, a large forward voltage is applied to the cells MC1 and MC2 that are located at cross-points of the bit lines to which the defective cells belong and the selected word line, causing a disturbance to the cells in writing.

Similarly, a large forward voltage is also applied to the cells MC3, MC4 that are located at cross-points of the word lines WL 122, WL342 to which the defective cells belong and the selected bit line BL231, causing a disturbance to the cells in writing.

As can be seen from the figure, those cells associated with the bit lines and the word lines to which the defective cells belong are subject to a large disturbance for every write access cycle, which would pose difficulties in retaining data in stable condition. Therefore, it is necessary to avoid using, or to frequently refresh those bit lines including any defective cells as being failed so that the data state can be maintained.

Note that since similar current flows into the same defective cell from the reference bit line and the selected bit line, relationship in magnitude of the current between the selected cell and the reference cell will be maintained if there is not a significant difference in wiring resistance between these bit lines with respect to the selected word line. Accordingly, data can successfully be read from the selected cell data. For stable cell data read, it is important to distribute the reference bit lines within the cell array block in a proper manner so that differences in wiring resistance between word lines with respect to the selected bit line are within an acceptable range.

As described above, it is now understood that such access scheme is effective that makes non-selected bit lines and word lines in a floating state. Thus, a series of operations of the floating access scheme will be outlined below.

Figure 32:
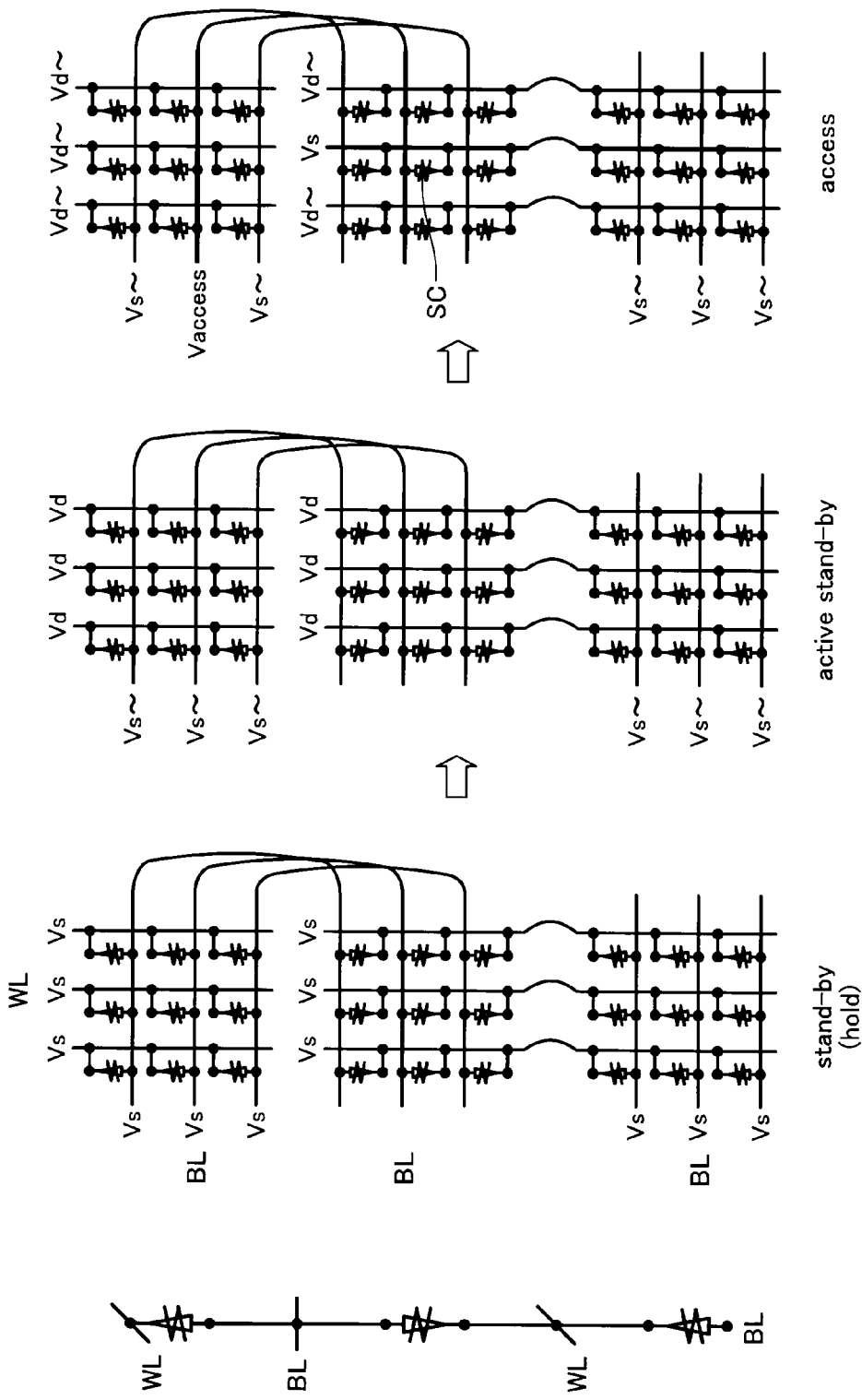
FIG. 32 is a diagram illustrating the floating access scheme (basic one)

FIG. 32 illustrates state transitions of the floating access scheme for three layers of mats each with 3×3 cells that are illustrated in an expansion plan view. Vs~ and Vd~ represent floating levels of initial voltage values Vs, Vd, respectively. At a stand-by state or hold state during which a memory chip is powered on and a cell retains data in a non-volatile manner, all bit lines and word lines are kept connected to the power supply at Vs level.

Then, at an active stand-by state as a preparatory stage for accessing the cell, the bit lines are separated from the power supply level and turned to floating Vs~, while the word lines are connected to another power supply level of Vd.

Now it is assumed that the center cell SC of the middle mat is accessed. In an access mode of the selected cell, the selected word line having the selected cell SC at a cross-point is set to a voltage Vs, and the selected bit line is set to a voltage Vaccess which is a power supply level corresponding to the access mode.

The term "access mode" used herein means a transition to a set state which represents write to a cell, a transition to a reset state or read. During this access state, all remaining bit lines and word lines are set to at a floating state.

Influences of leakage currents due to the defective cells in the seven mats have been described. Hereinafter, it is assumed that a defective cell is provided in each of the eight mats. Influences of these defective cells will be described below. The defective cells with no influences are not shown.

Figure 33:
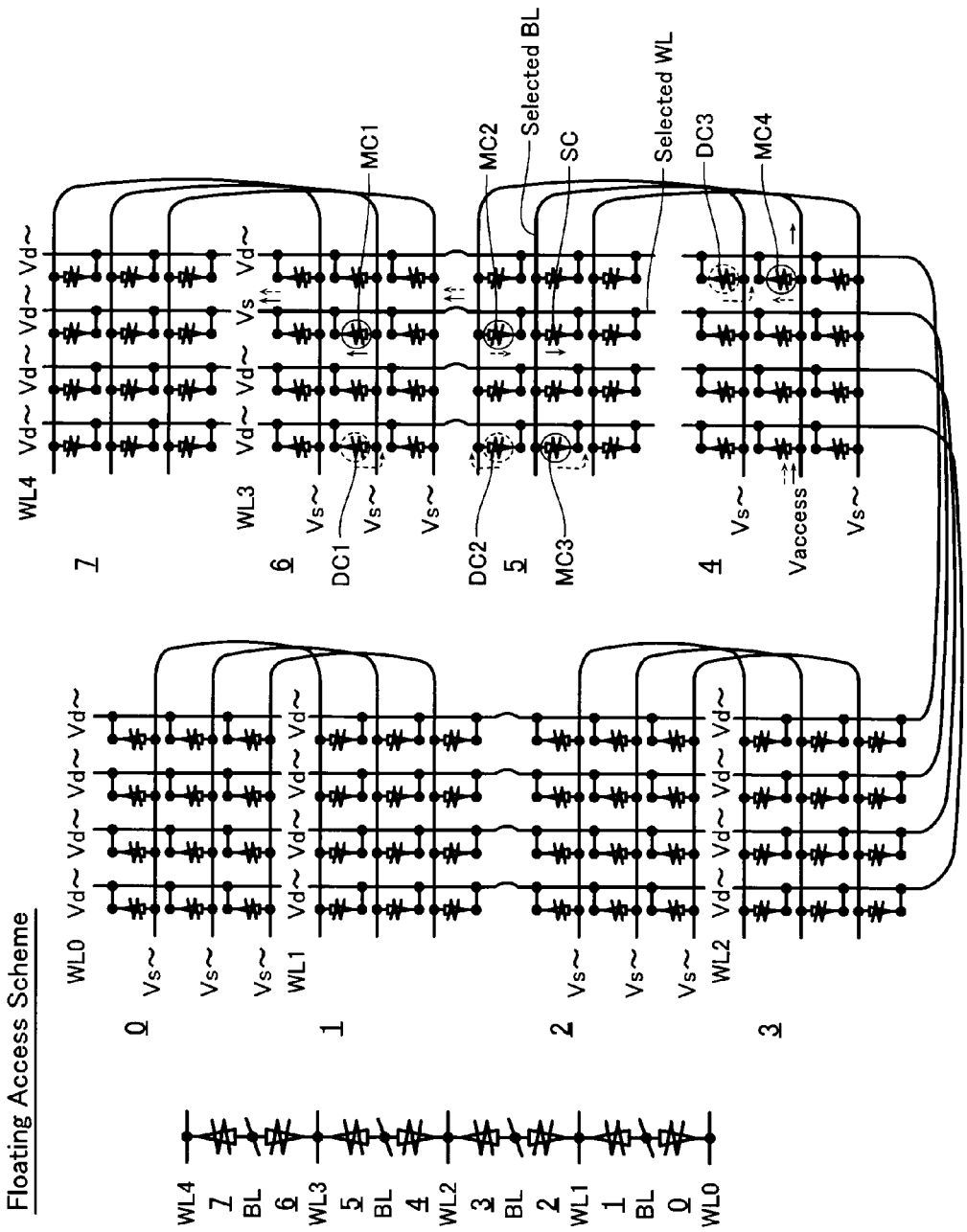
FIG. 33 is a diagram illustrating the effects of cross-fail in the floating access scheme.

FIG. 33 illustrates an access state to eight-layered mats mat0 to mat7 that are illustrated in an expansion plan view. In the mat5, a selected cell SC is selected by the selected word line and the selected bit line. It is apparent from the figure that the paths which flows leakage currents from the selected bit line toward the selected word line are provided by defective cells (e.g., DC1 to DC3) in mat4, mat5 and mat6 that share the selected bit line and the selected word line. Defective cells in the other mats does not cause any leakage current, because they are connected to a floating bit line or a floating word line, and disconnected from the selected word line and the selected bit line.

A cell MC4 in mat4 is disturbed by the defective cell DC3 in the same mat mat4. Cells MC2 and MC3 in the mat5 are disturbed by the defective cell DC2 in the same mat mat5. A cell MC1 in the mat6 is disturbed by the defective cell DC1 in the same mat mat6.

That is, it is understood that cells subject to a large disturbance are located on the bit lines and word lines with defective cells. Accordingly, if cells to be accessed are subject to a large disturbance, it may be recommended to treat these bit lines and word lines as defective ones, and avoid accessing to cross-fail cells. These cells may be replaced by redundancy cells.

In the above analysis, it is assumed that all word lines can be independently controlled among the laminated mats. However, if the word lines from the respective mats need to be independently connected the control circuit on the base substrate at edges of the cell array block (layer by layer), the layout for such the connection requires a large area. In order to reduce this area, it is preferable to divide the layers into several groups and to perform a word line selection common to the mats in respective groups, thereby reducing the number of word-line drivers.

As such, what is discussed below is how influences of the leakage currents flowing in defective cells will change by the groupings of word lines.

Figure 34:
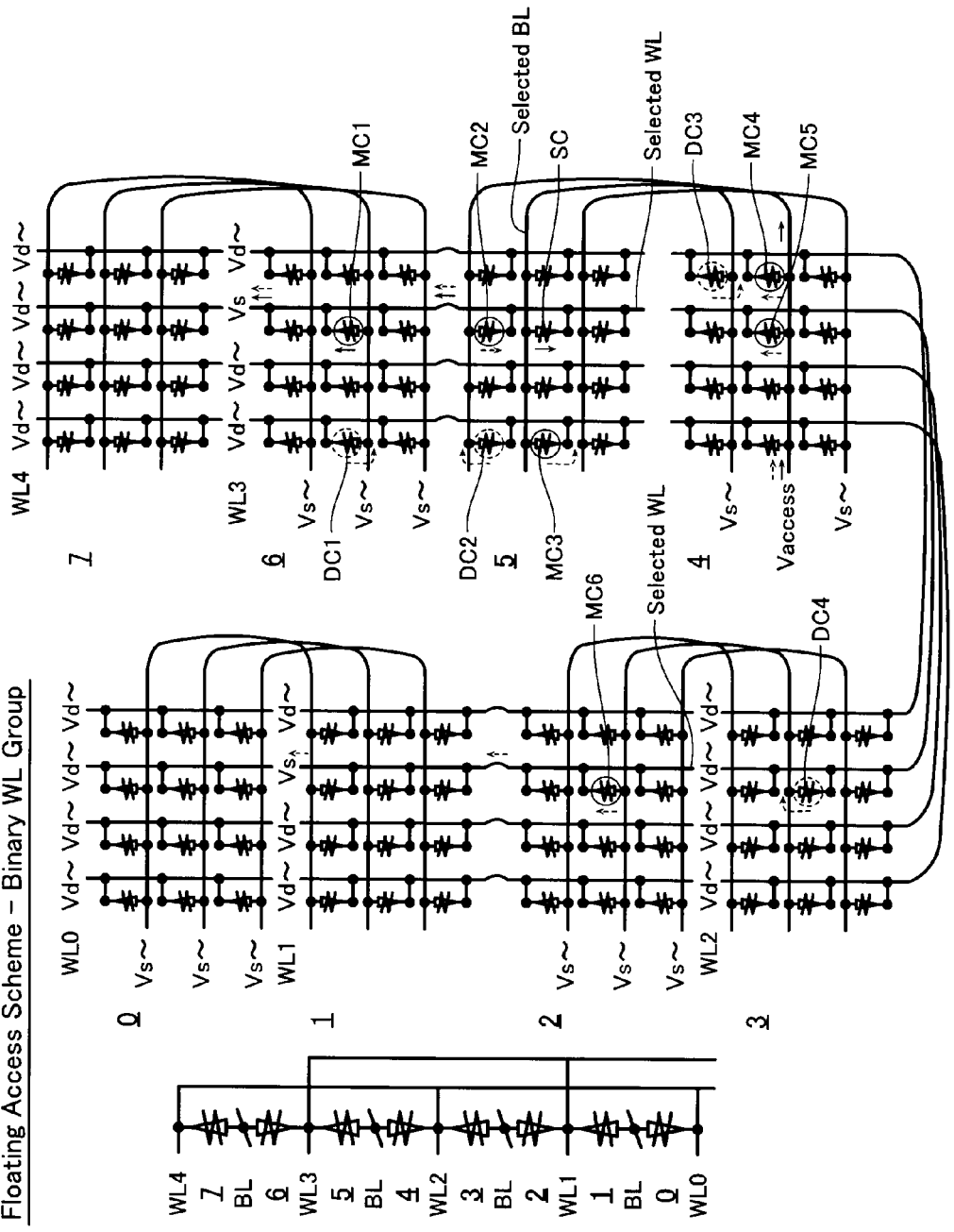
FIG. 34 is a diagram illustrating the effects of cross-fail for the floating access scheme when the binary grouping of word lines is adopted.

FIG. 34 illustrates a case of binary grouping of word lines where word lines are divided into two groups depending on whether the word lines are even-numbered or odd-numbered. There are illustrated paths along which the leakage current of defective cells flows, assuming that one cross-fail cell exists in a mat of each layer in the figure. Note that there are paths that run through three or more forward-biased diodes, but those paths are not taken into consideration herein. This is because leakage currents flowing therein would be small enough to be negligible, due to the forward-bias voltage drop Vf of the diodes.

The number of mats affected by the leakage is larger by two mats, than the previous case where all word lines are independently driven. This is because when one word line is selected between mat5 and mat6, another word line is selected at the same time between mat1 and mat 2. The defective cell leakage corresponding to the two mats (mat1 and mat2) is further added to the corresponding word-line driver.

Given that the defective cells are DC1 to DC4, the cells that are subject to a write disturbance due to the relevant leakage are MC1 to MC6. Again, the fact remains that the disturbed cells are those ones that belong to the word lines and bit lines with cross-fail.

If such increase in leakage effect corresponding to the two mats is acceptable, the binary grouping may be used to reduce the layout area of the word-line driver unit.

Figure 35:
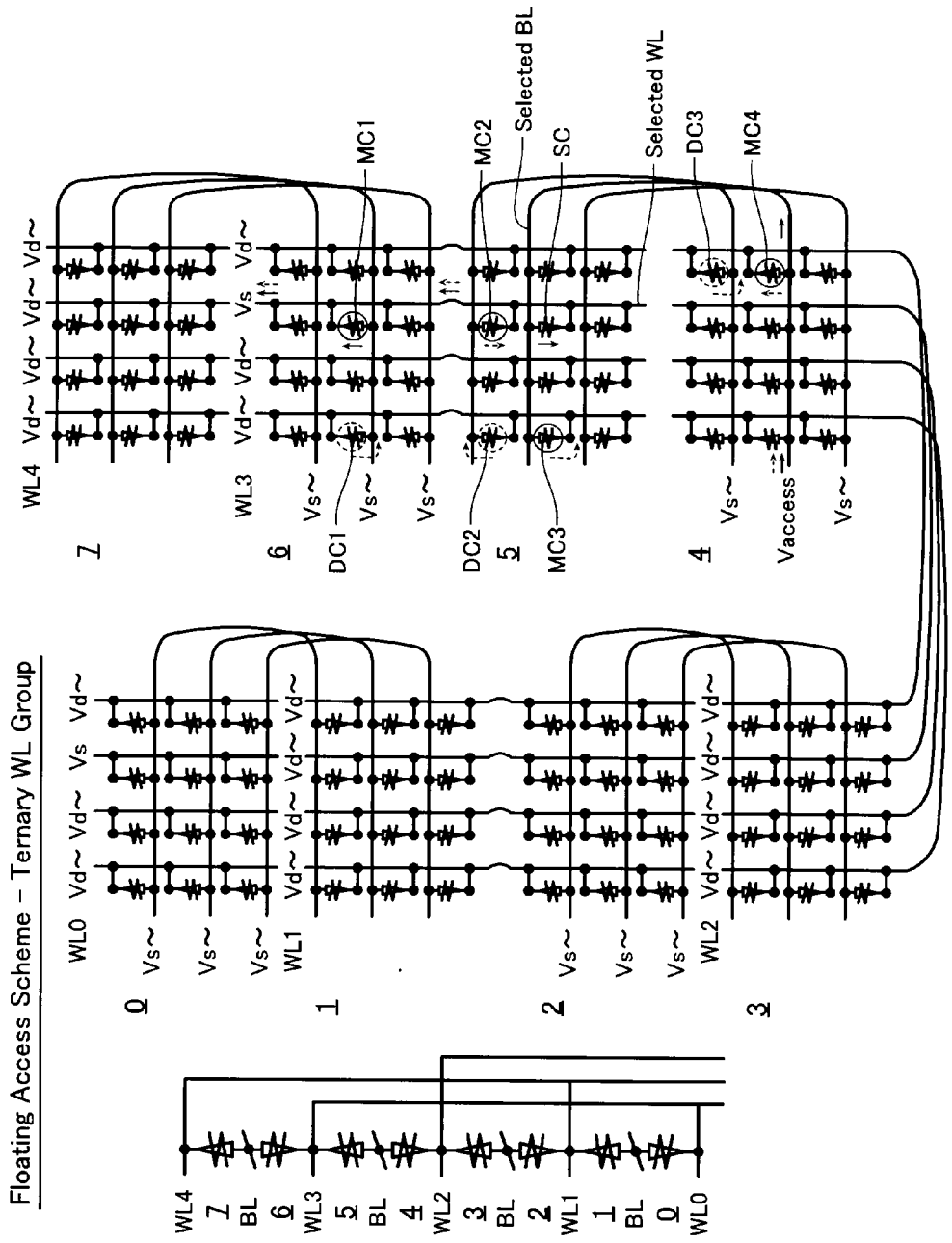
FIG. 35 is a diagram illustrating the effects of cross-fail for the floating access scheme when the ternary grouping of word lines is adopted.

FIG. 35 illustrates a case of ternary grouping of word lines where the word lines are divided into three groups. Similarly, there are illustrated paths along which the leakage current of defective cells flows, assuming that one cross-fail cell exists in a mat of each layer in the figure. Again, paths that run through three or more forward diodes is not taken into consideration, as described in the previous example.

The number of mats affected by the leakage remains unchanged, as compared with the previous case of FIG. 33 where all word lines are independently driven.

Accordingly, as far as the effects of leakage current due to cross-fail are concerned, the word lines need not to be driven separately for each layer, but may be driven in three groups. Therefore, with the 3D cell array block in multi-layer configuration, a significant reduction effect in layout area can be expected.

While it is now found that the ternary grouping of word lines is adequate for accommodating the effects of leakage current due to cross-fail, in the following, consider the effects of the leakage current due to the reverse-biased diodes.

Figure 36:
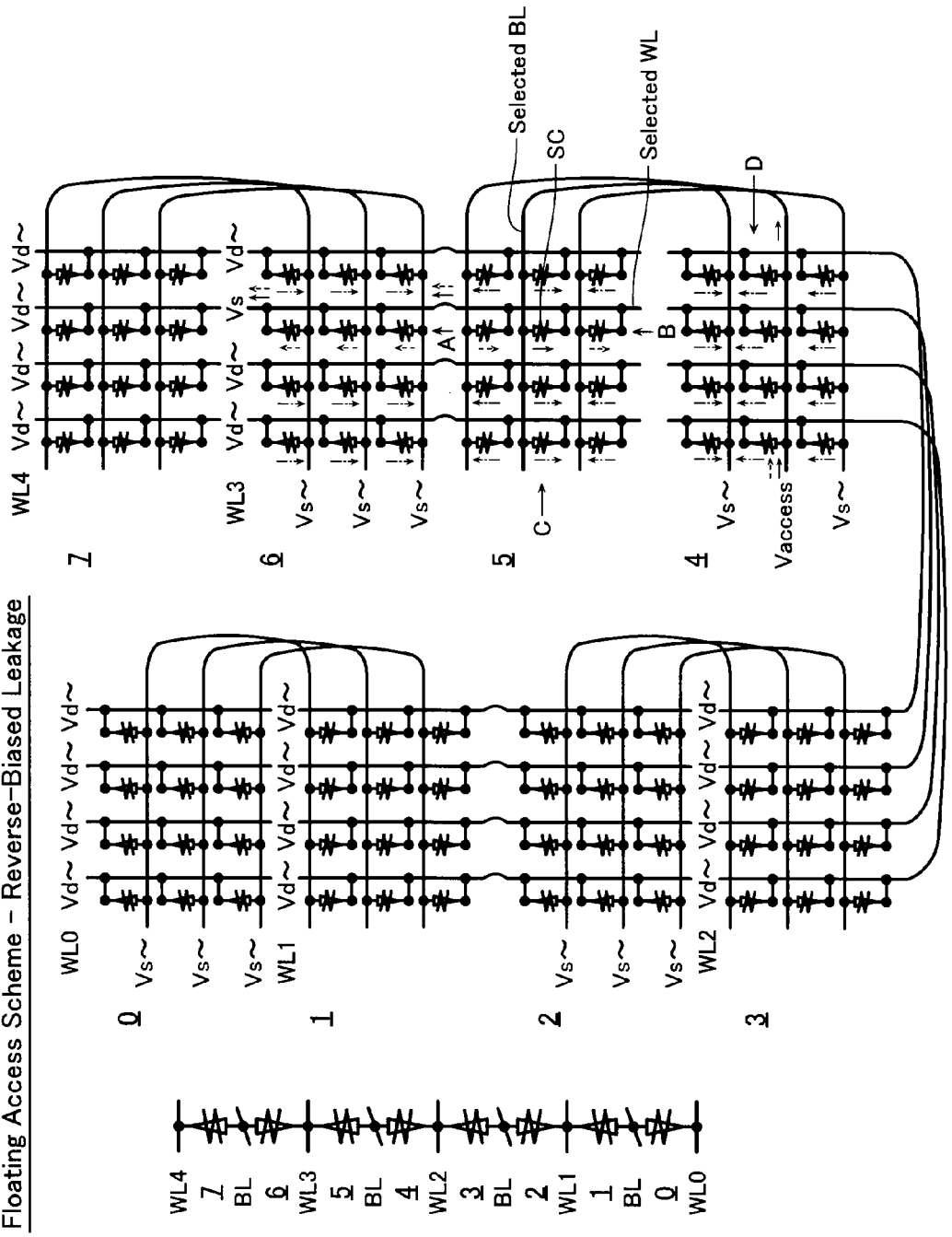
FIG. 36 is a diagram illustrating the effects of reverse-bias leakage in the floating access scheme.

FIG. 36 illustrates, corresponding to FIG. 33, cells to which the leakage current of the reverse-biased diodes contributes from the selected bit line provided with the voltage Vaccess toward the selected word line provided with the voltage Vs, where all word lines are independently driven in respective layers.

When the cell SC located at a cross-point of the selected bit line and the selected word line is selected as a selected cell in mat5, the cell current flows via forward-biased diodes in cell columns C, D on the same selected bit line and cell columns A, B on the same selected word line. The leakage current indicated by the broken line flows through the other cells in mat4 to mat6, via the reverse-biased diodes.

As described in FIG. 26, almost all cells in three mats, including one mat with the selected cell SC and two mats above and below it, contribute to the reverse-biased leakage, which would result in a leakage current from the selected bit line to the selected word line.

Figure 37:
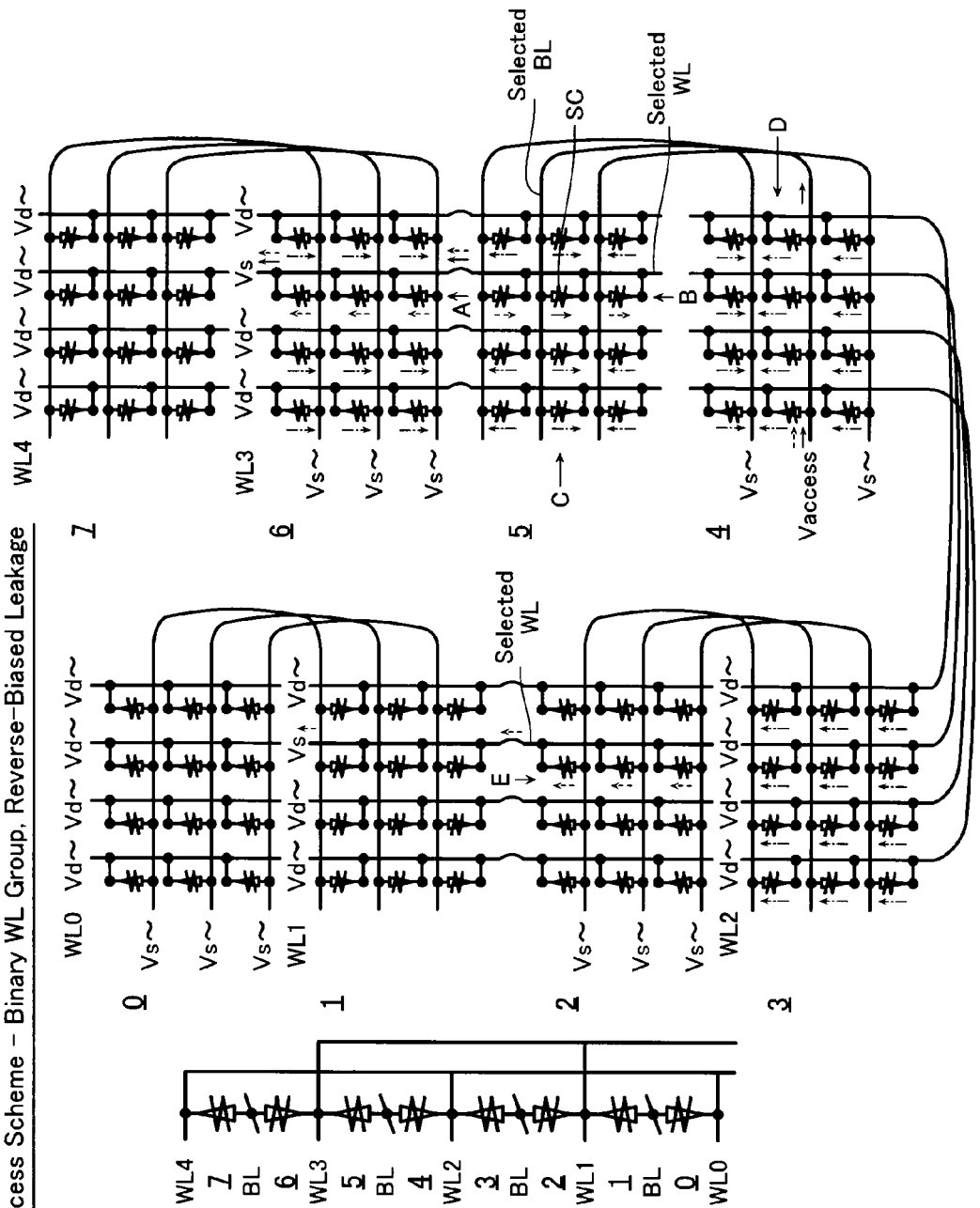
FIG. 37 is a diagram illustrating the effects of reverse-bias leakage for the floating access scheme when the binary grouping of word lines is adopted.

FIG. 37 also illustrates cells through which the leakage current flows due to the reverse-biased diodes, when binary grouping of word lines corresponding to FIG. 34 is employed.

Similar to FIG. 36, when the cell SC is selected as a selected cell in mat5, the cell current flows via forward-biased diodes in cell columns C and D on the same selected bit line and the cell columns A and B on the same selected word line. In addition, the cell current also flows via forward biased diodes in a cell column E in mat2. This results from an increase in the number of selected word lines into which the cell current flows from the selected bit lines. The leakage current indicated by the broken line flows into the other cells in mat4 to 6 and into all cells in mat3, via the reverse-biased diodes.

If such increased leakage current is within an acceptable range, this word line grouping scheme may be used to provide the smallest layout area of the word-line driver.

Figure 38:
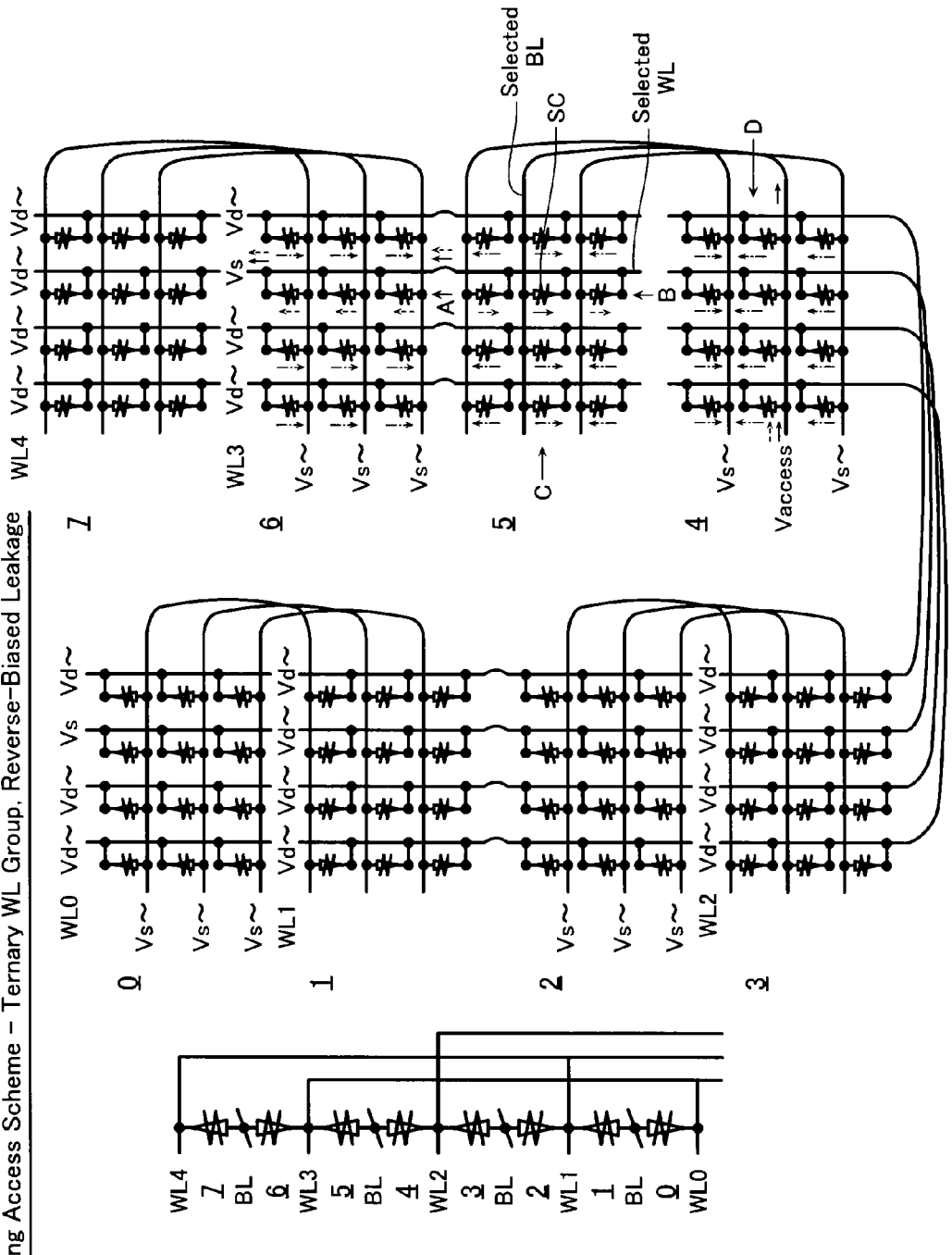
FIG. 38 is a diagram illustrating the effects of reverse-bias leakage for the floating access scheme when the ternary grouping of word lines is adopted.

FIG. 38 also illustrates cells through which the leakage current flows due to the reverse-biased diodes, when ternary grouping of word lines corresponding to FIG. 35 is employed.

The paths of the leakage current illustrated herein are the same as those described with respect to FIG. 36 where the word lines are independently driven in separate layers. Thus, it can be seen that the ternary grouping of word lines is also preferable from the viewpoint of the reverse-biased leakage.

Figure 39:
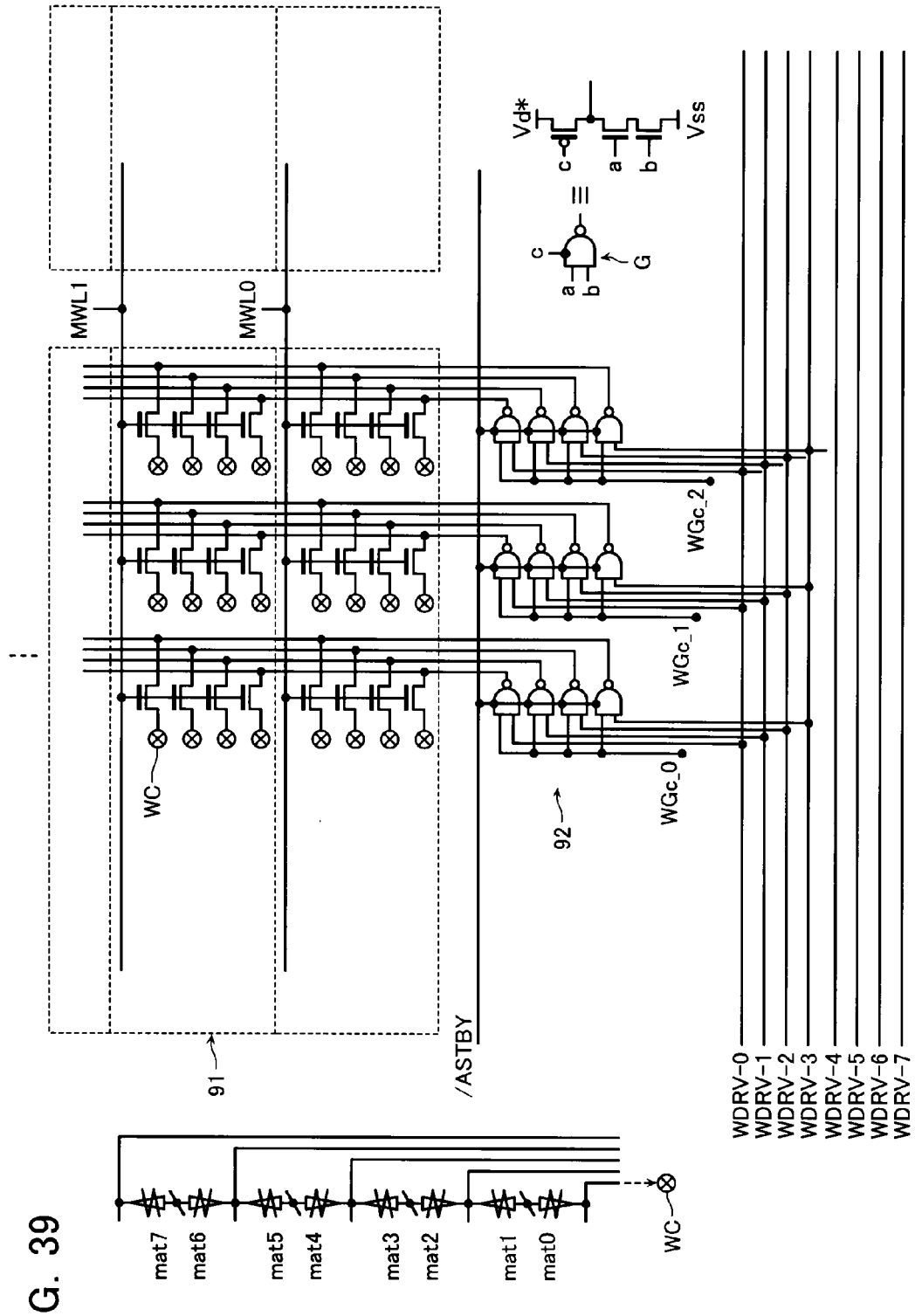
FIG. 39 illustrates another exemplary configuration of the word line decoding unit.

FIG. 39 illustrates a circuit configuration of decode circuits at the word line drive unit when the ternary grouping of word lines is adopted, in correspondence with that illustrated in FIG. 9. In this case, word line group selection signals WGc_0, WGc_1, WGc_2 are used instead of the mat selection signals mat_0 to mat_7.

It should be apparent from comparison with FIG. 9 that there are fewer word line contacts WC and correspondingly smaller area occupied by the word-line driver 91, as compared with the word lines being selected separately in respective layers.

Next, a circuit for generating word line group selection signals will be described below. Let WGc be the number of a word line group that includes the selected word line determined by the mat number to which the selected cell belongs, and the complemental selected word line selected at the same time. Let "i" be the total number of word line groups, and WGc=i−k (k=i, i−1, i−2, . . . , 2, 1). In addition, let "m" be the mat number to which the selected cell belongs.

Figures 40, 41:
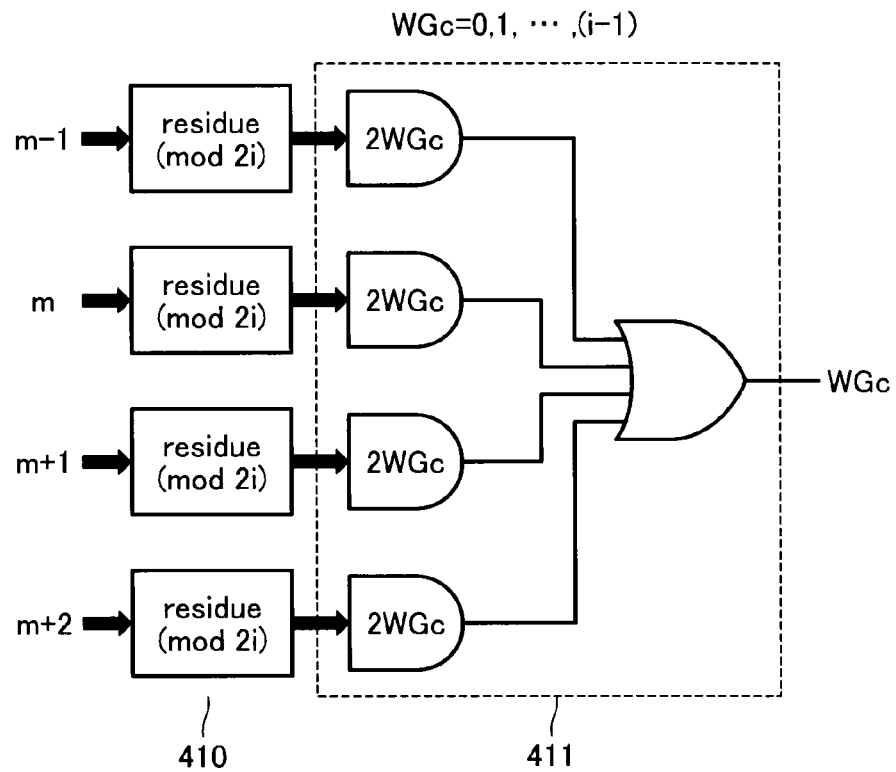
FIG. 40 illustrates a relation between the word line groups and the mat numbers.
FIG. 41 illustrates a word-line-group selection signal generation circuit.

In this case, as illustrated in FIG. 40, the word line group number WGc, which is selected for a given mat number "m", is obtained by calculating "k", for 2WGc≡−2 k≡m−1, m, m+1, m+2 (mod 2i).

FIG. 41 illustrates a general configuration of the circuit for generating word-line-group selection signals by calculating such group numbers. Upon determination of m, then m−1, m+1, and m+2 are calculated. The results are input to a residue circuit (residue (mod 2i)) 410 for obtaining a reduced residue modulo 2i, which in turn gives respective residues.

Then, the residues are input to a decoder circuit 411 corresponding to the word line group number WGc. In addition, the residues are searched for that matches the binary representation of 2WGc from AND of the respective bits of the residues represented in binary. If any match is found, then WGc is selected as a signal. In this match search, it is necessary to provide the decode circuits 411 as many as i, i.e., 0 to i−1.

Now we consider a specific circuit when ternary grouping of word lines where i=3 is employed. As illustrated in FIG. 42, it is assumed that the total number of mats is 32, and the mat numbers "m" are represented in binary by 5 bits of A10 to A14. The relation between the selection signals WGc 0, 1, 2 and the mat numbers "m" and mod 6 is as illustrated in FIG. 43.

Figure 44:
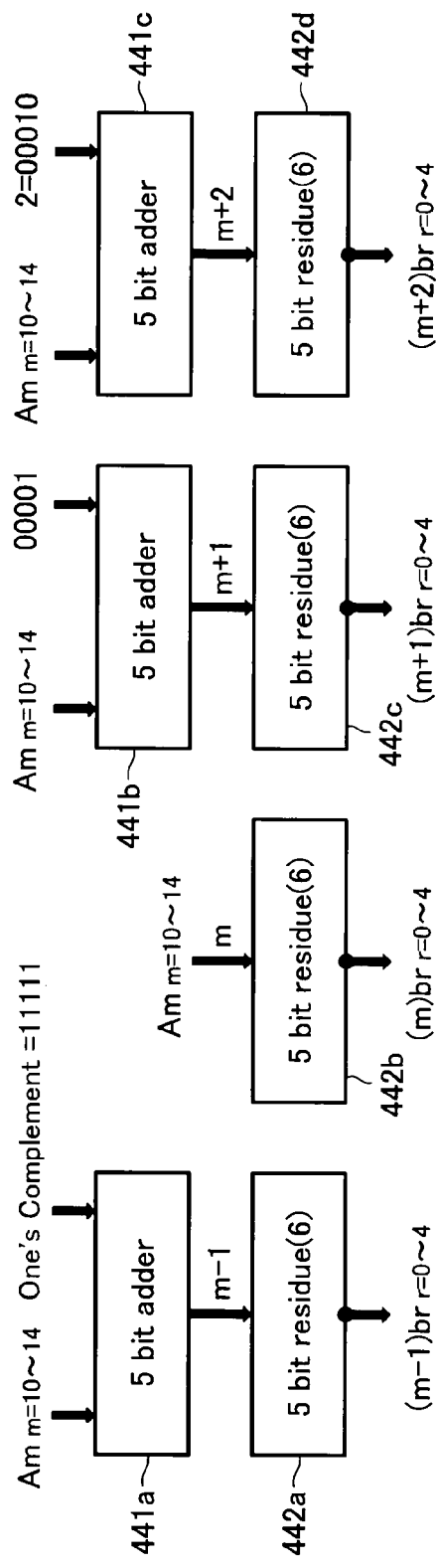
FIG. 44 illustrates a mat number calculation circuit.

FIG. 44 illustrates a mat number calculation circuit 440 that calculates m−1, m, m+1, m+2 mod 6 from the address bits representing "m".

That is, the address bits of "m" and the 5-bit one's complement, 11111, are input to a 5-bit adder 441a to obtain the addition result, m−1. The result is then input to a 5-bit residue circuit 442a for obtaining a residue mod 6, thereby obtaining the binary representation of the residue, (m−1)br (r=0 to 4).

In addition, the 5 address bits of "m" are input to a residue circuit 442b for obtaining a residue mod 6 to obtain the binary representation of the residue, (m)br (r=0 to 4).

Moreover, the address bits of "m" and the 5-bit representation of 1, i.e., 00001, are input to a 5-bit adder 441b to obtain the addition result, m+1. The result is then input to a 5-bit residue circuit 442c for obtaining a residue mod 6, thereby obtaining the binary representation of the residue, (m+1)br (r=0 to 4).

Furthermore, the address bits of "m" and the 5-bit representation of 2, i.e., 00010, are input to a 5-bit adder 441c to obtain the addition result, m+2. The result is then input to a 5-bit residue circuit 442d for obtaining a residue mod 6, thereby obtaining the binary representation of the residue, (m+2)br (r=0 to 4).

Figure 45:
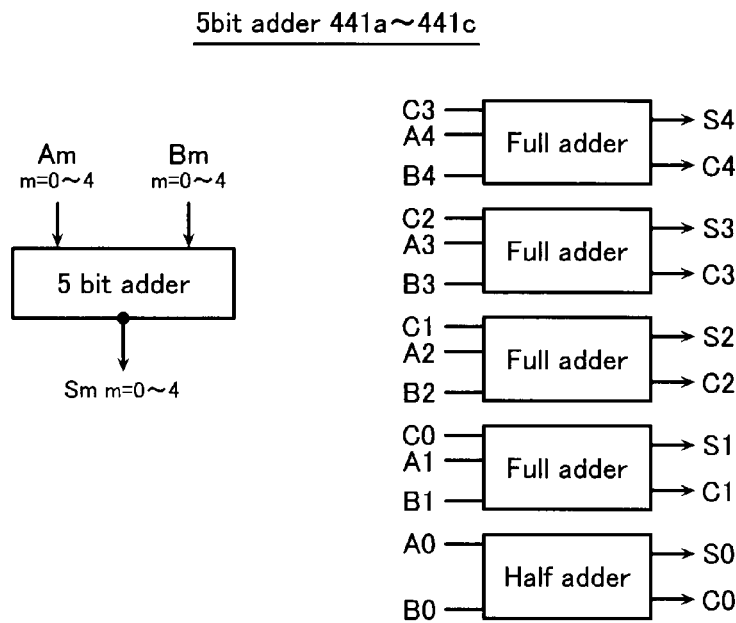
FIG. 45 illustrates circuit symbols and circuit configuration of a 5-bit adder circuit.

FIG. 45 illustrates the circuit symbols and specific circuitry of the 5 bit adders 441a to 441c used in the above-mentioned circuit block. That is, the sum of binary digits of numbers A and B is given by full adders and a half adder. This circuitry is configured to reduce the timing control load on the system in such a way that outputs are determined upon determination of the inputs without the need for synchronization of clocks or the like.

Figure 46:
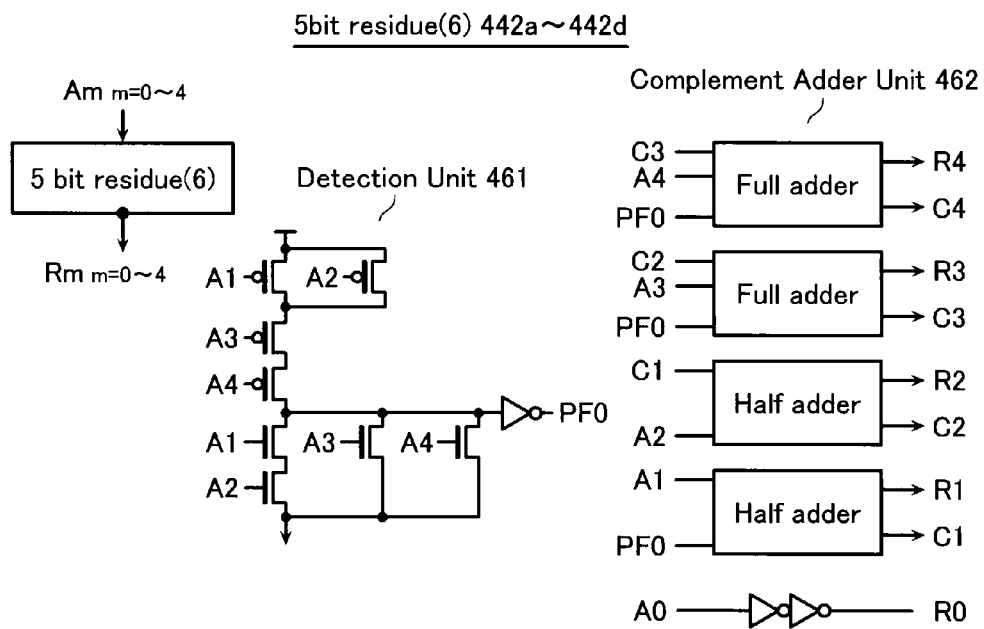
FIG. 46 illustrates circuit symbols and circuit configuration of a 5-bit residue circuit.

FIG. 46 illustrates the circuit symbols and specific circuitry of the residue circuits 442a to 442d for obtaining a 5-bit residue mod 6. This circuit includes a detection unit 461 for detecting that a number A represented in binary becomes equal to or greater than 6, and an adder unit 462 for adding the 6's complement for the 5 bits, 26 (=32−6), i.e., 11010 in binary notation, to the detected result. This circuit is also configured to reduce the timing control load on the system in such a way that outputs are determined upon determination of the inputs without the need for synchronization of clocks or the like.

Figure 47:
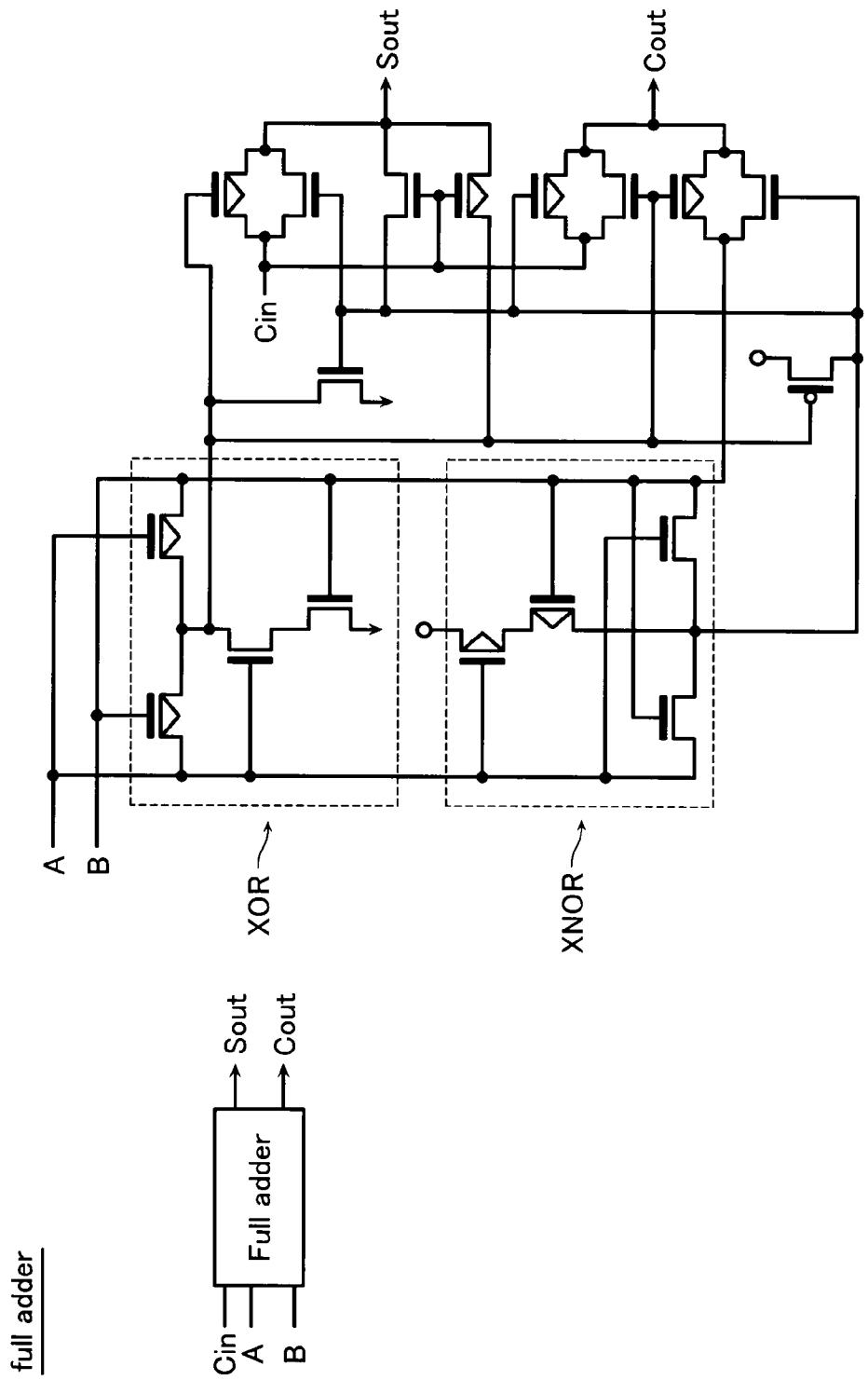
FIG. 47 illustrates circuit symbols and circuit configuration of a full adder.
Figure 48:
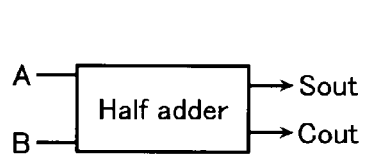
FIG. 48 illustrates circuit symbols and circuit configuration a half adder.
Figure 48:
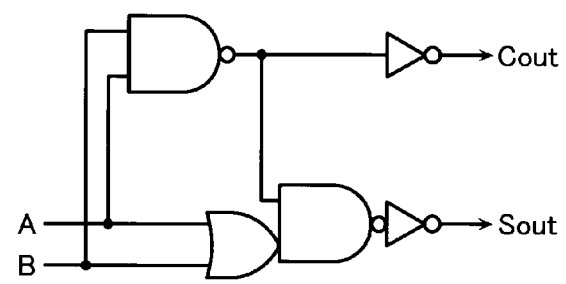

FIGS. 47 and 48 each illustrate a full adder and a half adder, each of which is a basic unit for performing the addition of binary numbers. The full adder performs logic operations on bits A and B to be added at XOR and XNOR circuits, and further on a carry signal Cin to output the sum Sout of A and B and Cin, as well as a carry signal Cout as output. The half adder may include general logic gates.

These units may be combined to configure an adder necessary for calculation.

Figure 49:
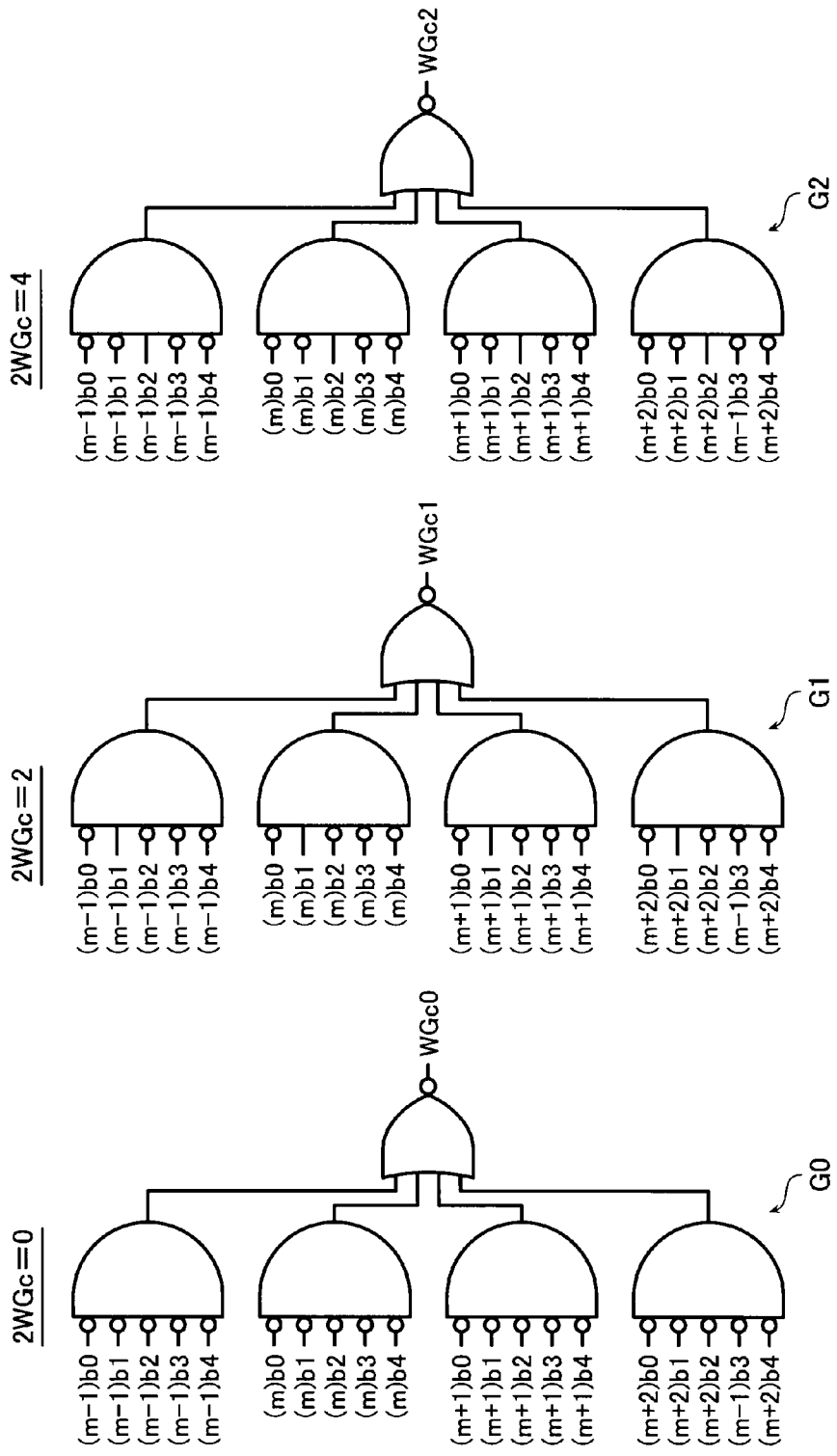
FIG. 49 illustrates a group selection signal decode circuit.

FIG. 49 illustrates a group selection signal decode circuit 490 for generating a selection signal WGc to eventually select a word line group from the selected mat number, when i=3 (ternary). This is a circuit for searching (m−1) br (r=0 to 4), (m)br (r=0 to 4), (m+1) br (r=0 to 4), and (m+2)br (r=0 to 4) that are calculated from m as the residues mod 6, for any of the residues that matches either 0, 2, or 4 regarding 2WGc, respectively.

That is, the match search is performed at a group of AND circuits G0 to G2 for detecting the matched/unmatched status of respective residue bits, and it is based on the logic wherein the signal WGc rises if any of the four residues matches. The search of 2WGc=0 results in a signal WG_0, the search of 2WGc=2 results in a signal WGc_1, and the search of 2WGc=4 results in a signal WGc_2.

It can be seen from the above, with the sense scheme where a reference bit line RBL is provided and the currents of a cell in a set state (reference cell) and a selected cell of the reference bit line are compared, the leakage current may be accommodated with the non-selected word lines and bit lines in floating and with the word lines selected in groups. In the following, consider the arrangement of reference bit lines RBL and a setting method thereof.

Since a cell of the reference bit line and a cell of the selected bit line are selected at a common word line, the cell position is the same on the bit line, compensating IR drop of the bit line. The two cells, the reference cell and the selected cell, are spaced farther apart from each other on the word line as the distance between the reference bit line and the selected bit line increases. Thus, one candidate method is considered to gather the reference bit lines at the center of a mat having the minimum average distances from all bit lines on the mat. That is, as illustrated in FIG. 50, the center portion of a mat in the word line direction becomes the reference bit line RBL area.

Of course, other methods are also used to arrange several reference bit lines RBL on the mat in a distributed manner. This, however, complicates decoding.

Figure 50:
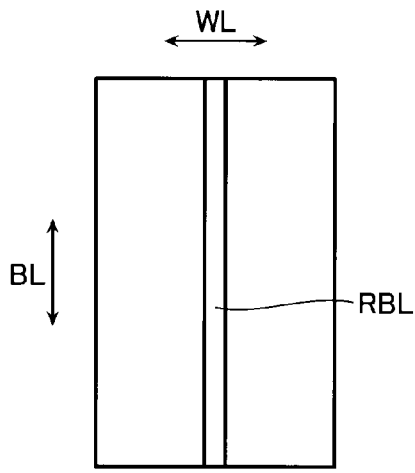
FIG. 50 illustrates an example arrangement of reference bit lines on a mat.

As illustrated in FIG. 50, when the reference bit lines are positioned at the center of the mat, it is preferable to provide spare reference bit lines as well, taking into account any potential defective cells involved in the reference bit lines due to cross-fail or the like. Those cells (reference cells) at the reference bit line area need to remain in a set state, including the spare reference bit lines.

A cell needs to experience a forming operation before being used. An operation of setting the reference cells to a set state is conducted through this forming operation. That is, all cells including the reference cells are once set to a set state, and the set state is maintained at reference bit line RBL area. For example, such a refresh operation is used to maintain the set state where a set state is rewritten to the reference cell of a reference bit line each time a selected word line rises due to the write operation of the selected cell.

As described above, in a lump-forming operation of bit lines, a voltage Vd which is necessary for the cells along the bit lines to transition to a set state is applied to set respective cells. In this case, a time period of transition to a set state varies among these cells. Accordingly, potential drop may occur in the bit lines due to the cells that have shifted to a set state of low resistance earlier, and this prevents the remaining cells from transitioning to a set state.

As a countermeasure against this, such a method is effective that the a voltage of at selection gate of the selected word line in each cell is lowered, thereby preventing the potential level of a bit line from being greatly affected by cells that are already set to a set state. This method will now be described below.

Figure 51:
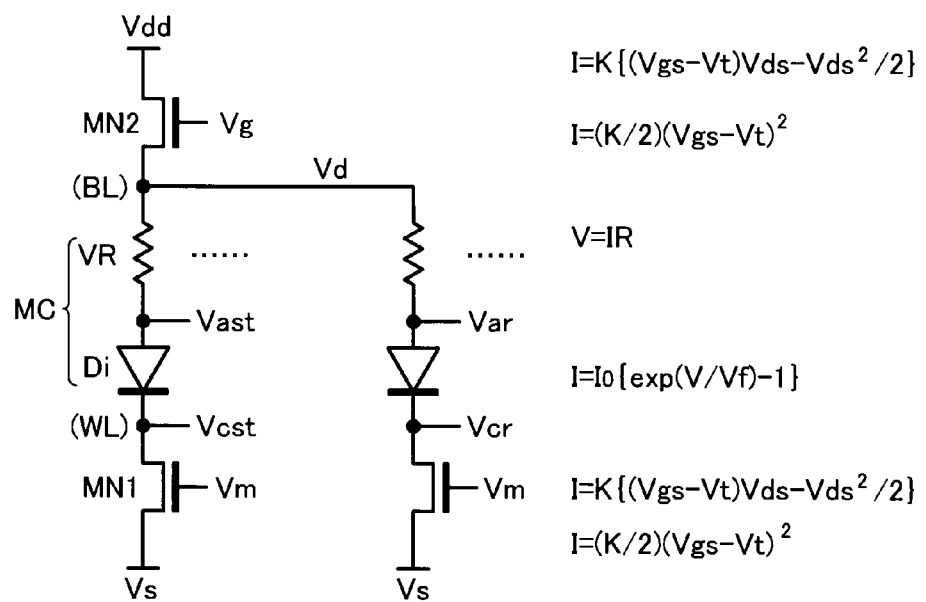
FIG. 51 is a diagram illustrating operational conditions of a lump forming operation for each bit line.

FIG. 51 illustrates a configuration of a system that includes a bit line and cells hung therefrom, for explaining a lump forming operation. That is, a variable resistance element VR and a diode Di are connected to the bit line to which a power supply Vdd is provided via a bit-line-side switch NMOS transistor MN2. The word line WL connected to the cathode of the diode Di is set to a power supply Vs via a word-line-side switch NMOS transistor MN1. The NMOS transistors MN1 and MN2 are illustrated in correspondence with those illustrated in FIG. 21.

Figure 52:
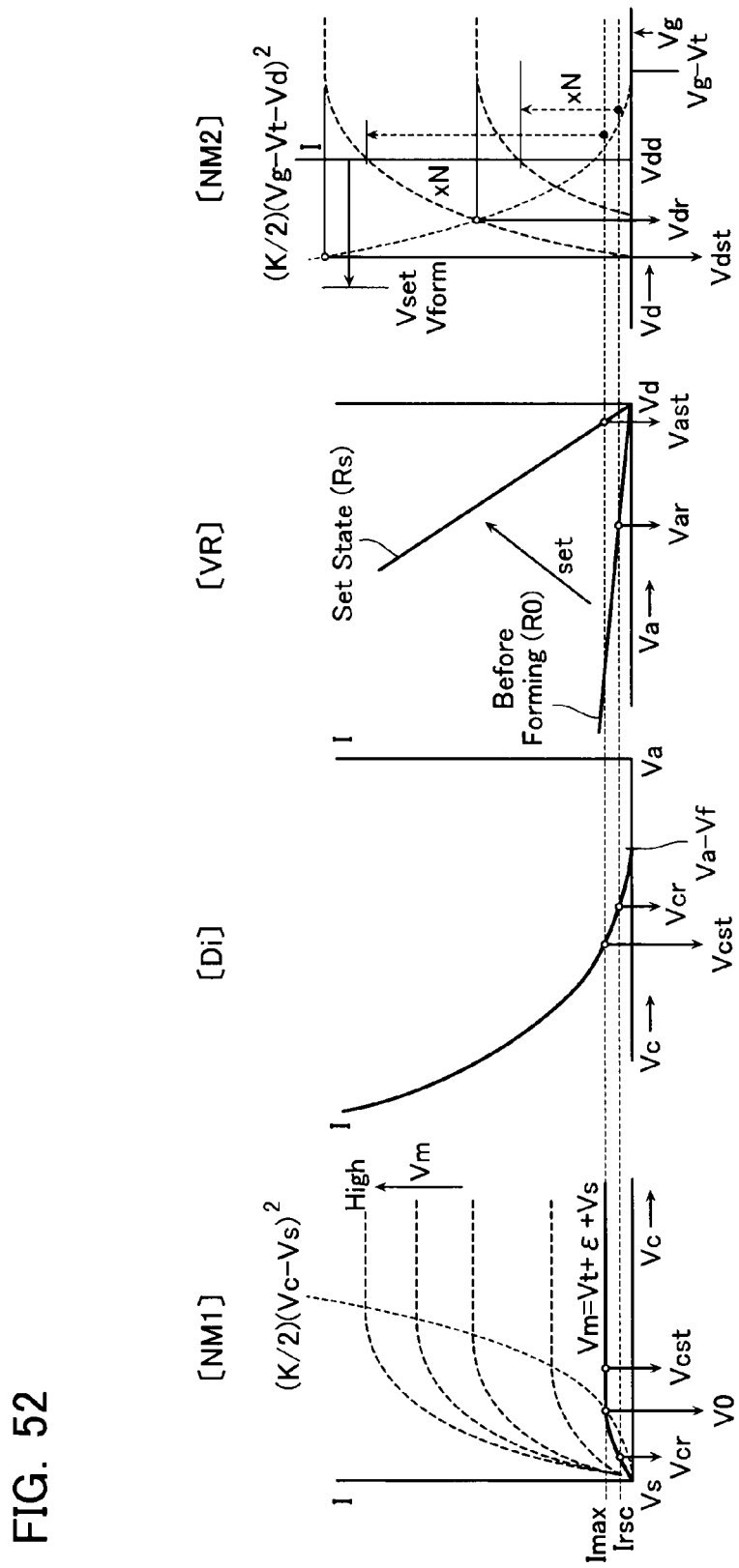
FIG. 52 illustrates the characteristics of each element for explaining the operational conditions thereof.

FIG. 52 illustrates a relation between the currents flowing through the components and the levels of the nodes, assuming that the gate voltages of the NMOS transistors MN1, MN2 are Vm and Vg, respectively, the level of the bit line BL is Vd (Vdst or Vdr), and the level of the word line WL is Vc (Vcst or Vcr).

To figure out the conditions under which a lump-forming operation may be completed, the characteristics of the word line switch devices is investigated below. The analysis begins with that of the word line switch device MN1. Each cell that belongs to the selected bit line is provided with the power supply Vs, by the NMOS transistor MN1, at a node corresponding to a word line WL (the potential Vc, and specifically, Vcst or Vcr).

In general, current-voltage characteristics of the NMOS transistors MN1 and MN2 is represented as $I=K\{(Vgs-Vt)Vds-Vds^2/2\}$ at the linear region (triode region) and as $I=(K/2)(Vgs-Vt)^2$ at the current-saturated region (pentode region). A variable resistance element VR has a characteristic of $V=IR$, and a diode Di of $I=I0\{\exp(V/Vf)-1\}$.

First of all, characteristics of the transistor MN1 will be described below with reference to FIG. 52. Given that Vm is a gate voltage of the transistor MN1, and Vt is a threshold voltage of the transistor MN1, the current characteristics of the transistor MN1 at the linear region under the condition of $Vm-Vt \geq Vc$, is represented as:

$$I=K\{(Vm-Vs-Vt)(Vc-Vs)-(Vc-Vs)^2/2\}.$$

Here, dependency of the transistor currents upon the voltage Vc relative to the voltage Vs is illustrated, with various levels of the gate voltages Vm as parameters.

The characteristics of the transistor MN1 serves to prevent a large current from flowing through a cell which shifted to a low resistance state after the forming operation is completed.

That is, the gate voltage Vm of the transistor MN1 is set at $Vm=Vt+s+Vs$. In this way, the transistor MN1 turns to a state where a maximum current, $Imax=(K/2)\epsilon^2$, can flow therethrough.

This current flows through a cell in a set state with a low resistance, where the word line potential Vcst is located at a position as illustrated in the figure. On the other hand, a cell at high resistance before forming, or in a reset state, has a current limited by the cell resistance and a drain voltage indicated by Vcr, and a current Irsc flows therethrough. This current commonly flows through devices connected in series between the bit line BL and the word line WL.

Since the current Irsc is represented as $Irsc=K\{\epsilon(Vcr-Vs)-(Vcr-Vs)^2/2\}$ according to the transistor characteristics at the linear region, the word line potential is then represented as $Vcr=\epsilon+Vs-\sqrt{(\epsilon^2-2Irsc/K)}$. Where "sqrt" represents square root.

Next, regarding a diode Di included in a cell, a voltage-current characteristic is illustrated in the graph, with a lateral axis expressing the voltage Vc. The voltage is represented as being relative to the potential Va (Vast or Var) of the anode-side node. The current-voltage characteristic is given by $I=I0[\exp\{(Va-Vc)/Vf\}-1]$, where $Va-Vc \geq Vf$. There are illustrated the voltage Vcst and Vcr that flow the current Imax and Irsc, respectively.

What is illustrated to the right of the diode characteristics is the voltage-current characteristics of the variable resistance element VR, relative to Vd. The characteristics are represented by the formula: $I=(Vd-Va)/R$. Let Rs be a resistance value in a set state and R0 be a resistance value before forming. As illustrated in FIG. 52, a voltage level Vast of the voltage Va when the current Imax flows, and a voltage level Var of the voltage Va when Irsc flows are determined. The levels Vast and Var are illustrated in FIG. 52, respectively.

The NMOS transistor MN2 acts as a write buffer common to all cells along the bit line. It is provided with a high gate potential at its gate, and caused to function at a linear region where it has a sufficiently low resistance. The current characteristic in this case is given as follows under the condition of $Vg-Vt \geq Vdd$:

$$I=K\{(Vg-Vd-Vt)(Vdd-Vd)-(Vdd-Vd)^2/2\}.$$

When a voltage difference $Vg-Vt$ is at a level sufficiently larger than Vdd, the source-drain saturation current in the transistor MN2 is expressed as $Isat=(K/2)(Vg-Vt-Vd)^2$. The voltage Vg is represented as being relative to Vd. If the number of cells hung from the bit line is N, then $N \times Imax$ flows when all cells are in a set state.

This current flows in the transistor MN2, in accordance with the source-drain current characteristic of thereof when the voltage Vdd is applied to its drain, when the voltage Vd is at a level of Vdst. The saturation current of the transistor MN2 is expressed as:

$$(K/2)(Vg-Vt-Vdst)^2.$$

Besides, the current characteristic at the linear region is expressed as:

$$N \times Imax=K\{(Vg-Vdst-Vt)(Vdd-Vdst)-(Vdd-Vdst)^2/2\}.$$

Accordingly, the voltage Vdst is expressed as:

$$Vdst=Vg-Vt-\sqrt{(Vg-Vt-Vdd)^2+2N \times Imax/K}.$$

On the other hand, if the number of cells hung from the bit line is N, and when all cells are in a reset state before forming, then the current flowing therethrough is $N \times Irsc$. This current flows in the transistor MN2, in accordance with the source-drain current characteristic of thereof when the voltage Vdd is applied to its drain, when the voltage Vd is at a level of Vdr.

The saturation current is expressed as $(K/2)(Vg-Vt-Vdr)^2$, and the current characteristic at the linear region is expressed as:

$$N \times Irsc=K\{(Vg-Vdr-Vt)(Vdd-Vdr)-(Vdd-Vdr)^2/2\}$$

Accordingly, the voltage Vdr is expressed as:

$$Vdr=Vg-Vt-\sqrt{(Vg-Vt-Vdd)^2+2N \times Irsc/K}.$$

When a cell current satisfies a condition of $Irsc<Imax=(K/2)\epsilon^2<Ireset$, all cells that are hung from one bit line may be subject to a lump-forming operation at a time, or may be transitioned to a set state at a time. Note that the current Irsc is a value of a current that flows through the cell in a reset state or before the forming operation at the maximum forming voltage. The current Ireset is the minimum current for causing the cell to transition from a set state to a reset state.

Potential levels of a word line WL and a bit line BL is restricted by $Vcr+Vform<Vdst$, where Vform denotes the minimum voltage applied to a cell necessary for a forming operation. That is, under this condition, a voltage of the bit line is kept at a value of Vd even after all of the cells shifts to a set state, thereby a sufficient forming voltage being applied to the cells, and in addition, the cells that have shifted to a set state will not be provided with such a current Ireset that causes them to return to a reset state.

This condition can be achieved by setting the gate level Vg of the bit line switch NMOS transistor MN2 and the gate level Vm of the word line switch NMOS transistor MN1 to be higher than the power-supply voltage Vdd that is supplied to the bit lines, and slightly higher than the threshold voltage Vt of the transistors by $\epsilon$, respectively.

Figure 53:
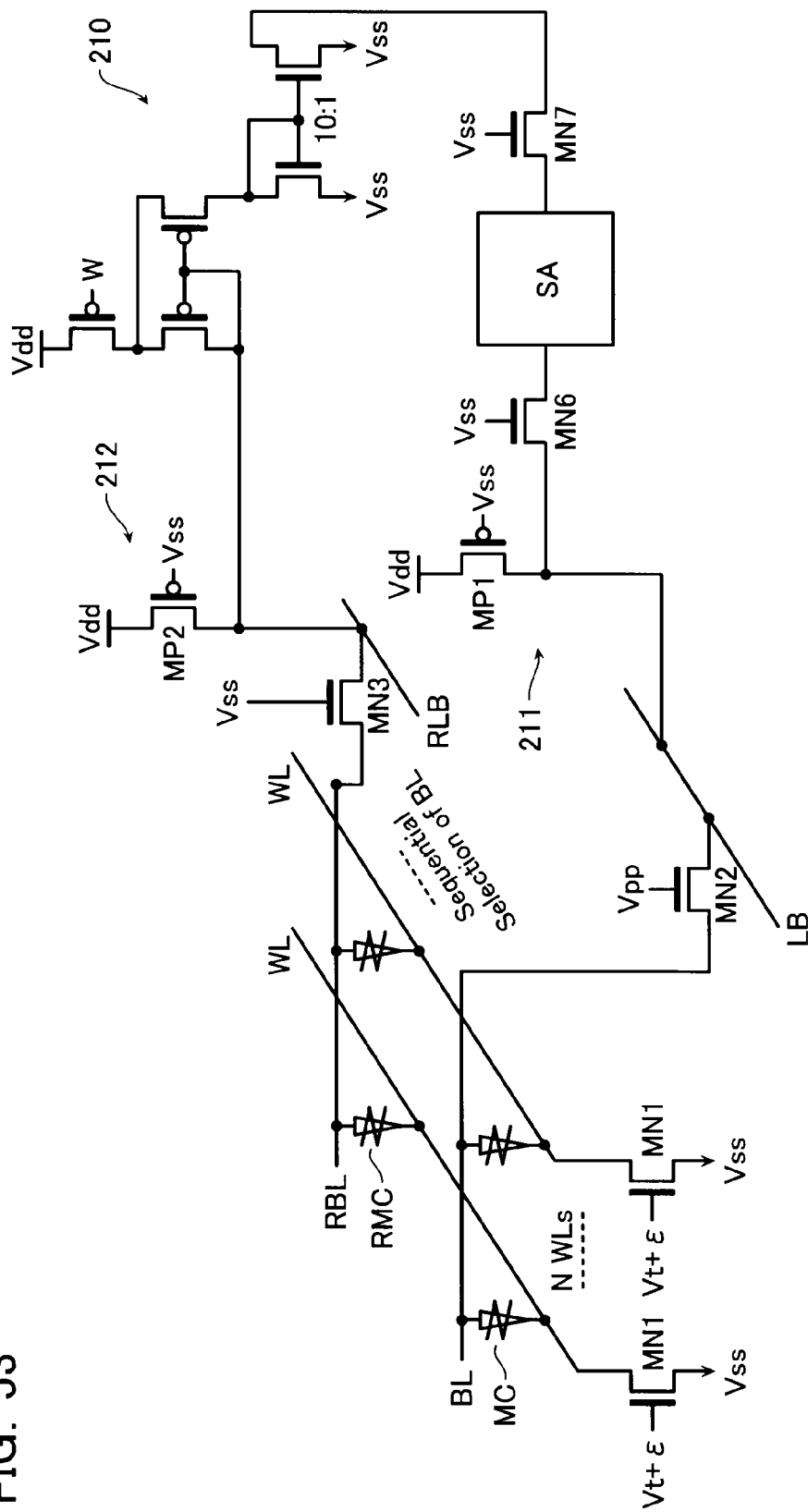
FIG. 53 illustrates gate voltages of word-line and bit-line selection switches in lump forming for each bit line.

FIG. 53 illustrates the gate voltages of the above-mentioned word line and bit line switch transistors MN1 and MN2 in a circuit for a lump-forming operation per bit line, similar to those illustrated in FIG. 21.

While all the bit lines, including the reference bit lines RBL, are sequentially selected for a forming operation, each bit line BL has a NMOS transistor MN2 as a bit line switch for selective connection to the corresponding local bus LB. While the local bus LB is connected to the sense amplifier, the path to the sense amplifier SA is cut off by turning off a read switch MN6 off. In addition, the local bus LB is connected to the power supply Vdd which provides a power supply.

As previously described with reference to FIG. 52, a potential Vpp that is sufficiently higher than Vdd+Vt is applied to the selection gate of the bit line switch. In addition, at the same time a voltage Vt+$\epsilon$ is applied to the gates of the word line switches MN1 for all of the word lines WL in the cell for a forming operation.

By selecting the bit lines in a mat for a lump-forming operation or lump-setting operation in this way, a lump-forming operation or a lump setting operation is performed.

Note that since a word line WL cannot be shared, only one option to be chosen is to select bit lines BL at the same time between mats that do not share any word line when performing a lump-forming operation, and hence the range of a lump setting operation may be extended by setting the gate voltages of the word line switches for cells to be set at Vt+$\epsilon$.

It is needless to say that the method of setting the gate voltages of the word line switches at Vt+$\epsilon$ may also be used for writing for setting to a set state to respective cells. In that case, the bit line switch and the word line switch to which the selected cell belong only need to be decoded according to the address information of the cell.

At the time of a lump-forming operation or a lump-setting operation, it is impossible to set the value of $\epsilon$ mentioned above in an appropriate manner. A method of generating $\epsilon$ will now be described below.

The gate voltage of the word line switch NMOS transistor in a lump-forming operation needs to be set at an appropriate range, so that the word line switch NMOS ransistor is deemed as well-conductive to set the word line at a voltage Vss, while the word line switch NMOS ransistor is deemed as having a very high resistance when the current flowing therethrough has been increased. For this purpose, the transistor with a gate voltage of about 1 μA current is used. Since the maximum current flowing through a cell in a high resistance state is about 10 nA, the current mirror circuit needs to be configured to suit the dimension of the word line switch.

Figure 54:
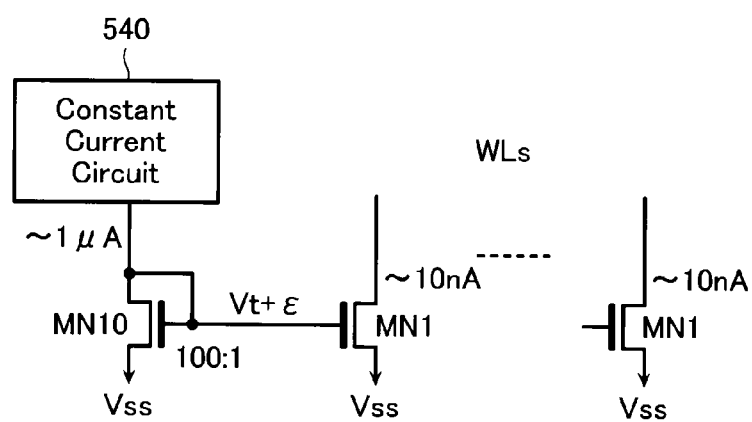
FIG. 54 illustrates a gate level generation circuit of the word-line selection switch transistor.

That is, as illustrated in FIG. 54, a NMOS transistor MN10 is prepared that has a channel width W which is about a hundred times larger than that of the word line switch NMOS transistor MN1. In addition, the gate and drain of the transistor MN10 are connected to each other, and a current of 1 μA is supplied to the NMOS transistor MN1 from a constant current circuit 540, thereby setting the gate voltage thereof at Vt+$\epsilon$. When this voltage is supplied to the gates of the respective word line switch NMOS transistors MN1, the maximum current is about 10 nA that can be provided by the word line switches. As a result, when the cell transitions to a low resistance state to cause large current flow, the word line switch NMOS transistor MN1 acts as a high resistance device.

As described above with reference to FIGS. 51 and 52, the gates of the word line switch NMOS transistor MN1 and the bit line switch NMOS transistor MN2 may be controlled to prevent the transition to a set state in a lump-forming operation from entering the reverse mode due to variations between cells. On the other hand, the circuit system of FIG. 51 may also be used, without modification thereto, in writing at a reset state to the cell.

In a writing operation to a reset state, it is important that a large current Ireset can be provided to the cell, and a high set voltage Vset will not be applied to the cell if it enters a high resistance state. This condition is met by setting the gate voltage Vg of the bit line switch NMOS transistor MN2 and the gate voltage Vm of the word line switch NMOS transistor MN1.

Figure 55:
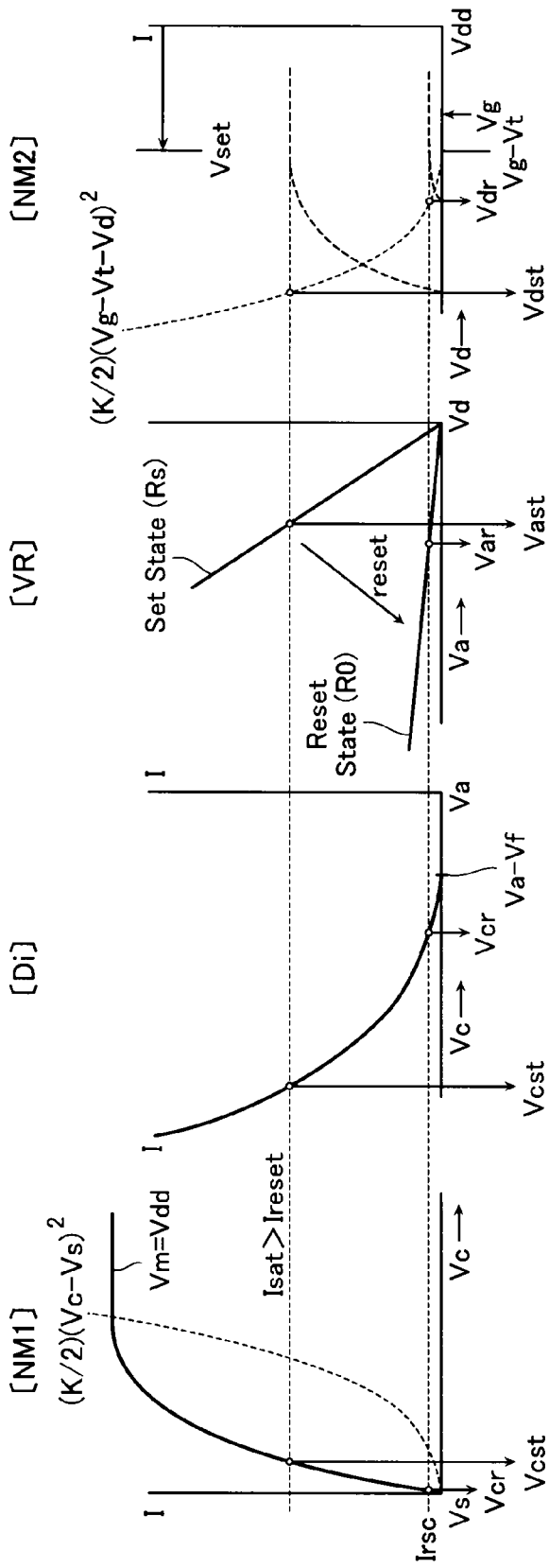
FIG. 55 illustrates the characteristics of each element for explaining the operational conditions in reset-state write.

FIG. 55 illustrates voltage-current characteristics of the respective devices after the setting as mentioned above. It is assumed that the initial state of the cell is a low resistance state (a set state). Explanation begins with the characteristics of the NMOS transistor MN1 as a word line switch.

The gate voltage of the word line switch NMOS transistor MN1 is set at a voltage Vdd which is the highest power supply level. That is, Vm=Vdd. In this case, the transistor is set at the linear region, and its characteristics is represented as follows under the condition of Vdd−Vt≧Vc:

$$I=K\{(Vdd-Vs-Vt)(Vc-Vs)-(Vc-Vs)^2/2\}.$$

Then, a value of the maximum current Isat that can be provided by the bit line switch NMOS transistor MN2, as well as the word line level Vcst of the cell in a set state in this case are then entered into the formula mentioned above, which results in:

$$Vcst=Vdd-Vs-Vt-\mathrm{sqrt}\{Vdd-Vs-Vt)^2-2Isat/K\}.$$

Similarly, assuming that the current provided by the high resistance cell is Irsc, the word line voltage is Vcr when the cell is in a reset state.

The current characteristics of each diode Di included in the cell is given as follows under the condition of Va−Vc≧Vf:

$$I=I0[\exp\{Va-Vc)/Vf]-1]$$

Accordingly, the potential differences Vcst and Vcr caused in the diodes are obtained as illustrated in the figure.

The characteristics of a variable resistance element VR in the cell is represented by two straight lines of I=(Vd−Va)/R, one of which corresponds to a set state with a low resistance Rs, the other to a reset state with a high resistance R0, relative to the voltage Vd of the bit line.

A voltage Vast is determined from a cross point of one of the straight lines and the current Isat, and in addition, a voltage Var is determined from a cross point of the other straight line and the current Irsc.

The gate voltage of the bit line switch NMOS transistor MN2 is set at a value equal to or less than the minimum potential Vset at which the cell can be caused to transition to a set state by a voltage Vg−Vt. Assuming that the bit line voltage is Vd, the characteristics of the saturation current of the transistor are given as follows under the condition of Vg−Vt<Vdd:

$$I=(K/2)(Vg-Vt-Vd)^2.$$

FIG. 55 illustrates, by dotted lines, the source-drain characteristics of the transistor relative to the bit line voltage Vdst when the saturation current is Isat, as well as the source-drain characteristics of the transistor relative to the bit line voltage Vdr when the saturation current is Irsc. It can be seen that Vdr will not exceed Vg−Vt, and so not exceed Vset.

Because of the saturation characteristics when the saturation current is Isat, the voltage Vdst is expressed as Vdst=Vg−Vt−sqrt (2Isat/K). Because of the saturation characteristics when the saturation current is Irsc, the voltage Vdr is expressed as Vdr=Vg−Vt−sqrt (2Irsc/K).

The conditions under which the cell can transition to a reset state and will not then return to the set state are Vdr<Vset and Ireset<Isat. Since the potential difference between the bit line and the word line in a high resistance cell in a reset state is Vdr−Vcr, Vset cannot be applied to the cell.

Figure 56:
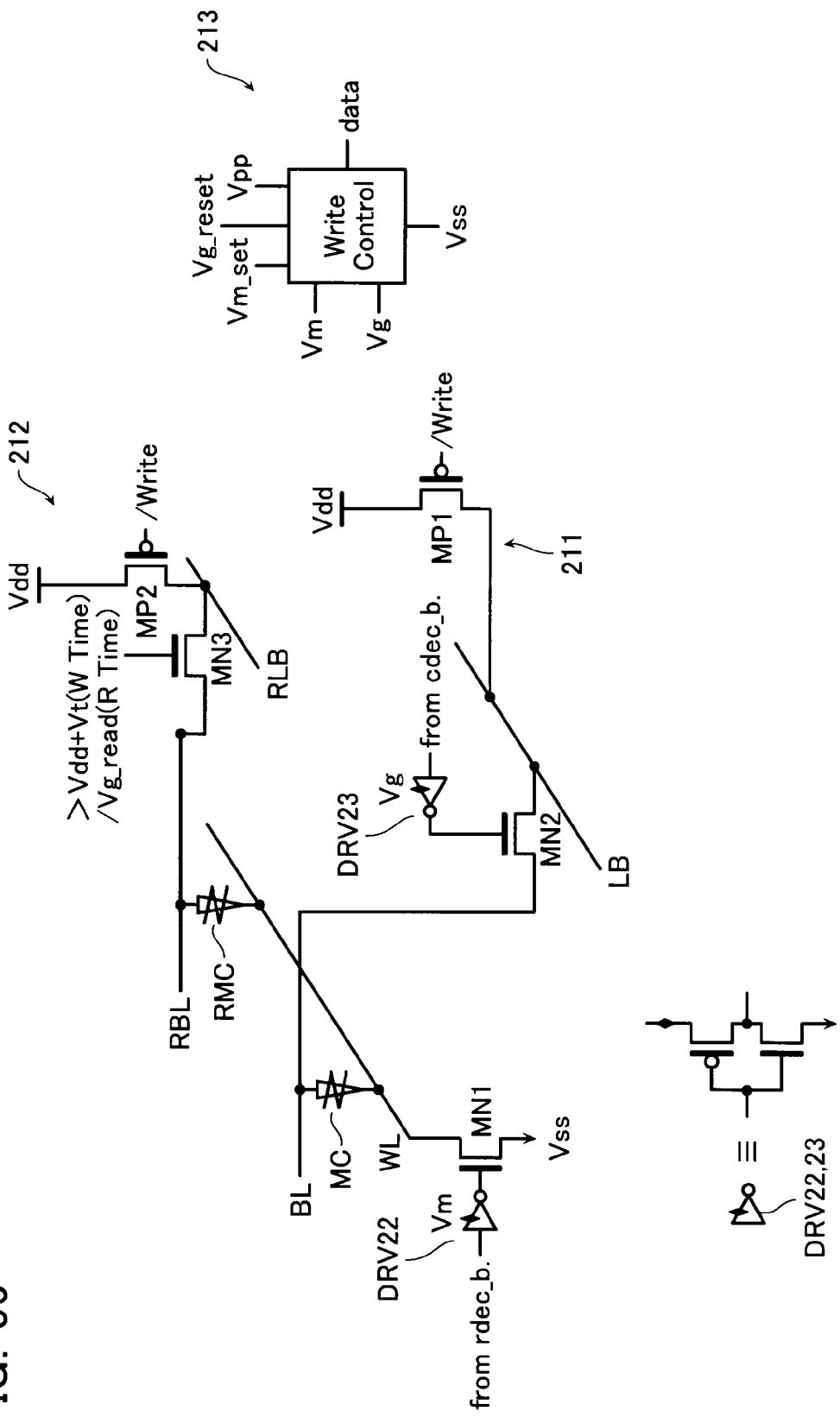
FIG. 56 illustrates a configuration of a write buffer circuit under a preferable write operation condition.
Figures 57, 58:
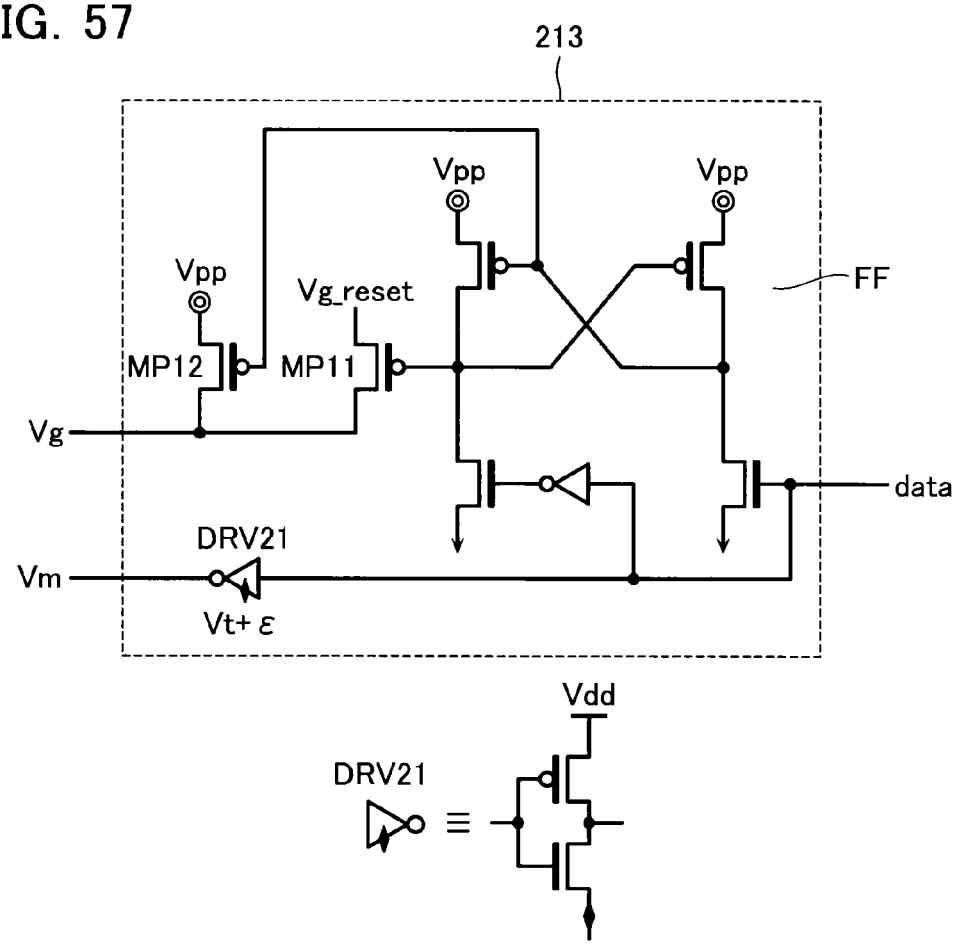
FIG. 57 illustrates a configuration of a write control circuit of the write buffer circuit.
FIG. 58 illustrates control signal levels of a write buffer of the write buffer circuit in respective modes of operation.

FIG. 56 illustrates a configuration of a write circuit for performing normal write using the same circuit system as in a lump-forming operation, and FIG. 57 illustrates a configuration of a write control circuit 213 thereof. FIG. 58 illustrates control signals Vm and Vg at high level side of gate drivers DRV22, DRV23 of word line and bit line switch transistors.

FIGS. 56, 57, and 58 illustrate variations of those described with reference to FIGS. 23, 24, and 25, respectively.

At the time of selecting a bit line BL and a word line WL, voltages of the selection gates of the bit line switch transistor and the word line switch transistor are changed according to data to be written.

The write control circuit 213 controls levels of the control signals Vm and Vg supplied to a decoder in order to change an output signal from the decoder depending on data. This is the same as the above-described circuits.

Difference between the above-described circuits and the circuit illustrated in FIG. 57 is described below. The control signal Vm dependent on data to be written is provided to the gate of the word line switch NMOS transistor MN1 via the driver DRV22. Similarly, the control signal Vg dependent on data to be written is provided to the gate of the bit line switch NMOS transistor MN2 via the driver DRV23.

Entered to the drivers DRV22, DRV23 are signals "from rdec_b." and "from cdec_b." provided from the corresponding row decoder and column decoder, respectively. Those bit lines and word lines in a non-selected state are set at a floating state with the respective switches being turned off.

Unlike the driver DRV11 at the write control circuit in FIG. 24, a driver DRV21 at the write control circuit 213 for outputting a control signal Vm is configured to output an output Vt+ϵ at a low level.

Figure 59:
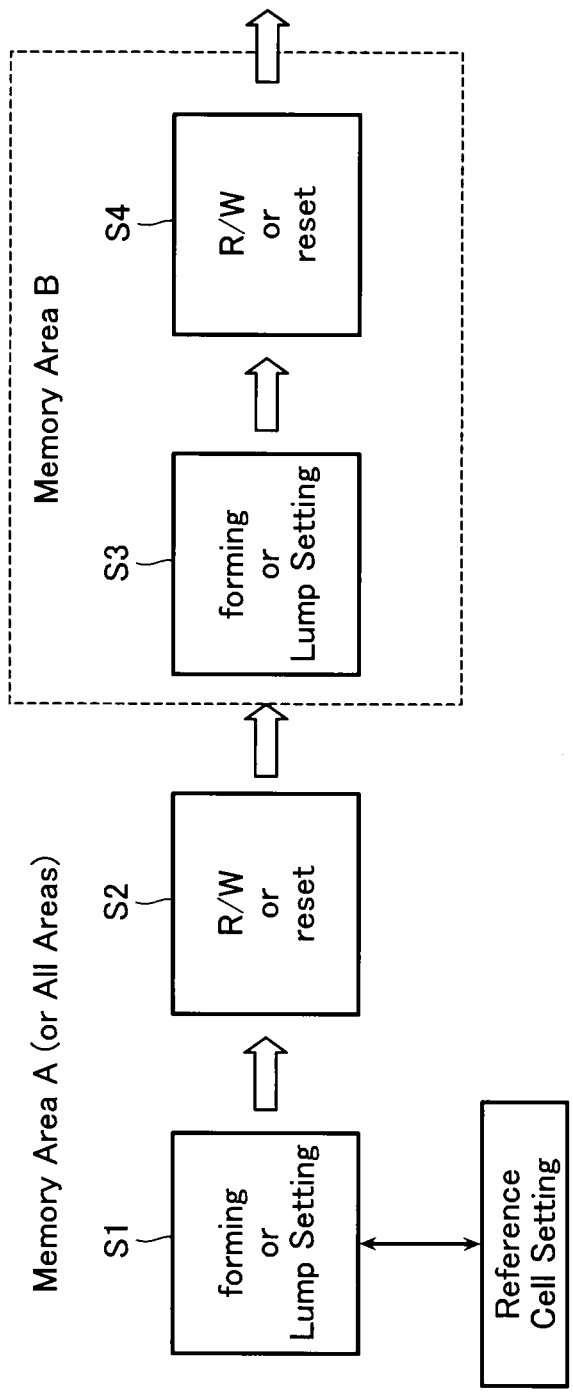
FIG. 59 illustrates the operational procedures of the memory according to the embodiment.

The reference cell RMC is in a set state with a low resistance, and the cells after a lump-forming operation are also in a set state with a low resistance. Taking this into consideration, steps for setting the operation modes of the memory are determined as illustrated in FIG. 59.

To make a memory chip be usable as a memory device, at a first setting procedure S1, forming is performed, or a lump set operation is performed to set the cell to a set state. Memory areas that are subject to this procedure S1 includes a partial memory area A to be used for awhile, or entire all memory areas from the beginning. In either case, it is ensured that at least a reference cell is involved in the area. This allows for a read operation using the reference cell.

Then, as a procedure S2, data reading and writing (R/W operations) is performed on the memory area A. In this case, since the cells in the area A are already in a set state, it is possible to perform only write for setting a reset state. That is, the circuitry of write system is only driven when writing a reset state. When a forming operation is performed for all memory areas from the beginning, R/W operations merely need to be continued on other areas.

If there is a new memory area B on which a forming operation has not been performed, or if a writing toward a reset state is to be performed on the memory area B after a forming operation therefor has been performed again or a lump setting operation has been performed therefor (i.e., if an operation corresponding to data erase in the NAND-type flash memory is performed in the memory area B), operations similar to those of the procedures S1, S2 are performed on the memory area B at procedures S3, S4. Thereafter, the operation will continue as described above.

Next, explained below is a data transfer scheme for enhancing the performance of the ReRAM with the above-mentioned sense scheme and write schemes.

The following description is made by comparison between the ReRAM and the NAND flash memory as a large capacity file memory. The biggest impediment that hampers efficient data-transfer of the NAND flash memory is that it needs a erase operation. On the other hand, while the resistance change memory (ReRAM) allows for random access, it involves a significant time difference between a set-state write (write for obtaining a set state) and reset-state write (write for obtaining a reset state). That is, the reset-state write requires about a hundred times longer time for writing than the set-state write, the time difference of which results in an impediment to efficient data transfer.

A more specific discussion follows below. In a typical block erase scheme of the NAND flash memory, a block of 256 KB is erased in 2 ms. The block area is not available during the block erase operation, and there is introduced a dead time for data transfer until the storing of data is completed, because data is stored after the block erasing. The dead time will last for at least twice the block erase time, i.e., 4 ms.

On the contrary, the resistance change memory essentially does not require erase operation. Therefore, the erase time needed in the NAND flash memory may be used for data transfer in the resistance change memory. In an attempt to complete data transfer of 256 k cycle within 4 ms with x8 parallel data transfer, the dead time in data transfer needed in the NAND flash memory can be used for data transfer in the resistance change memory, if data can be transferred at a cycle of 4 ms/256 k, i.e., 15.26 ns. That is, if data can be transferred at a cycle of 15 ns or less in the resistance change memory, more improved data transfer efficiency may be achieved as compared to the NAND flash memory.

The following description is given of the data transfer specification of ReRAM that achieves an improved data transfer rate as compared to the NAND flash memory, assuming the clock cycles of 7.5 ns and 15 ns, and taking into account the write time of about 1 μs is required for reset-state write.

A buffer register is prepared for each I/O: not less than 1000/7.5=133 bits for clock cycle of 7.5 ns, or not less than 1000/15=67 bits for clock cycle of 15 ns. Providing such a buffer register allows data transfer with a cell array block to be completed during the burst read of the register, and any gaps such as dead time will not be introduced for transferring data to and from the outside.

The data transfer schemes will be specifically described below with respect to the two cases: one is where each I/O has a register of 256=32B, and the other is where each I/O has a register of 128=16B.

Figure 60:
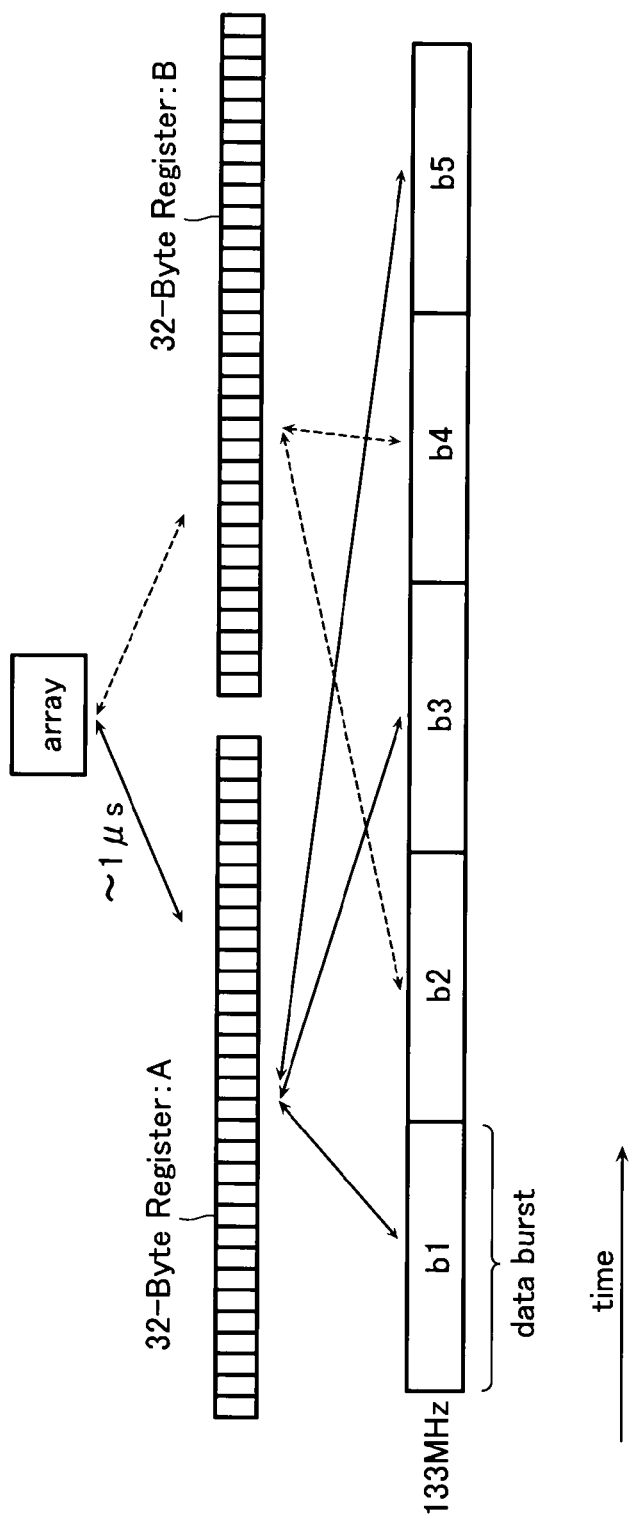
FIG. 60 is a diagram illustrating a data transfer method using two systems of registers.

FIG. 60 illustrates a case (Case 1) where there is no mixing of reading and writing in a burst sequence, and two systems of 32-Byte buffer registers A and B are used.

Regarding write of the ReRAM, the write operation toward a set state causes transition to a low resistance state in not more than 100 ns by applying a voltage, while the write operation toward a reset state causes transition to a high resistance state by heating for about 1 μs. the state change in the write operation toward a reset state is caused by Joule heat due to the current. Thus, a cycle time for data writing is determined by the time for the write operation toward a reset state that is longer than that toward a set state. Interface for fast data transfer is designed in consideration of the fact.

Firstly, it is assumed that data read operation and data write operation are completely separated in timing. A data burst is defined as a continuous data transfer from one system buffer register. Data read and write are not mixed in a sequence with the continuous data burst, and the entire sequence of data burst includes a read mode only, or write mode only.

In this data transfer, two buffer register systems A and B are provided as illustrated in FIG. 60 for continuous data transfer in read or write, which systems are alternately used to transfer data. The data burst cycle itself takes a time of not less than 1 µs. Accordingly, during the data burst in one of the buffer register systems A and B, the lump data transfer may be performed between the cell array and the other buffer register system that are not performing burst transfer.

That is, while the burst transfer from the register A is performed as indicated by burst block b1, b3, b5, . . . , data is transferred between the register B and the cell array. In addition, while the burst transfer from the register B is performed as indicated by burst block b2, b4, . . . , data is transferred between the register A and the cell array. This allows such data transfer to be performed at a clock cycle of 7.5 ns, i.e., 133 MHz, as a seamless transfer without any gaps between the transferred data bursts.

Figure 61:
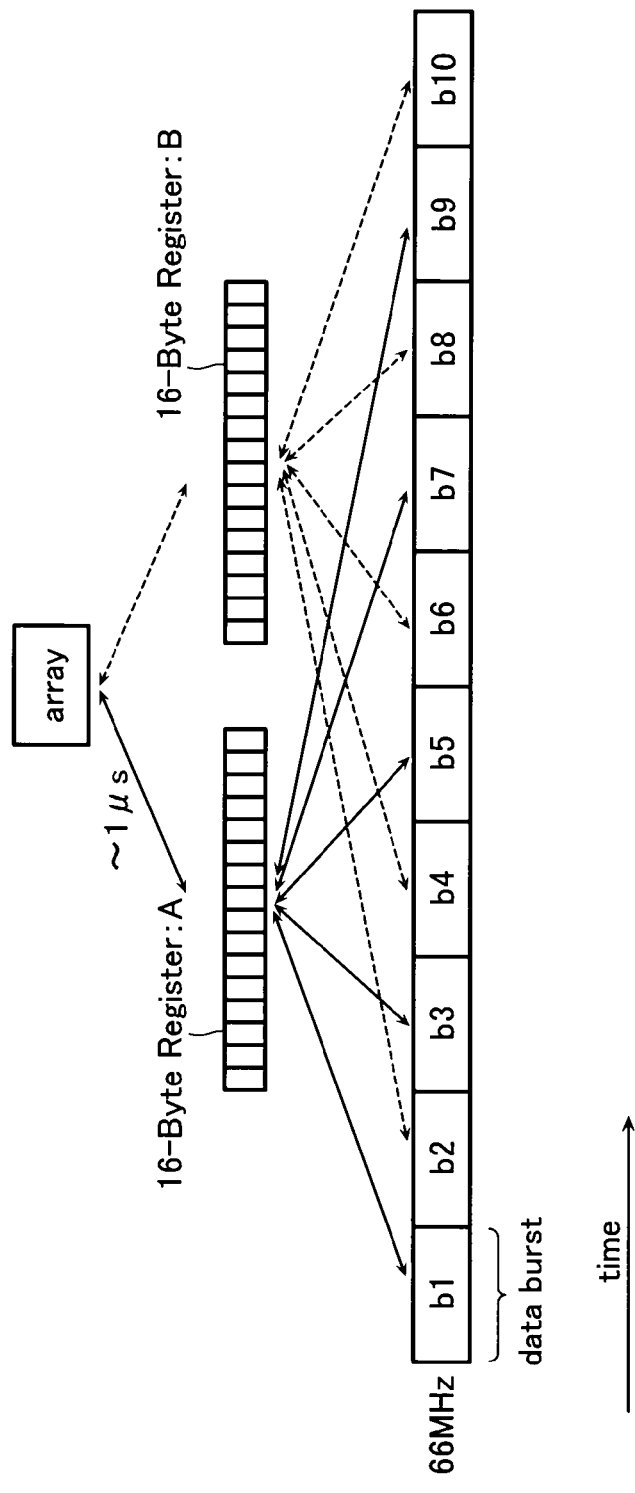
FIG. 61 is a diagram illustrating a data transfer method using two systems of registers with different sizes.

FIG. 61 illustrates a case (Case 2) where there is no mixing of reading and writing in a burst sequence, and two systems of 16-Byte buffer registers A and, B are used to achieve data transfer at a clock cycle of 15 ns, i.e., 66 MHz. Similar to FIG. 60, while the burst transfer from the register A is performed as indicated by burst block b1, b3, b5, . . . , data is transferred between the register B and the cell array. In addition, while the burst transfer from the register B is performed as indicated by burst block b2, b4, . . . , data is transferred between the register A and the cell array.

Accordingly, as in the FIG. 60, this allows such data transfer to be performed at a clock cycle of 15 ns, i.e., 133 MHz as a seamless transfer without any gaps between the transferred data bursts.

While it is assumed in FIGS. 60 and 61 that data read (read) and data write (write) are not mixed in a burst sequence, the degrees of freedom in data transfer would be significantly improved if the data transfer can be freely switched between read transfer and write transfer for each data burst. Therefore, the following description is given on a case where data bursts for read and write are mixed.

Figure 62:
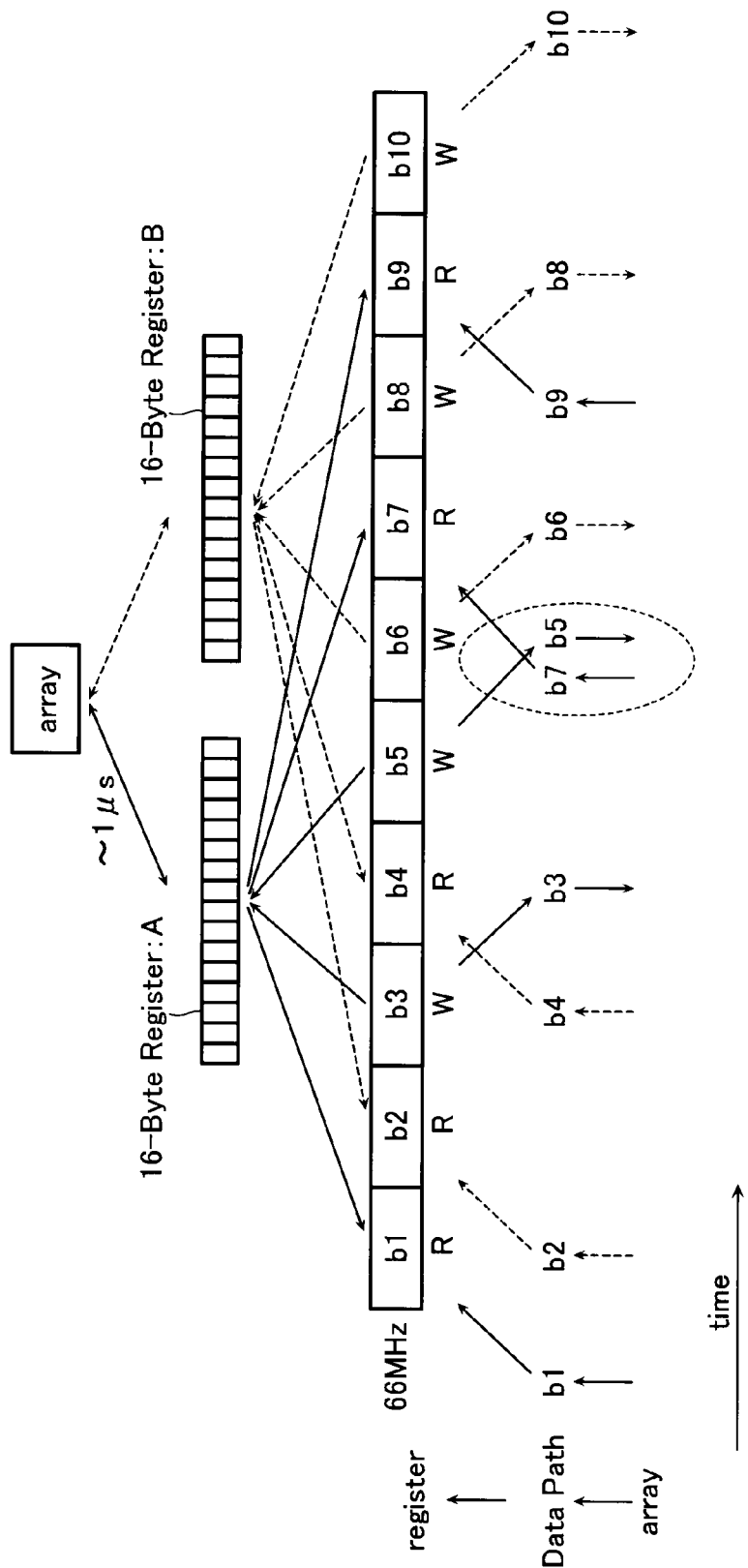
FIG. 62 is a diagram illustrating a data transfer method with a failure where there is a mixing of reading and writing in a burst sequence.

Similar to FIG. 61, FIG. 62 illustrates a case (Case 1) where there is a mixing of data bursts for read and write when the data transfer systems include two systems of 16-Byte buffer registers A and B per I/O, and the clock is 66 MHz.

As in the previous example, block b1, b3, b5, . . . transferred in data burst transfer of the buffer the register A, and block b2, b4, b6, . . . transferred in data burst transfer of the buffer the register B are alternately transferred. In this case, the relationship between direction and time of each burst data transfer as well as whether each burst block is read (R) or write (W) are indicated below each burst block.

The order of burst block b1, b2, b3, . . . represents the order of burst transfer. In writing, data is first fed to a register in a burst transfer manner, and then transferred to a cell array in a lump-transfer manner. Accordingly, the direction of data flow along the data path in a writing operation and the timing of data transfer in a writing operation are the opposite or reversed with respect to those in a reading operation, as indicated by burst block b3, b5, b8, b10.

The buffer registers A and B for data transfer must be alternately used as indicated by the full lines and the dotted lines. In this case, it is assumed that the burst transfer is performed in the following order:

read data burst transfer (b1) from the register A;
read data burst transfer (b2) from the register B;
write data burst transfer (b3) to the register A; and
read data burst transfer (b4) from the register B.

However, in a sequence such that write data burst (b5) is followed by another data burst and then read data burst (b7), there will be a timing when registers in the same system are used at the same time by the write burst block b5 and the read burst block b7, on the data path surrounded by the dotted line FIG. 62. In this case, it is necessary that a writing operation is preferentially performed compared to a reading operation in data transfer, and read data is transferred to a resistor when it becomes empty. Accordingly, the method using two systems of register groups can involve discontinuity in serial transfer of data as well as gaps in data transfer.

Three systems of buffer registers may be prepared to prevent any discontinuity in serial transfer of data as described in FIG. 62.

Figure 63:
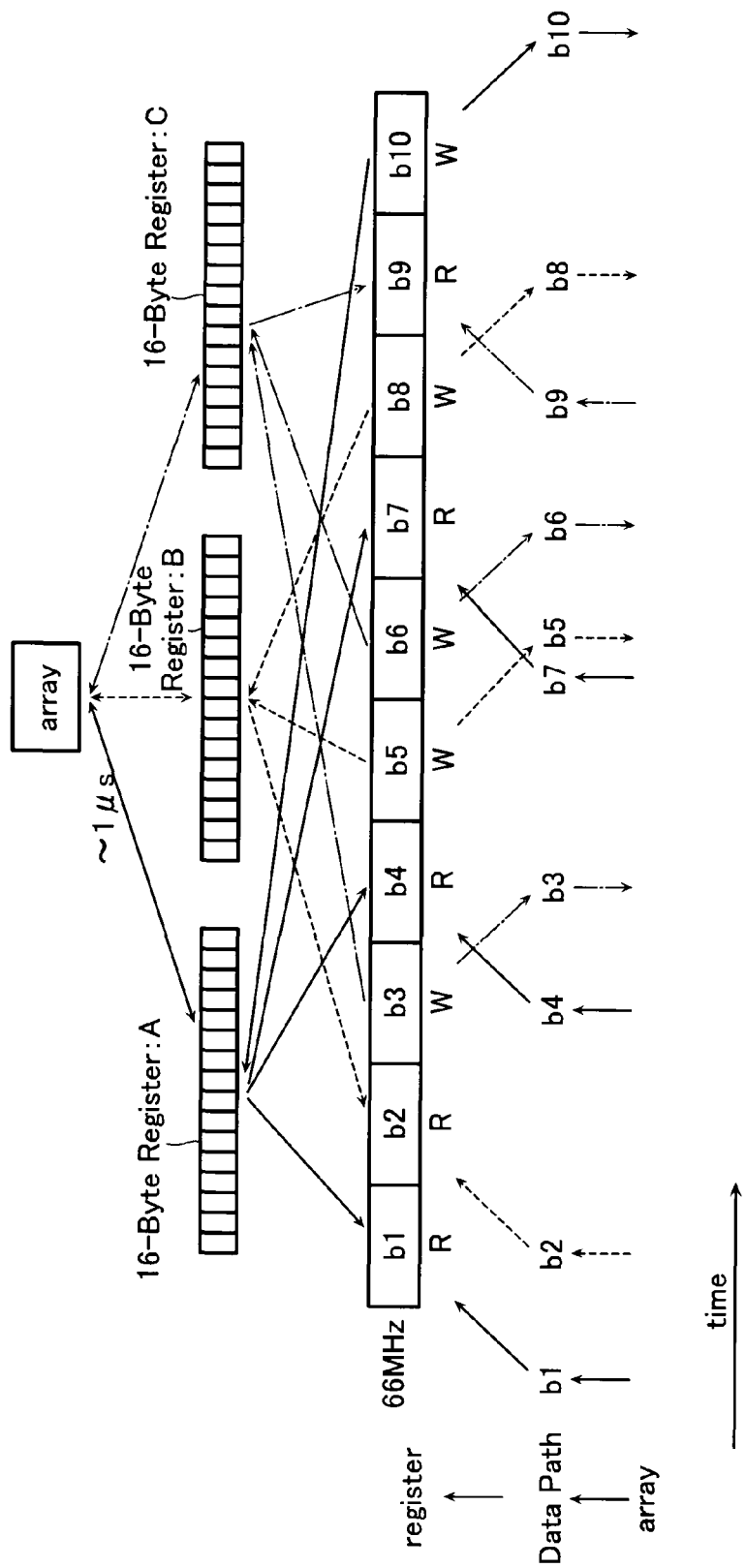
FIG. 63 is a diagram illustrating a data transfer method without any failure where there is a mixing of reading and writing in a burst sequence.

FIG. 63 illustrates a case (Case 2) where there is a mixing of bursts for read and write when three systems of buffer registers A, B, and C are prepared. Data transfer of these registers A, B, and C is indicated by the solid arrow, dotted arrow and dash-dot arrow, respectively.

Similar to FIG. 62, while a burst sequence is illustrated such that the timing of data transfer overlaps between burst b7 and burst b5, the three systems of registers A, B and C use the burst transfer in the following order.

That is, the burst transfer of the register A is indicated by burst block b1, b4, b7, b10, . . . . The burst transfer of the register B is indicated by burst block b2, b5, b8, . . . . The burst transfer of the register C is indicated by burst block b3, b6, b9, . . . . Whether each burst block is write data (W) or read data (R) is indicated below each burst block.

In this way, as in the previous instance illustrated in FIG. 62, alternate use of the three systems of registers may prevent any discontinuity because distinct registers are used if the burst transfer timing overlaps between burst block b5 and burst block b7. That is, random access is available for each burst with a mixing of reading and writing in a burst sequence.

In this case, three register groups are required, and it is desirable to keep the size as small as possible. Accordingly, each register per I/O has a capacity of 16 Byte, and a clock cycle is set at 66 MHz. In this case, though 1 µs or more is necessary for a data burst, a lump write time is assured with respect to a cell array in reset state. Accordingly, the memory has a data transfer rate of 66 MB/s.

Figure 64:
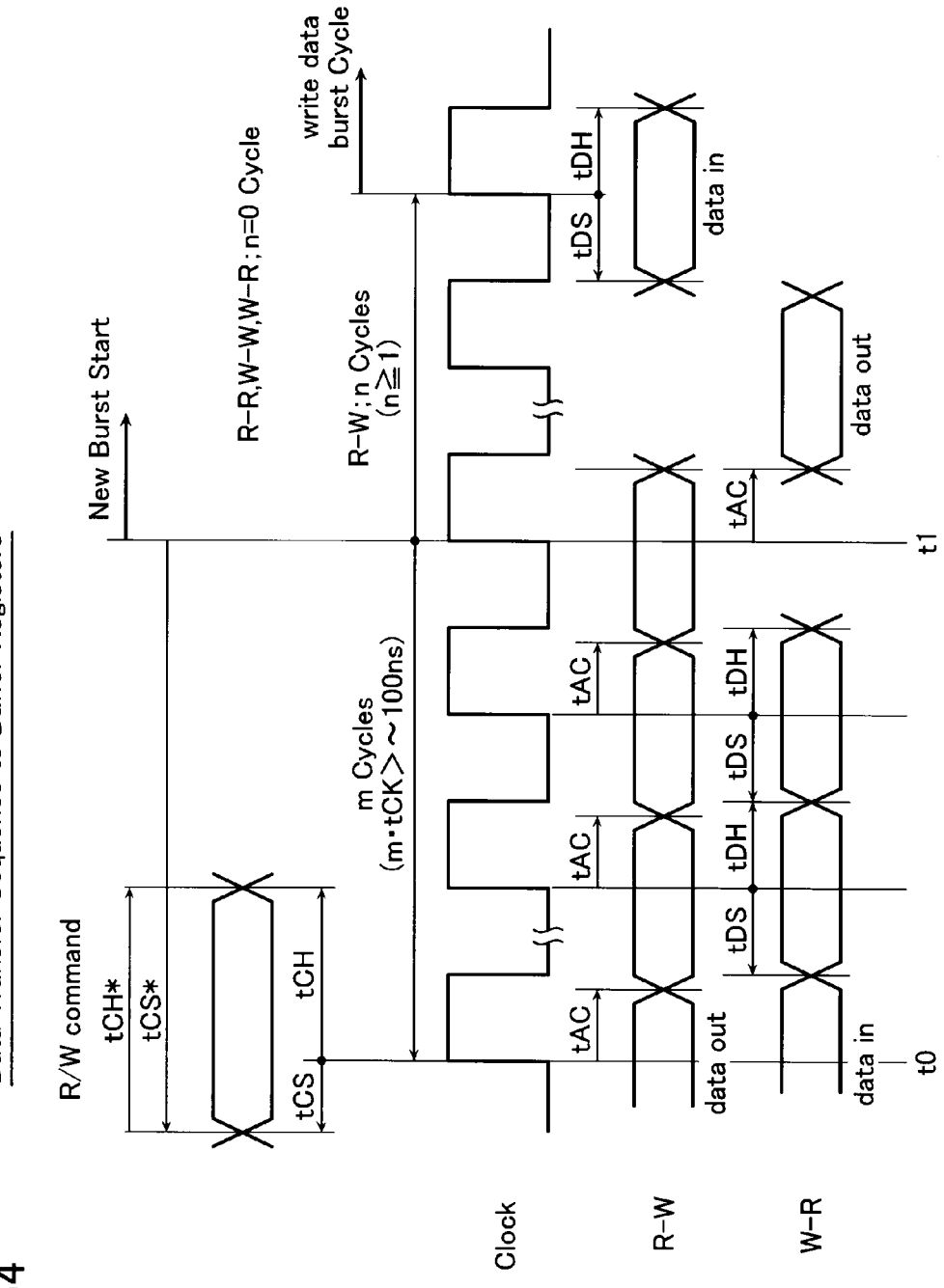
FIG. 64 is a diagram illustrating a data transfer sequence with respect to buffer registers.

FIG. 64 illustrates, as an example, timing scheme at data transfer with a mixing of data bursts for read and write. Assuming that a new data burst starts at timing t1, a determination should be made in advance as to whether the data burst is "read" or "write". Firstly, the timing of commands, "R command" and "/W command", for the determination will be described below.

Upon completion of a data burst, the timing for setting the commands is defined according to a rise in clock at timing t1 when the next data burst starts. There are two methods for this. The first method is to define, from the rising edge of clock (timing t1), the set-up time tCS* of the R and /W commands and a time tCH* which represents a time for which the command signals last.

In this case, if the new data burst starting at timing t1 is read data, then the data must be transferred to the register from the array in advance. Since it will take about 100 ns for the relevant lump data transfer, a time tCS* needs to be set at a time of not less than 100 ns. However, if the set-up time is excessively long, there may arise a problem. For example, there may arise a difficulty in setting the set-up time, and it may become difficult to correctly generate a timing signal for receiving the command.

Therefore, the second method may be employed. This second method defines the timing from the clock edge and based on the number of clocks. At the timing t1, the data burst is switched. A timing of a clock rise that occurs before the timing t1 is specified. The timing of the clock rise occurs earlier than the timing t1 by m cycles (assuming that the clock cycle is tCK, and tCK×m is not less than 100 ns; if tCK=15 ns, then m is not less than 7). Based on timing to of the clock rise, the timings tCS and tCH when the R and /W command signals fall and rise are defined as illustrated in the figure. According to these commands, the mode of read or write in the next data burst cycle is determined.

Regarding the timing of the clock and data in reading, output data is determined by the data access times tAC from the respective clock edges. A clock latency can be provided with respect to the clock. In writing, the input data may be retained during a period of time that is determined by the times of tDS and tDH for set-up and hold from the rising edge of the clock.

Meanwhile, there are four modes with respect to two successive data bursts:
(1) R-R mode in which read (R) bursts are successively performed;
(2) W-W mode in which write (W) bursts are successively performed;
(3) R-W mode in which a read burst is followed by a write burst; and
(4) W-R mode in which a write burst is followed by a read burst. These modes will be described below.

The R-R mode represents a sequence of successive reading bursts, where the relevant data outputs do not involve any clock skips. The W-W mode represents a sequence of successive writing bursts, where the relevant data input do not involve any clock skips.

The R-W mode represents a sequence where the reading data burst is switched to the writing data burst. The definition of the clock edge with respect to data in reading burst is different from that in writing burst. In writing, since data precedes the clock edge, the relationship between the data and clock needs to be shifted in switching in the R-W mode. That is, as illustrated in FIG. 64, upon completion of the read data transfer, data input in the next write data burst starts after n cycles (n≧1).

The W-R mode represents a sequence where the writing data burst is switched to the reading data burst. In this case, in switching from the write data burst to the reading data burst, the timings of the data and the clock edge are shifted to a direction of delay. Accordingly, no discrepancy arises in a relation between the data and clock, without any special consideration. There is no need to provide any particular gap between the write data burst and the read data burst, and hence n may be zero, as in R-R mode or W-W mode.

Figure 65:
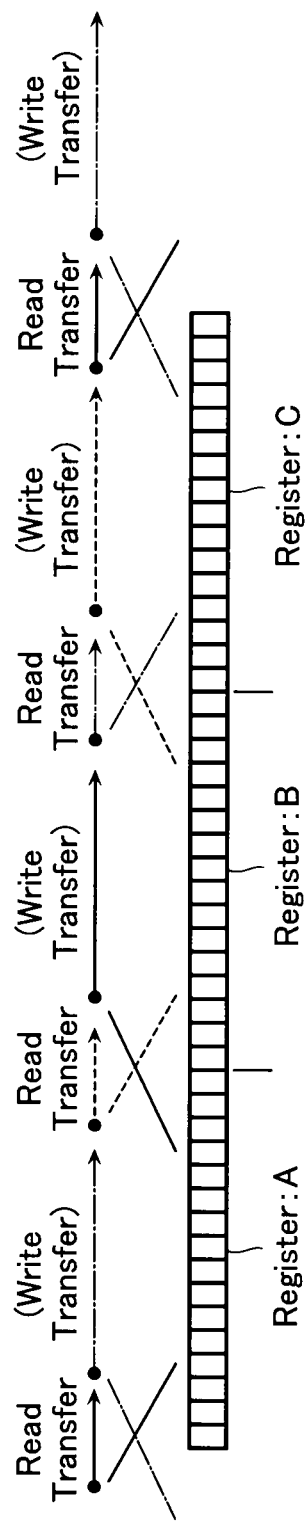
FIG. 65 is a diagram illustrating the timings of lump transfer between registers and arrays.

FIG. 65 illustrates the timings of lump data transfer between the three buffer registers A, B, C and the array. Write transfer takes a time about ten times longer than read transfer. The relationship of the time lengths of the data transfer is expressed by lengths of arrows in FIG. 65.

Figure 66:
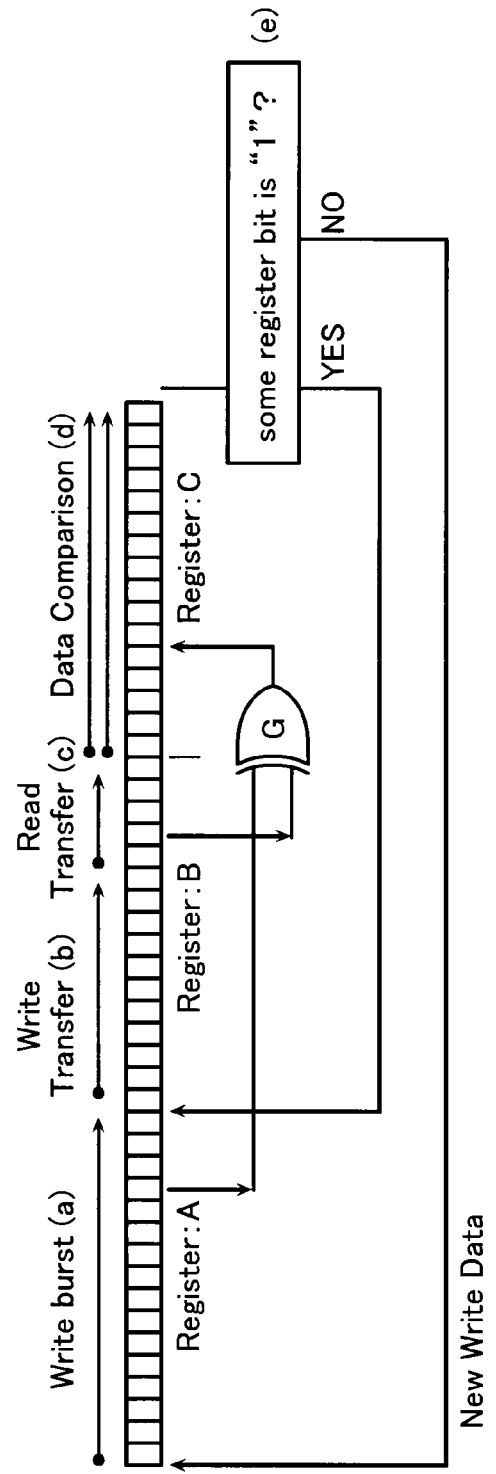
FIG. 66 is a diagram illustrating a data transfer sequence in write verify with respect to buffer registers.

Referring now to FIG. 66, a write verify method will be described below that verifies a state of writing data in a cell by means of data transfer to three systems of the buffer registers A, B and C.

To use the buffer registers for write verify operation, the read transfer and the write transfer are alternated in burst cycle, the transferred data is immediately read to the registers, and the data comparison between the registers is performed by a NOR circuit G for each bit (or, to accelerate the comparison, all bits in the registers are compared at the same time by multiple XOR circuits). The comparison results are retained in the registers, and a determination is made as to whether all of the registers have "0" (writing is complete) or not (writing is not complete). If write is complete, then a new data write cycle starts. Alternatively, if the registers have "1" data, then the method repeats the steps from write transfer of the write data retained in the registers, and continues writing until all of the results of the data comparison become "0".

That is, after data is written to and retained in the register A at write burst (a), the data is collectively subject to the write transfer to the array (b). Then it is immediately read from the cell and subject to the lump read transfer to the register B (c). During the lump data transfer for write and read, the individual data synchronized with the clock will not be read from the register latch.

Upon completion of the lump read transfer to the register B, each corresponding bit (or multiple bits, collectively) is read from the registers A and B, and those pieces of data are compared by the XOR circuit G, the results of which are stored in an appropriate register latch of the register C (d). After the comparison results are transferred, the content of the register C is retrieved and a determination is made to verify whether all of the register bits are "0" or not (e). If there is only one bit having "1", then the lump write transfer of the write data stored in the register A is performed again; otherwise new data is written to the register A in write burst and the lump write transfer is performed that is directed to a new address.

In this way, efficient data write is achieved, including write verification.

The disclosed embodiments are outlined below.

(1) A memory array includes a plurality of 3D cell array blocks arranged in a two-dimensional matrix form. In addition, in a mat in each of the cell array block, every second word line and bit line, or every third or more word line and bit line is selectively driven in an alternate manner. Moreover, two or more bit lines are selected for one selected word line in the mat. In this case, the two or more bit lines are selected so that they are symmetric with respect to the center of the mat.

(2) In accessing a memory cell, the non-selected word lines in the mat are set at a floating state so that only a selected word line is connected to a power supply, while every non-selected word line is not connected to any power supply.

In accessing a memory cell, the non-selected bit lines in the mat are set at a floating state so that only a selected bit line is connected to a power supply, while every non-selected bit line is not connected to any power supply.

(3) In a 3D cell array block where word lines and bit lines are shared between mats, only one of the mats that share one word line is subject to a lump-forming operation or a lump-setting operation.

(4) At the time of a lump-forming operation or a lump-setting operation, a word line selection circuit is configured to select a plurality of word lines at the same time when one bit line is selected in the mat.

(5) At the time of a lump-forming operation or a lump-setting operation for each bit line, word line selection switch transistors for selecting word lines at the same time are N channel type, the gate voltage of which is set to be lower than the potential of the bit line.

(6) In a lump-forming operation or a lump-setting operation of an area in the cell array block, potentials of a plurality of the word lines selected at the same time are fixed, and selected bit lines are sequentially changed for scanning.

(7) At the time of a lump-forming operation or a lump-setting operation of an area in the cell array block, a potential of the selected bit line is fixed, and selected areas of a plurality of the word lines selected at the same time are sequentially changed for scanning.

(8) Cells along a certain bit line after a forming operation is defined as reference cells, and the bit line is defined as a reference bit line. Such a reference current is created for the selected word line. The reference current is not more than one-tenth of the current flowing through the selected bit line and through the reference bit line. Then, the current of the selected bit line is compared with the reference current to perform data sensing.

(9) The reference bit line is positioned substantially at the center of respective mats in the cell array block.

(10) During the lump-forming procedure, with respect to an area to which data is written and another area including the reference cell, the relevant cells are set at a set state with a low resistance. In a data write operation, a write buffer is only activated for a reset write by which the cells are brought into a high resistance state.

(11) In writing data to a cell of the selected bit line, a write operation is performed on the reference cells that are selected at the same time on the reference bit line, for writing set state representing a low resistance state of the cell.

(12) According to data to be written to a cell, a voltage of optimal levels is provided to respective gates of the bit line selection switch transistor and the word line selection switch transistor.

(13) Three systems of buffer registers are provided at the data transfer paths between a plurality of cell array blocks and the outside to the memory. The lump transfer of data is sequentially performed between the cell array blocks and the buffer registers, and a burst data transfer is performed between the registers and the outside of the memory in synchronization with the external clock.

(14) During the data burst as data transfer in clock synchronization with the registers, the write or read mode is maintained in the registers, and the timing when a mode-switch command is to be input is defined by the time period or the number of clocks with respect to a clock at the time of switching when a new burst starts.

At the time of switching from a read burst to a write burst, writing of write data to the buffer registers starts with a clock rise that occurs at a later time by one cycle or more than a clock rise when a new burst has been started.

What is claimed is:

1. A resistance change memory device comprising:
    a cell array having multiple layers of mats laminated thereon, each of the mats having word lines and bit lines intersecting each other as well as resistance change type memory cells arranged at intersections thereof, each of the mats further having therein a reference cell and a reference bit line connected to the reference cell, the reference cell set to a state of a certain resistance value;
    a selection circuit configured to select a word line in each mat of the cell array, and select a bit line intersecting the selected word line thereby selecting a memory cell, and to select a reference bit line at the same time, thereby selecting a reference cell connected to a selected word line connected to a selected memory cell in the same mat; and
    a sense amplifier configured to sense data by comparing respective cell currents of a selected memory cell on the bit line that is selected and the reference cell on the reference bit line.

2. The resistance change memory device according to claim 1, wherein
    a memory cell on the reference bit line is the reference cell to which a low resistance state is fixedly written, and the reference bit line is located at the center of respective mats in the cell array.

3. The resistance change memory device according to claim 2, further comprising a current mirror circuit configured to reduce a cell current of the reference cell to a reference current value between cell current values of the memory cell in a low resistance state and a high resistance state to provide a reference input of the sense amplifier.

4. The resistance change memory device according to claim 1, wherein
    the memory cells in each of the mats of the cell array are initially set at a certain resistance state by a forming operation in which either the word lines or the bit lines are in a fixed selection state, while the other thereof are subject to scanning.

5. The resistance change memory device according to claim 1, wherein
    a plurality of the cell arrays are arranged in a two-dimensional matrix form, and
    the selection circuit selectively drives the word lines and the bit lines on the mat in each of the cell arrays from both ends thereof in an alternate manner, one of the word lines and one of the bit lines being selected from every other or every plural lines,
    the selection circuit selects two or more bit lines for one selected word line in the mat, the two or more bit lines being selected as being symmetric with respect to the center of the mat.

6. The resistance change memory device according to claim 1, further comprising a control circuit configured, on accessing the memory cell, to connect only a selected word line among the word lines in the mat to a power supply, while non-selected word lines are not connected to any power supplies to be set in a floating state,
    wherein the control circuit is configured, on accessing the memory cell, to connect only a selected bit line among the bit lines in the mat to a power supply, while non-selected bit lines are not connected to any power supplies to be set in a floating state.

7. The resistance change memory device according to claim 1, wherein the word lines and the bit lines are shared between the mats, and only one of the mats that share one of the word lines is subject to a lump-forming operation or a lump-setting operation.

8. The resistance change memory device according to claim 1, wherein
    at the time of a lump-forming operation or a lump-setting operation in the mat, the selection circuit selects a plurality of word lines at the same time when one bit line is selected in the mat.

9. The resistance change memory device according to claim 8, further comprising a word-line selection switch transistor of an N-channel type and provided on the word line,
    at the time of a lump-forming operation or a lump-setting operation for each of the bit lines, the word-line selection switch transistors provided on the word lines selected at the same time are provided with a gate voltage set to be lower than a potential of the bit line.

10. The resistance change memory device according to claim 1, wherein
    at the time of a lump-forming operation or a lump-setting operation of an area in the cell array, potentials of a plurality of the word lines selected at the same time are fixed, and selected bit lines are sequentially changed for scanning.

11. The resistance change memory device according to claim 1, wherein
at the time of a lump-forming operation or a lump-setting operation of an area in the cell array, a potential of the selected bit line is fixed, and selected areas of a plurality of the word lines selected at the same time are sequentially changed for scanning.

12. The resistance change memory device according to claim 1, wherein
a cell connected to a certain bit line of the bit lines after forming is defined as a reference cell,
the certain bit line is defined as the reference bit line,
a current flowing through the selected bit line when a word line is selected is created,
a reference current that is not more than one-tenth of a current flowing through the reference bit line is created,
and the current flowing through the selected bit line is compared with the reference current to perform data sensing.

13. The resistance change memory device according to claim 12, wherein
the reference bit line is positioned substantially at the center of respective mats in the cell array.

14. The resistance change memory device according to claim 1, further comprising a write buffer provided between the bit line and the sense amplifier,
wherein at the time of lump forming, the memory cells included in an area to which data is written and in another area including the reference cell are set to a set state with a low resistance, and
wherein in a data write operation, the write buffer is activated for only a reset write operation for shifting the memory cells to a high resistance state.

15. The resistance change memory device according to claim 1, wherein
in writing data to a cell of the selected bit line, a write operation is performed on the reference cells that are selected at the same time on the reference bit line, for writing a set state representing a low resistance state of the memory cells.

16. The resistance change memory device according to claim 1, further comprising:
a bit-line selection switch transistor provided at one end of the bit line; and
a word-line selection switch transistor provided at one end of the word line,
wherein according to data written to a cell, optimal levels are provided to respective gates of the bit-line selection switch transistor and the word-line selection switch transistor.

17. A resistance change memory device comprising:
a cell array having multiple layers of mats laminated thereon, each of the mats having word lines and bit lines intersecting each other as well as resistance change type memory cells arranged at intersections thereof; and
three systems of buffer registers provided at a data transfer path between the cell array and outside thereof,
lump data-transfer being performed between the cell array and each of the buffer registers, and burst data-transfer with clock synchronization being performed between each of the buffer registers and the outside.

18. The resistance change memory device according to claim 17, wherein
during a data burst representing data transfer in clock synchronization with the buffer registers, a write or read mode is maintained in the buffer registers, and a timing when a mode switch command is to be input is defined by the time or the number of clocks with respect to a clock at the time of switching when a new burst starts; and
at the time of switching from a read burst to a write burst, writing of write data to the buffer registers starts with a clock rise that occurs at a later time by one cycle or more than a clock rise when a new burst has been started.

* * * * *